US012777853B2

(12) United States Patent
Yamazaki et al.

(10) Patent No.: US 12,777,853 B2
(45) **Date of Patent: *Oct. 27, 2026**

(54) SEMICONDUCTOR DEVICE HAVING A METAL OXIDE AND METHOD FOR MANUFACTURING THE SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Tetsuya Kakehata, Isehara (JP); Yuji Egi, Atsugi (JP); Yasuhiro Jinbo, Isehara (JP); Yujiro Sakurada, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 690 days.

This patent is subject to a terminal disclaimer.

(21) Appl. No.: 18/109,305

(22) Filed: Feb. 14, 2023

(65) Prior Publication Data

US 2023/0274935 A1 Aug. 31, 2023

Related U.S. Application Data

(63) Continuation of application No. 16/972,413, filed as application No. PCT/IB2019/054507 on May 31, 2019, now Pat. No. 11,600,489.

(30) Foreign Application Priority Data

Jun. 8, 2018 (JP) ................................ 2018-110087

(51) Int. Cl.
*H10P 14/20* (2026.01)
*H10D 30/67* (2025.01)
(Continued)

(52) U.S. Cl.
CPC ..... *H10P 14/3434* (2026.01); *H10D 30/6755* (2025.01); *H10D 30/6757* (2025.01);
(Continued)

(58) Field of Classification Search
CPC ......... H01L 21/02565; H01L 21/02614; H01L 21/0262; H10D 30/501–509;
(Continued)

(56) References Cited

U.S. PATENT DOCUMENTS

| | | | |
|---|---|---|---|
| 7,314,835 | B2 | 1/2008 | Ishizaka et al. |
| 7,625,609 | B2 | 12/2009 | Matsuura |

(Continued)

FOREIGN PATENT DOCUMENTS

| | | |
|---|---|---|
| CN | 107112198 A | 8/2017 |
| JP | 2014-507794 | 3/2014 |

(Continued)

OTHER PUBLICATIONS

Johnson.R et al., "A brief review of atomic layer deposition: from fundamentals to applications", Materials Today, Jun. 1, 2014, vol. 17, No. 5, pp. 236-246.

(Continued)

*Primary Examiner* — Cheung Lee
(74) *Attorney, Agent, or Firm* — Fish & Richardson P.C.

(57) ABSTRACT

A semiconductor device having favorable electrical characteristics is provided. A metal oxide is formed over a substrate by the steps of: introducing a first precursor into a chamber in which the substrate is provided; introducing a first oxidizer after the introduction of the first precursor; introducing a second precursor after the introduction of the first oxidizer; and introducing a second oxidizer after the introduction of the second precursor.

16 Claims, 28 Drawing Sheets

(51) Int. Cl.

| | |
|---|---|
| ***H10D 64/68*** | (2025.01) |
| ***H10D 84/01*** | (2025.01) |
| ***H10D 84/03*** | (2025.01) |

(52) U.S. Cl.

CPC ....... *H10D 64/691* (2025.01); *H10D 84/0128* (2025.01); *H10D 84/038* (2025.01); *H10P 14/203* (2026.01)

(58) Field of Classification Search

CPC ............ H10D 30/6734; H10D 30/674; H10D 30/6755; H10D 30/6757; H10D 30/6754; H10D 64/691; H10D 84/01; H10D 84/0128; H10D 84/02; H10D 84/032; H10D 84/035; H10D 84/05; H10D 84/07; H10D 84/08; H10D 84/811; H10D 84/813; H10D 84/817; H10D 86/423; H10D 86/60; H10D 88/00; H10D 88/01; H10P 14/203; H10P 14/24; H10P 14/3434

See application file for complete search history.

(56) References Cited

U.S. PATENT DOCUMENTS

| | | | | |
|---|---|---|---|---|
| 7,838,438 | B2 | 11/2010 | Im et al. | |
| 8,859,332 | B2 | 10/2014 | Steiger et al. | |
| 9,171,960 | B2 | 10/2015 | Hong et al. | |
| 9,287,118 | B2 | 3/2016 | Yamazaki | |
| 9,356,098 | B2 | 5/2016 | Yamazaki et al. | |
| 9,530,892 | B2 | 12/2016 | Koezuka et al. | |
| 9,685,542 | B2 | 6/2017 | Nomura et al. | |
| 9,716,003 | B2 | 7/2017 | Yamazaki | |
| 9,831,347 | B2 | 11/2017 | Yamazaki et al. | |
| 9,911,861 | B2 | 3/2018 | Okazaki et al. | |
| 9,972,718 | B2 | 5/2018 | Koezuka et al. | |
| 10,128,378 | B2 | 11/2018 | Yamazaki et al. | |
| 10,204,798 | B2 | 2/2019 | Jintyou et al. | |
| 10,505,051 | B2 | 12/2019 | Ito et al. | |
| 10,522,690 | B2 | 12/2019 | Okazaki et al. | |
| 10,580,662 | B2 | 3/2020 | Jintyou et al. | |
| 10,693,012 | B2 | 6/2020 | Asami | |
| 10,797,180 | B2 | 10/2020 | Ito et al. | |
| 10,818,795 | B2 | 10/2020 | Yamazaki et al. | |
| 10,886,143 | B2 | 1/2021 | Jintyou et al. | |
| 11,380,795 | B2 | 7/2022 | Yamazaki et al. | |
| 11,404,285 | B2 | 8/2022 | Jintyou et al. | |
| 2003/0066483 | A1 | 4/2003 | Lee et al. | |
| 2013/0280859 | A1* | 10/2013 | Kim .................. | H10D 30/6757 438/104 |
| 2014/0110708 | A1 | 4/2014 | Koezuka et al. | |
| 2014/0210835 | A1 | 7/2014 | Hong et al. | |
| 2014/0367676 | A1 | 12/2014 | Haeming et al. | |
| 2016/0190290 | A1 | 6/2016 | Nomura et al. | |
| 2016/0284859 | A1 | 9/2016 | Asami | |
| 2016/0329434 | A1 | 11/2016 | Ito et al. | |
| 2017/0040457 | A1 | 2/2017 | Okazaki et al. | |
| 2020/0295196 | A1 | 9/2020 | Asami | |
| 2022/0293795 | A1 | 9/2022 | Yamazaki et al. | |
| 2022/0319866 | A1 | 10/2022 | Jintyou et al. | |

FOREIGN PATENT DOCUMENTS

| | | | |
|---|---|---|---|
| JP | 2014-103389 | A | 6/2014 |
| JP | 2015-079946 | A | 4/2015 |
| JP | 2015-144250 | A | 8/2015 |
| JP | 2015-233130 | A | 12/2015 |
| JP | 2016-511936 | | 4/2016 |
| JP | 2016-169150 | A | 9/2016 |
| JP | 2016-189460 | A | 11/2016 |
| JP | 2016-213457 | A | 12/2016 |
| JP | 2016-219761 | A | 12/2016 |
| JP | 2017-034258 | A | 2/2017 |
| JP | 2018-060995 | A | 4/2018 |
| JP | 2018-509748 | | 4/2018 |
| KR | 10-0434493 | | 6/2004 |
| KR | 2005-0019382 | A | 3/2005 |
| KR | 10-0685748 | | 2/2007 |
| KR | 10-0722987 | | 5/2007 |
| KR | 10-0773755 | | 11/2007 |
| KR | 10-0809685 | | 3/2008 |
| KR | 10-0944842 | | 3/2010 |
| TW | 201631672 | | 9/2016 |
| WO | WO-2006/054854 | | 5/2006 |
| WO | WO-2009/031381 | | 3/2009 |
| WO | WO-2012/091297 | | 7/2012 |
| WO | WO-2013/110434 | | 8/2013 |
| WO | WO-2014/116500 | | 7/2014 |
| WO | WO-2015/097597 | | 7/2015 |
| WO | WO-2016/109118 | | 7/2016 |
| WO | WO-2017/141140 | | 8/2017 |

OTHER PUBLICATIONS

German Office Action (Application No. 112019002901.0) Dated Jan. 19, 2024.

International Search Report (Application No. PCT/IB2019/054507) Dated Jul. 16, 2019.

Written Opinion (Application No. PCT/IB2019/054507) Dated Jul. 16, 2019.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium On VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

Kim.Y et al., "Improvement in Device Performance of Vertical Thin-Film Transistors Using Atomic Layer Deposited IGZO Channel and Polyimide Spacer", IEEE Electron Device Letters, Aug. 4, 2017, vol. 38, No. 10, pp. 1387-1389.

German Office Action (Application No. 112019002901.0) Dated May 27, 2022.

Potts.S et al., "Energy-enhanced atomic layer deposition for more process and precursor versatility", Coordination Chemistry Reviews, Jul. 4, 2013, vol. 257, No. 23-24, pp. 3254-3270.

German Office Action (Application No. 1112019002901.0) Dated Sep. 10, 2026.

* cited by examiner

1471

1472

1473

1474

1475

1476

1477

1478

SEMICONDUCTOR DEVICE HAVING A METAL OXIDE AND METHOD FOR MANUFACTURING THE SEMICONDUCTOR DEVICE

CROSS-REFERENCE TO RELATED APPLICATIONS

This application is a continuation of U.S. application Ser. No. 16/972,413, filed Dec. 4, 2020, now allowed, which is a U.S. National Phase Application under 35 U.S.C. § 371 of International Application PCT/IB2019/054507, filed on May 31, 2019, which claims the benefit of a foreign priority application filed in Japan on Jun. 8, 2018, as Application No. 2018-110087 all of which is incorporated by reference.

TECHNICAL FIELD

One embodiment of the present invention relates to a semiconductor device and a method for manufacturing the semiconductor device. Another embodiment of the present invention relates to a semiconductor wafer, a module, and an electronic device.

Note that in this specification and the like, a semiconductor device refers to a device that can function by utilizing semiconductor characteristics in general. A semiconductor element such as a transistor, a semiconductor circuit, an arithmetic device, and a memory device are each one embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

As semiconductor thin films that can be used in the transistors, silicon-based semiconductor materials have been widely known, but oxide semiconductors have been attracting attention as alternative materials. Examples of oxide semiconductors include not only single-component metal oxides, such as indium oxide and zinc oxide, but also multi-component metal oxides. Among the multi-component metal oxides, in particular, an In—Ga—Zn oxide (hereinafter, also referred to as IGZO) has been actively studied.

From the studies on IGZO, a CAAC (c-axis aligned crystalline) structure and an nc (nanocrystalline) structure, which are neither single crystal nor amorphous, have been found in an oxide semiconductor (see Non-Patent Document 1 to Non-Patent Document 3). In Non-Patent Document 1 and Non-Patent Document 2, a technique for forming a transistor using an oxide semiconductor having the CAAC structure is also disclosed. Moreover, Non-Patent Document 4 and Non-Patent Document 5 disclose that a fine crystal is included even in an oxide semiconductor that has lower crystallinity than an oxide semiconductor having the CAAC structure or the nc structure.

In addition, a transistor which includes IGZO as an active layer has an extremely low off-state current (see Non-Patent Document 6), and an LSI and a display utilizing the transistor characteristics have been reported (see Non-Patent Documents 7 and 8).

REFERENCE

Non-Patent Document

[Non-Patent Document 1] S. Yamazaki et al., "SID Symposium Digest of Technical Papers", 2012, volume 43, issue 1, p. 183-186

[Non-Patent Document 2] S. Yamazaki et al., "Japanese Journal of Applied Physics", 2014, volume 53, Number 4S, p. 04ED18-1-04ED18-10

[Non-Patent Document 3] [Non-Patent Document 3] S. Ito et al., "The Proceedings of AM-FPD'13 Digest of Technical Papers", 2013, p. 151-154

[Non-Patent Document 4] S. Yamazaki et al., "ECS Journal of Solid State Science and Technology", 2014, volume 3, issue 9, p. Q3012-Q3022

[Non-Patent Document 5] [Non-Patent Document 5] S. Yamazaki, "ECS Transactions", 2014, volume 64, issue 10, p. 155-164

[Non-Patent Document 6] [Non-Patent Document 6] K. Kato et al., "Japanese Journal of Applied Physics", 2012, volume 51, p. 021201-1-021201-7

[Non-Patent Document 7] [Non-Patent Document 7] S. Matsuda et al., "2015 Symposium on VLSI Technology Digest of Technical Papers", 2015, p. T216-T217

[Non-Patent Document 8] [Non-Patent Document 8] S. Amano et al., "SID Symposium Digest of Technical Papers", 2010, volume 41, issue 1, p. 626-629

SUMMARY OF THE INVENTION

Problems to be Solved by the Invention

One object of one embodiment of the present invention is to provide a semiconductor device having favorable electrical characteristics. Another object of one embodiment of the present invention is to provide a highly reliable semiconductor device. Another object of one embodiment of the present invention is to provide a semiconductor device that can be miniaturized or highly integrated. Another object of one embodiment of the present invention is to provide a semiconductor device with high on-state current. Another object of one embodiment of the present invention is to provide a semiconductor device with excellent frequency characteristics. Another object of one embodiment of the present invention is to provide a semiconductor device with high productivity.

One object of one embodiment of the present invention is to provide a semiconductor device capable of retaining data for a long time. One object of one embodiment of the present invention is to provide a semiconductor device capable of high-speed data writing. One object of one embodiment of the present invention is to provide a semiconductor device with high design flexibility. One object of one embodiment of the present invention is to provide a semiconductor device capable of reducing power consumption. Another object of one embodiment of the present invention is to provide a novel semiconductor device.

Note that the description of these objects does not preclude the existence of other objects. One embodiment of the present invention does not have to achieve all these objects.

Other objects are apparent from and can be derived from the description of the specification, the drawings, the claims, and the like.

Means for Solving the Problems

One embodiment of the present invention is a method for manufacturing a semiconductor device, in which a metal oxide is formed over a substrate by the steps of: introducing a first precursor into a chamber in which the substrate is provided; introducing a first oxidizer after the introduction of the first precursor; introducing a second precursor after the introduction of the first oxidizer; and introducing a second oxidizer after the introduction of the second precursor.

One embodiment of the present invention is a method for manufacturing a semiconductor device, in which a metal oxide is formed over a substrate by the steps of: introducing a first precursor into a chamber in which the substrate is provided; introducing a first oxidizer after the introduction of the first precursor; introducing a second precursor after the introduction of the first oxidizer; introducing a second oxidizer after the introduction of the second precursor; introducing a third precursor after the introduction of the second oxidizer; and introducing a third oxidizer after the introduction of the third precursor.

In the above, the first precursor preferably contains indium.

In the above, the second precursor preferably contains at least one of zinc and gallium.

In the above, the second precursor preferably contains one of zinc and gallium.

In the above, the third precursor preferably contains the other of the zinc and the gallium.

In the above, the metal oxide preferably contains indium and zinc.

In the above, the metal oxide preferably contains indium, an element M (M is aluminum, gallium, yttrium, or tin), and zinc.

In the above, the metal oxide preferably contains a crystal structure.

In the above, the first oxidizer preferably contains at least one selected from ozone, oxygen, and water, and the second oxidizer preferably contains at least one selected from ozone, oxygen, and water.

In the above, the second oxidizer preferably contains the same material as the first oxidizer.

In the above, the third oxidizer preferably contains at least one selected from ozone, oxygen, and water.

Effect of the Invention

According to one embodiment of the present invention, a semiconductor device having favorable electrical characteristics can be provided. According to one embodiment of the present invention, a highly reliable semiconductor device can be provided. According to one embodiment of the present invention, a semiconductor device that can be miniaturized or highly integrated can be provided. According to one embodiment of the present invention, a semiconductor device with high on-state current can be provided. According to one embodiment of the present invention, a semiconductor device with excellent frequency characteristics can be provided. According to one embodiment of the present invention, a semiconductor device with high productivity can be provided.

A semiconductor device capable of retaining data for a long time can also be provided. A semiconductor device with high-speed data writing can also be provided. A semiconductor device with high design flexibility can also be provided. A semiconductor device capable of reducing power consumption can also be provided. A novel semiconductor device can also be provided.

Note that the descriptions of the effects do not disturb the existence of other effects. Note that one embodiment of the present invention does not have to have all of these effects. Effects other than these will be apparent from the descriptions of the specification, the drawings, the claims, and the like and effects other than these can be derived from the descriptions of the specification, the drawings, the claims, and the like.

MODE FOR CARRYING OUT THE INVENTION

Figure 1A:
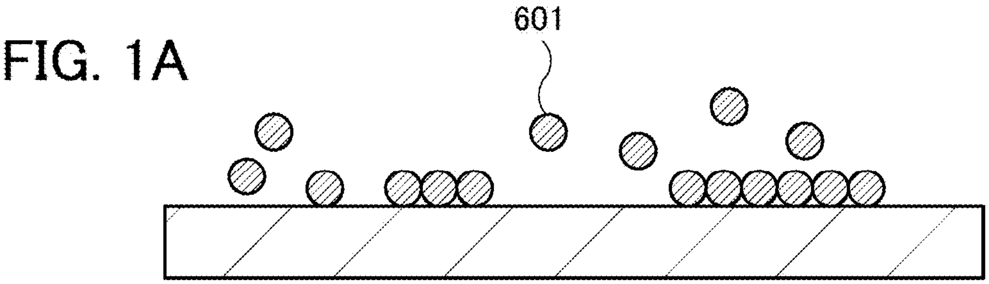
FIGS. 1A to 1D Cross-sectional views illustrating a deposition method of one embodiment of the present invention.
Figure 1B:
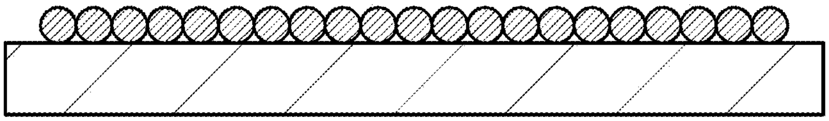
Figure 1C:
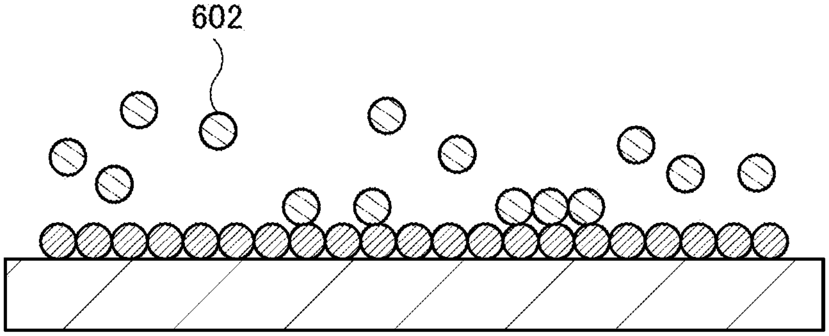
Figure 1D:
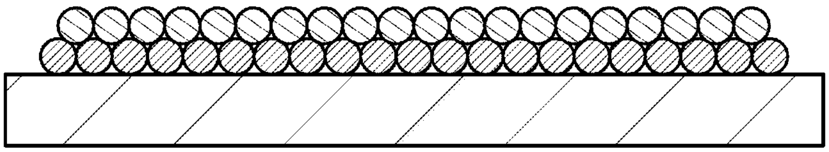

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Therefore, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in an actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. Furthermore, some hidden lines and the like might be omitted.

In addition, in this specification and the like, ordinal numbers such as "first" and "second" are used for convenience and do not denote the order of steps or the stacking order of layers. Thus, for example, description can be made by replacing "first" with "second," "third," or the like as appropriate. In addition, the ordinal numbers in this specification and the like do not correspond to the ordinal numbers which are used to specify one embodiment of the present invention in some cases.

In addition, in this specification and the like, terms for describing arrangement, such as "over" and "below," are used for convenience to describe the positional relation between components with reference to drawings. The positional relation between components is changed as appropriate in accordance with a direction in which the components are described. Thus, without limitation to the terms used for description in this specification, description can be changed appropriately depending on the situation.

For example, when this specification and the like explicitly state that X and Y are connected, the case where X and Y are directly connected, the case where X and Y are functionally connected, and the case where X and Y are electrically connected are regarded as being disclosed in this specification and the like. Accordingly, without being limited to a predetermined connection relationship, for example, a connection relationship shown in drawings or text, a connection relationship other than a connection relationship shown in drawings or text is regarded as being disclosed in the drawings or the text.

Here, X and Y each denote an object (e.g., a device, an element, a circuit, a wiring, an electrode, a terminal, a conductive film, or a layer).

Furthermore, functions of a source and a drain might be switched when a transistor of opposite polarity is employed or a direction of current flow is changed in circuit operation, for example. Thus, the terms "source" and "drain" can sometimes be interchanged with each other in this specification and the like.

Note that in this specification and the like, depending on transistor structures, a channel width in a region where a channel is actually formed (hereinafter, also referred to as an "effective channel width") is different from a channel width shown in a top view of a transistor (hereinafter, also referred to as an "apparent channel width") in some cases. For example, when a gate electrode covers a side surface of a semiconductor, effective channel width is greater than apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, effective channel width is greater than apparent channel width.

In such a case, an estimation of effective channel width by actual measurement may be difficult. For example, an estimation of effective channel width from a design value requires assumption that the shape of a semiconductor is known. Accordingly, in the case where the shape of a semiconductor is not known accurately, it is difficult to measure effective channel width accurately.

In this specification, the simple term "channel width" refers to an apparent channel width in some cases. Alternatively, in this specification, the simple term "channel width" refers to an effective channel width in some cases. Note that values of channel length, channel width, effective channel width, apparent channel width, and the like can be determined, for example, by analyzing a cross-sectional TEM image and the like.

Note that impurities in a semiconductor refer to, for example, elements other than the main components of a semiconductor. For example, an element with a concentration of lower than 0.1 atomic % can be regarded as an impurity. When an impurity is contained, for example, DOS (Density of States) in a semiconductor might be increased or crystallinity might be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. For an oxide semiconductor, water also serves as an impurity in some cases. In addition, entry of impurities in an oxide semiconductor, for example, forms oxygen vacancies in some cases. Furthermore, in the case where the semiconductor is silicon, examples of the impurity that changes characteristics of the semiconductor include oxygen, Group 1 elements except for hydrogen, Group 2 elements, Group 13 elements, and Group 15 elements.

Note that in this specification and the like, silicon oxynitride is a material that contains more oxygen than nitrogen in its composition. Silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle of greater than or equal to −10° and less than or equal to 10°. Accordingly, the case where the angle is greater than or equal to −5° and less than or equal to 5° is also included. Moreover, "substantially parallel" indicates a state where two straight lines are placed at an angle of greater than or equal to −30° and less than or equal to 30°. Moreover, "perpendicular" indicates a state where two straight lines are placed at an angle of greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle of greater than or equal to 60° and less than or equal to 120°.

Note that in this specification, a barrier film means a film having a function of inhibiting passage of oxygen and impurities such as water and hydrogen; in the case where the barrier film has conductivity, the barrier film may be referred to as a conductive barrier film.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, when the term OS FET or OS transistor is used, the term can be replaced by a transistor including an oxide or an oxide semiconductor.

In this specification and the like, "normally off" means that current per micrometer of channel width flowing through a transistor when a potential is not applied to a gate or a ground potential is applied to the gate is lower than or equal to $1\times10^{-20}$ A at room temperature, lower than or equal to $1\times10^{-18}$ A at 85° C., or lower than or equal to $1\times10^{-16}$ A at 125° C.

Embodiment 1

One embodiment of the present invention relates to a semiconductor device that includes a metal oxide (simply referred to as an oxide in some cases) functioning as an oxide semiconductor, and a manufacturing method thereof <Metal Oxide that can be Used as Oxide Semiconductor>

The oxide semiconductor relating to the present invention is described below. The oxide semiconductor preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor is an InMZnO containing indium, the element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

Here, the case where the metal oxide contains indium, the element M, and zinc is considered. The terms of the atomic ratio of indium to the element M and zinc contained in the metal oxide are denoted by [In], [M], and [Zn], respectively.

Preferred ranges of the atomic ratio of indium, the element M, and zinc contained in the metal oxide that can be used as the oxide described in one embodiment of the present invention are described below with reference to FIG. 7(A), FIG. 7(B), and FIG. 7(C). Note that the proportion of oxygen atoms is not illustrated in FIG. 7(A), FIG. 7(B), and FIG. 7(C). In addition, the terms of the atomic ratio of indium, the element M, and zinc contained in the metal oxide are denoted by [In], [M], and [Zn], respectively.

Figure 7A:
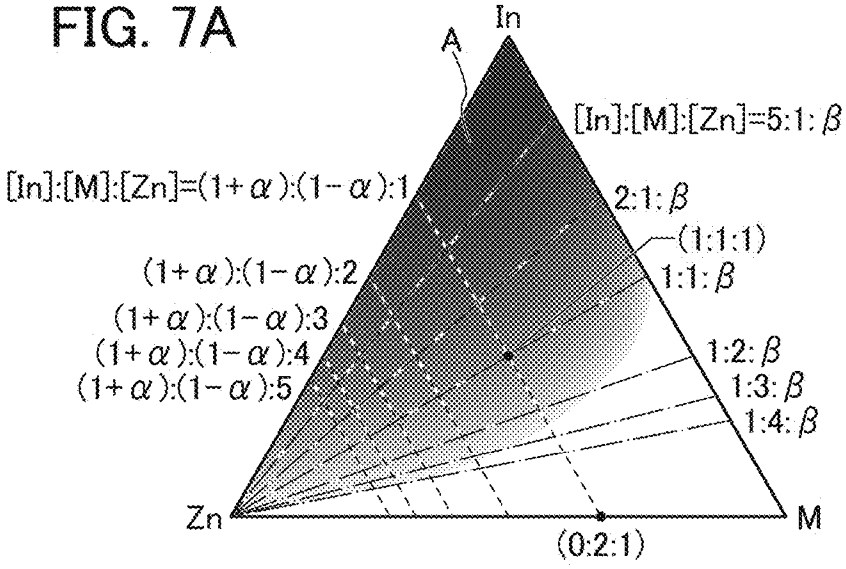
FIGS. 7A to 7C Diagrams illustrating an atomic ratio range of a metal oxide of one embodiment of the present invention.
Figure 7B:
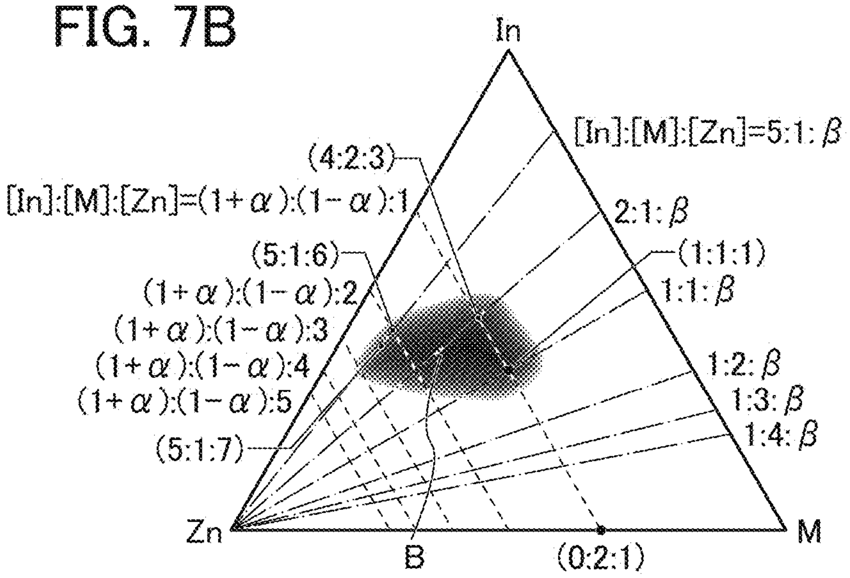
Figure 7C:
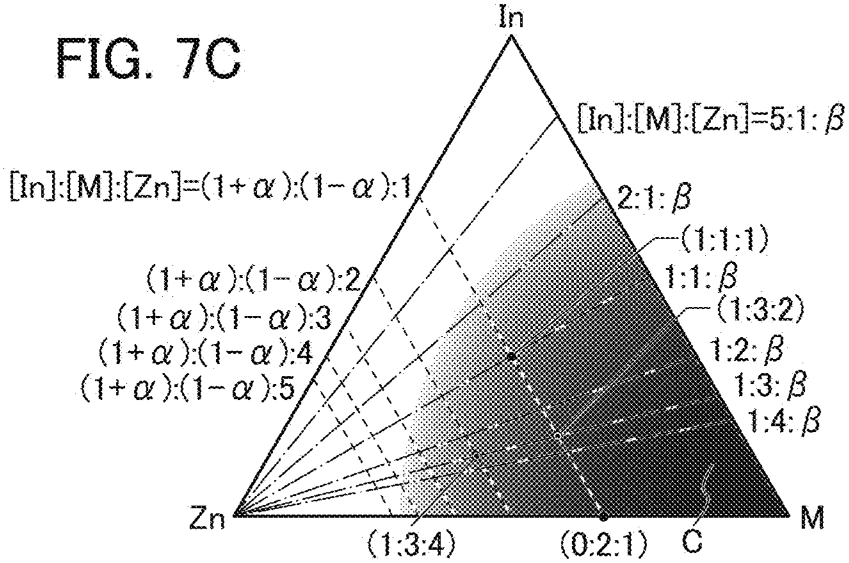

In FIG. 7(A), FIG. 7(B), and FIG. 7(C), dashed lines indicate a line where the atomic ratio of [In]:[M]:[Zn] is $(1+\alpha):(1-\alpha):1$ ($-1\leq\alpha\leq1$), a line where the atomic ratio of [In]:[M]:[Zn] is $(1+\alpha):(1-\alpha):2$, a line where the atomic ratio of [In]:[M]:[Zn] is $(1+\alpha):(1-a):3$, a line where the atomic ratio of [In]:[M]:[Zn] is $(1+\alpha):(1-\alpha):4$, and a line where the atomic ratio [In]:[M]:[Zn] is $(1+\alpha):(1-\alpha):5$.

Furthermore, dashed-dotted lines indicate a line where the atomic ratio of [In]:[M]:[Zn] is $5:1:\beta$ ($\beta\geq0$), a line where the atomic ratio of [In]:[M]:[Zn] is $2:1:\beta$, a line where the atomic ratio of [In]:[M]:[Zn] is $1:1:\beta$, a line where the atomic ratio of [In]:[M]:[Zn] is $1:2:\beta$, a line where the atomic ratio is [In]:[M]:[Zn]$=1:3:\beta$, and a line where the atomic ratio of [In]:[M]:[Zn] is $1:4:\beta$.

A metal oxide having the atomic ratio of [In]:[M]:[Zn] =0:2:1 or a value in the neighborhood thereof in FIG. 7(A), FIG. 7(B), and FIG. 7(C) tends to have a spinel crystal structure.

In addition, a plurality of phases coexist in the metal oxide in some cases (two-phase coexistence, three-phase coexistence, or the like). For example, with an atomic ratio having a value in the vicinity of [In]:[M]:[Zn]=0:2:1, two phases of a spinel crystal structure and a layered crystal structure are likely to coexist. In addition, with an atomic ratio having a value in the vicinity of [In]:[M]:[Zn]=1:0:0, two phases of a bixbyite crystal structure and a layered crystal structure are likely to coexist. In the case where a plurality of phases coexist in the metal oxide, a crystal grain boundary is formed between different crystal structures in some cases.

A region A illustrated in FIG. 7(A) represents an example of the preferred range of the atomic ratio of indium, the element M, and zinc contained in the metal oxide.

When the metal oxide has a higher content of indium, the carrier mobility (electron mobility) of the metal oxide can be increased. Thus, a metal oxide having a high content of indium has higher carrier mobility than a metal oxide having a low content of indium.

By contrast, when the content of indium and zinc in a metal oxide becomes lower, the carrier mobility becomes lower. Thus, in the case of an atomic ratio of [In]:[M]:[Zn]=0:1:0 and a value in the neighborhood thereof (e.g., a region C in FIG. 7(C)), insulation performance becomes better.

For example, the metal oxide used in a channel formation region or a low-resistance region preferably has an atomic ratio represented by the region A in FIG. 7(A), with which high carrier mobility is obtained. The metal oxide used in a channel formation region or a low-resistance region may have In:Ga:Zn=4:2:3 to 4.1 and approximately a value in the neighborhood thereof, for example. On the other hand, in the case where the metal oxide is provided to surround a channel formation region or a low-resistance region, the metal oxide preferably has the atomic ratio represented by the region C in FIG. 7(C), with which a relatively high insulating property is obtained. The metal oxide provided to surround the channel formation region or the low-resistance region may have In:Ga:Zn of approximately 1:3:4 or In:Ga:Zn of approximately 1:3:2. Alternatively, the metal oxide provided to surround the channel formation region or the low-resistance regions may be formed using a metal oxide that is equivalent to a metal oxide used as the channel formation region or the low-resistance region.

In the region A, particularly in a region B illustrated in FIG. 7(B), an excellent metal oxide having high carrier mobility and high reliability can be obtained.

Note that the region B includes [In]:[M]:[Zn]=4:2:3 to 4.1 and a value in the neighborhood thereof. The value in the vicinity includes [In]:[M]:[Zn]=5:3:4. In addition, the region B includes [In]:[M]:[Zn]=5:1:6 and a value in the neighborhood thereof and [In]:[M]:[Zn]=5:1:7 and a value in the neighborhood thereof.

The atomic ratio of the metal oxide has an influence on ease of oxygen diffusion in the metal oxide or ease of transmission.

In the metal oxide in the region A with a high indium content, in particular, in the region B (referred to as a first metal oxide), oxygen easily diffuses, oxygen contained in a material adjacent to the first metal oxide is easily absorbed, and oxygen is easily released to the material adjacent to the first metal oxide. That is, in the case where the first metal oxide is provided between a first material containing oxygen and a second material that has a smaller oxygen content than the first material, oxygen contained in the first material passes through the first metal oxide and is supplied to the second material in some cases. On the other hand, oxygen is less likely to diffuse in the metal oxide in the region C (referred to as a second metal oxide); therefore, the second metal oxide inhibits passage of oxygen and functions as a blocking layer against oxygen in some cases. That is, when the second metal oxide is provided between a third material containing oxygen and a fourth material that has a smaller oxygen content than the third material, the second metal oxide inhibits oxygen contained in the third material from diffusing and supply to the fourth material is inhibited in some cases.

As described above, the atomic ratio of the metal oxide is important in terms of electric conductivity and an oxygen diffusion property and is to be controlled in accordance with characteristics needed to the metal oxide.

In the case where the metal oxide is formed by a sputtering method, the atomic ratio of a sputtering target depends on the atomic ratio of the film. In the case where an In-M-Zn oxide is used as the metal oxide, it is preferable to use a target containing a polycrystalline In-M-Zn oxide as the sputtering target. Note that the atomic ratio of the deposited metal oxide varies from the above atomic ratios of metal elements contained in the sputtering target in a range of ±40%. For example, when the composition ratio of the sputtering target used for the metal oxide is In:Ga:Zn=4:2:4.1 [atomic ratio], the composition ratio of the deposited metal oxide may be In:Ga:Zn=4:2:3 [atomic ratio] or in the neighborhood thereof. When the composition ratio of the sputtering target used for the metal oxide is In:Ga:Zn=5:1:7 [atomic ratio], the composition ratio of the deposited metal oxide may be 5:1:6 [atomic ratio] or in the neighborhood thereof.

Note that the property of a metal oxide is not uniquely determined by an atomic ratio. Even with the same atomic ratio, the property of a metal oxide might be different depending on a formation condition. For example, in the case where the metal oxide is deposited with a sputtering apparatus, a film having an atomic ratio deviated from the atomic ratio of a target is formed. Depending on the substrate temperature in deposition, [Zn] in the film might be smaller than [Zn] in the target. Thus, the illustrated regions each represent an atomic ratio with which a metal oxide tends to have specific characteristics, and boundaries of the regions A to C are not clear.

Here, in the case where a plurality of metal oxides having different atomic ratios are stacked, a plurality of sputtering targets corresponding to the respective atomic ratios and a plurality of chambers in which these sputtering targets are set are needed.

In deposition by a sputtering method, particles in deposition enter a deposition surface; therefore, when another film is formed on the deposition surface, deposition damage to the film might be caused. Here, deposition damage includes formation of a mixed layer in the case where particles enter the film in deposition, a reduction in the crystallinity of the film in the case where the film includes crystal, and the like.

In view of the above problem that is caused in the deposition by a sputtering method, it is preferable that the atomic ratio of the metal oxide be adjusted by deposition conditions of the metal oxide. In addition, the metal oxide is preferably formed by a deposition method that causes less deposition damage.

For the above problem, an ALD (Atomic Layer Deposition) method can be used as the formation method of the metal oxide.

In an ALD method, one atomic layer can be deposited at a time using self-regulating characteristics of precursor molecules or atoms included in the precursor. Hence, an ALD method has effects such as deposition of an extremely thin film, deposition of a film on a component with a large aspect ratio, deposition of a film with a small number of defects such as pinholes, deposition of a film with excellent coverage, and deposition of a film at a low temperature. An ALD method includes a deposition method using plasma, a plasma ALD (PEALD: Plasma Enhanced ALD) method. The use of plasma is sometimes preferable because deposition at a lower temperature is possible. Note that a precursor used in an ALD method sometimes contains an element such as carbon or chlorine. Thus, in some cases, a film provided by an ALD method contains a larger amount of an element such as carbon or chlorine than a film provided by another deposition method. Note that these elements can be quantified by X-ray photoelectron spectroscopy (XPS).

Unlike a deposition method in which particles ejected from a target or the like are deposited, an ALD method is a deposition method in which a film is formed by reaction at a surface of an object. Thus, an ALD method is a deposition method that enables favorable step coverage almost regardless of the shape of an object. In particular, an ALD method enables excellent step coverage and excellent thickness uniformity and thus is suitable for covering a surface of an opening portion with a high aspect ratio, for example. On the other hand, an ALD method has a relatively low deposition rate; thus, it is sometimes preferable to combine an ALD method with another deposition method with a high deposition rate such as a CVD method.

When an ALD method is employed, the composition of a film to be formed can be controlled with the amount of introduced source gases. For example, a film with a certain composition can be deposited depending on the amount of introduced source gases and the number of times of introduction (also referred to as the number of pulses) in an ALD method. Moreover, for example, when the source gas is changed during the deposition in an ALD method, a film in which the composition is continuously changed can be deposited. In the case of depositing a film while changing the source gas, time taken for the deposition can be shortened because time taken for transfer and pressure adjustment is omitted, as compared with the case of depositing a film with the use of a plurality of deposition chambers. Thus, the productivity of semiconductor devices can be improved in some cases.

<Deposition Method Using ALD Apparatus and ALD Method>

Here, an ALD apparatus that can be used for forming the metal oxide of one embodiment of the present invention and a deposition method using an ALD method will be described.

In a deposition apparatus utilizing an ALD method, deposition is performed in such a manner that a first source gas (also referred to as a precursor or a metal precursor) and a second source gas (also referred to as a reactant or a nonmetallic precursor) are alternately introduced into a chamber for reaction, and then the introduction of these source gases is repeated. Note that the source gases to be introduced can be switched by switching the respective switching valves (also referred to as high-speed valves), for example. When the source gases are introduced, an inert gas such as nitrogen ($N_2$) or argon (Ar) may be introduced as a carrier gas with the source gases into the chamber. With the use of a carrier gas, the source gases can be inhibited from being adsorbed onto an inner side of a pipe or an inner side of a valve and can be introduced into the chamber, even in the case where the volatility of the source gases is low or the vapor pressure is low. Moreover, uniformity of the formed film is improved, which is preferable.

An example of a deposition method using an ALD method is described with reference to FIG. 1. First, a first source gas is introduced into a chamber (see FIG. 1(A)) and a precursor 601 is adsorbed onto a substrate surface (a first step). Here, the precursor 601 is adsorbed onto the substrate surface, whereby a self-limiting mechanism of surface chemical reaction works and no more precursor is adsorbed onto a layer of the precursor over the substrate (see FIG. 1(B)). Note that the proper range of substrate temperatures at which the self-limiting mechanism of surface chemical reaction works is also referred to as an ALD Window. The ALD Window is determined by the temperature characteristics, vapor pressure, decomposition temperature, and the like of a precursor and is set to higher than or equal to 100° C. and lower than or equal to 500° C., preferably higher than or equal to 200° C. and lower than or equal to 400° C. Next, an excessive precursor, a reaction product, and the like are released from the chamber by vacuum evacuation (a second step). Alternatively, instead of performing vacuum evacuation, an inert gas (e.g., argon or nitrogen) or the like may be introduced into the chamber to release an excessive precursor, a reaction product, and the like from the chamber. This step is also called purge. Next, a reactant 602 (e.g., an oxidizer (ozone ($O_3$), oxygen ($O_2$), water ($H_2O$), and plasma, a radical, and an ion thereof)) is introduced as a second source gas into the chamber (see FIG. 1(C)) to react with the precursor 601 adsorbed onto the substrate surface, whereby part of components contained in the precursor 601 is released while the component molecules of the film are kept adsorbed onto the substrate (a third step) (see FIG. 1(D)). After that, an excessive reactant 602, a reaction product, and the like are released from the chamber by vacuum evacuation or introduction of an inert gas (a fourth step).

Note that in the following description of this specification, in the case of using ozone, oxygen, and water as a reactant or an oxidizer, they include not only those in gas and molecular states but also those in a plasma state, a radical state, and in an ion state, unless otherwise specified. In the case where a film is deposited using an oxidizer in a plasma state, a radical state, or an ion state, a radical ALD apparatus or a plasma ALD apparatus, which will be described later, is used.

Water is preferably used as an oxidizer to remove carbon contained in the precursor. Hydrogen contained in water reacts with carbon contained in the precursor, whereby carbon can be released from the precursor efficiently. On the other hand, in order to reduce hydrogen contained in a film to be formed as much as possible, ozone or oxygen, which does not contain hydrogen, is preferably used as the oxidizer. Alternatively, after water is introduced as a first oxidizer to the chamber to remove carbon contained in the precursor, vacuum evacuation is performed, hydrogen is removed by introducing ozone or oxygen, which does not contain hydrogen, as a second oxidizer to the chamber, and vacuum evacuation is performed. After that, the first step to the fourth step are repeated until a desired thickness is obtained.

Note that in the above description, an example in which the second source gas is introduced into the chamber after the first source gas is introduced into the chamber is shown; however, the present invention is not limited thereto. The first source gas may be introduced into the chamber after the second source gas is introduced into the chamber. That is, deposition may be performed in such a manner that the third step is performed first, the fourth step is performed subsequently, and then the first step to the fourth step are repeated. Alternatively, deposition may be performed in such a manner that the third step and the fourth step are repeated a plurality of times, and then the first step to the fourth step are repeated.

In this manner, the third step and the fourth step are preferably performed once or more before the first step because the deposition atmosphere in the chamber can be controlled. For example, an oxidizer is introduced as the third step, so that the chamber can have an oxygen atmosphere. Deposition began in an oxygen atmosphere is preferable because the formed film can have a high concentration of oxygen. Furthermore, oxygen can also be supplied to the insulator and the oxide that are to be bases of the film. A semiconductor device formed by such a method can have favorable characteristics and obtain high reliability.

After the first step and the second step, introduction of the second source gas in the third step and vacuum evacuation or introduction of an inert gas in the fourth step may be repeated a plurality of times. That is, after the first step, the second step, the third step, the fourth step, the third step, and the fourth step are performed, that is, after the third step and the fourth step are repeated, the first step and the second step may be performed.

For example, $O_3$ and $O_2$ are introduced as oxidizers in the third step, vacuum evacuation is performed in the fourth step, and then these steps may be repeated a plurality of times.

In the case where the third step and the fourth step are repeated, it is not necessary to repeat the introduction of the same kind of source gas. For example, $H_2O$ may be used as an oxidizer in the third step in the first cycle, and $O_3$ may be used as an oxidizer in the third steps in and after the second cycle.

In this manner, the introduction of an oxidizer and vacuum evacuation (or the introduction of an inert gas) in the chamber are repeated a plurality of times in a short time, whereby excess hydrogen atoms, carbon atoms, chlorine atoms, and the like can be more certainly removed from the precursor adsorbed onto the substrate surface and released to the outside of the chamber. When the number of the kinds of the oxidizer is increased to two, more excess hydrogen atoms and the like can be removed from the precursor adsorbed onto the substrate surface. In this manner, hydrogen atoms are prevented from being taken into the film during the deposition, so that water, hydrogen, and the like contained in the formed film can be reduced.

With the use of such a method, it is possible to form a film of which the released amount of water molecules is greater than or equal to $1.0\times10^{13}$ molecules/cm$^2$ and less than or equal to $1.0\times10^{16}$ molecules/cm$^2$, preferably greater than or equal to $1.0\times10^{13}$ molecules/cm$^2$ and less than or equal to $3.0\times10^{15}$ molecules/cm$^2$ in TDS analysis in a film-surface temperature range of 100° C. to 700° C. or 100° C. to 500° C.

A first single layer can be deposited on the substrate surface in the above manner, and a second single layer can be stacked over the first single layer by performing the first step to the fourth step again. The first step to the fourth step are repeated a plurality of times until a desired film thickness is obtained, whereby a thin film with excellent step coverage can be formed. The thickness of the thin film can be adjusted by the number of repetitions; therefore, an ALD method makes it possible to accurately adjust a film thickness and thus is suitable for a case of fabricating a miniaturized transistor.

A film formed by the above method has a layered structure in some cases. In addition, when a film formed by the above method has a crystal structure, the c-axis of the film is aligned in a direction approximately parallel to the normal direction of the deposition surface. That is, the c-axis of the film is aligned perpendicularly to the deposition surface. In this specification, such a crystal structure may be referred to as a CAAC structure, and an oxide semiconductor (metal oxide) having the CAAC structure may be referred to as a CAAC-OS, the details of which will be described later. It is possible to form a metal oxide having a CAAC structure by an ALD method.

An ALD method is a method in which deposition is performed through reaction of a precursor and a reactant using thermal energy. A temperature required for the reaction between the precursor and the reactant is determined by the temperature characteristics, vapor pressure, decomposition temperature, and the like thereof and is set to higher than or equal to 100° C. and lower than or equal to 500° C., preferably higher than or equal to 200° C. and lower than or equal to 400° C. Moreover, an ALD method in which treatment is performed by introducing a plasma-excited reactant into the chamber as a third source gas in addition to the precursor and the reactant which react with each other is referred to as a plasma ALD method in some cases. In this case, a plasma generation apparatus is provided in the introduction portion of the third source gas. Inductively coupled plasma (ICP) can be used for plasma generation. On the other hand, an ALD method in which reaction between the precursor and the reactant is performed using thermal energy is sometimes referred to as a thermal ALD method.

In a plasma ALD method, deposition is performed by introducing a plasma-excited reactant in the third step. Alternatively, deposition is performed in such a manner that the first step to the fourth step are repeated while a plasma-excited reactant (a second reactant) is introduced. In this case, the reactant introduced in the third step is referred to as a first reactant. In the plasma ALD method, the same material as the above-described oxidizer can be used for the second reactant used as the third source gas. In other words, plasma-excited ozone, oxygen, and water can be used as the second reactant. Other than the oxidizer, a nitriding agent may be used as the second reactant. As the nitriding agent, nitrogen ($N_2$) or ammonia ($NH_3$) can be used. A mixed gas of nitrogen ($N_2$) and hydrogen ($H_2$) can also be used as the nitriding agent. For example, a mixed gas of nitrogen ($N_2$) of 5% and hydrogen ($H_2$) of 95% can be used as the nitriding agent. Deposition is performed while plasma-excited nitrogen or ammonia is introduced, whereby a nitride film such as a metal nitride film can be formed.

Argon (Ar) or nitrogen ($N_2$) may be used as a carrier gas for the second reactant. The use of a carrier gas such as argon or nitrogen is preferable because plasma is easily discharged and the plasma-excited second reactant is easily generated. Note that in the case where an oxide film such as a metal oxide film is formed by a plasma ALD method and nitrogen is used as a carrier gas, nitrogen enters the film and a desired film quality cannot be obtained in some cases. In this case, argon is preferably used as the carrier gas.

By an ALD method, an extremely thin film can be deposited to have a uniform thickness. In addition, the coverage of an uneven surface with the film is high.

When deposition is performed by a plasma ALD method, deposition can be performed at a lower temperature than that by a thermal ALD method. By a plasma ALD method, for example, deposition can be performed without decreasing the deposition rate even at 100° C. or lower. Furthermore, in a plasma ALD method, not only an oxidizer but also any of a variety of reactants such as a nitriding agent can be used; therefore, it is possible to form various kinds of films of a nitride, a fluoride, a metal, and the like as well as an oxide.

In the case where a plasma ALD method is employed, as in an ICP (Inductively Coupled Plasma) method or the like, plasma can be generated in a state apart from a substrate. When plasma is generated in this manner, plasma damage can be reduced.

By the above method, a film that includes, as a component, atoms included in the first source, an oxide film, or a nitride film can be formed.

On the other hand, in the case where a film containing a plurality of metals is formed as the metal oxide, a plurality of precursors are prepared for every metal and sequentially introduced into the chamber.

In the case where an In-M-Zn oxide is formed as the metal oxide, a source gas that contains a first precursor containing indium is introduced into the chamber, and an excess source gas is evacuated (purged). Then, an oxidizer is introduced as a reactant into the chamber, and an excess reactant is evacuated. Next, a source gas that contains a second precursor containing the element M is introduced into the chamber, and an excess source gas is evacuated (purged). Then, an oxidizer is introduced as a reactant into the chamber, and an excess reactant is evacuated. After that, a source gas that contains a third precursor containing zinc is introduced into the chamber, and an excess source gas is evacuated (purged). Subsequently, an oxidizer is introduced as a reactant into the chamber, and an excess reactant is evacuated. The above steps are repeated, whereby a metal oxide including a single layer containing indium, a single layer containing the element M, and a single layer containing zinc can be formed. Note that the order of introduction of the source gases is not limited to the above. After the source gas containing the first precursor is introduced, the source gas containing the third precursor may be introduced, and then the source gas containing the second precursor may be introduced; the order can be determined appropriately by a practitioner in accordance with required film properties. In addition, evacuation of an excess source gas and introduction and evacuation of a reactant can be performed appropriately after the introduction of any of the source gases. Note that the metal oxide is not limited to an In-M-Zn oxide. As described above, the metal oxide preferably contains at least indium or zinc, further preferably contains indium and zinc. Alternatively, the number of kinds of metals contained in the metal oxide may be two, four, or more.

The atomic ratio of the metals contained in the metal oxide can be controlled by adjusting the number of introduction of the source gases containing precursors containing the desired metals into the chamber and the deposition temperature. For example, in order to increase the atomic ratio of the element M to indium or zinc, the source gas containing the second precursor containing the element M is introduced into the chamber; an excess source gas is evacuated, an oxidizer is introduced as a reactant into the chamber, an excess reactant is evacuated, then the source gas containing the second precursor containing the element M is introduced again into the chamber, an excess source gas is evacuated, an oxidizer is introduced as a reactant into the chamber, and an excess reactant is evacuated.

Alternatively, a plurality of precursors may be introduced into the chamber; for example, the metal oxide containing an In-M-Zn oxide may be formed in the following manner: a source gas containing the first precursor is introduced into the chamber, an excess source gas is evacuated, a reactant is introduced into the chamber, an excess reactant is evacuated, a source gas containing the second precursor and the third precursor is introduced into the chamber, an excess source gas is evacuated, a reactant is introduced into the chamber, and an excess reactant is evacuated. Note that the combination of precursors introduced into the chamber is not limited to the above. A source gas containing the first precursor and the second precursor may be introduced into the chamber, a source gas containing the first precursor and the third precursor may be introduced into the chamber, and a source gas containing the first precursor, the second precursor, and the third precursor may be introduced into the chamber. The combination can be determined appropriately by a practitioner in accordance with required film properties.

Alternatively, source gases that contain different precursors may be introduced into the chamber successively. For example, the metal oxide containing an In-M-Zn oxide may be formed in the following manner: a source gas containing the first precursor is introduced into the chamber, an excess source gas is evacuated, a reactant is introduced into the chamber, an excess reactant is evacuated, a source gas containing the second precursor is introduced into the chamber, an excess source gas is evacuated, then without introduction of a reactant, a source gas containing the third precursor is introduced into the chamber, an excess source gas is evacuated, a reactant is introduced into the chamber, and an excess reactant is evacuated. Note that the order of introduction and combination of the precursors that are successively introduced into the chamber are not limited to the above. After the source gas containing the third precursor is introduced into the chamber, the source gas containing the second precursor may be introduced into the chamber; alternatively, after the source gas containing the first precursor is introduced into the chamber, without introduction of a reactant, the source gas containing the second precursor may be introduced into the chamber. The order of introduction and combination can be determined appropriately by a practitioner in accordance with required film properties.

The metal oxide may be formed using a precursor containing a plurality of metals. For example, the metal oxide may be formed using a precursor containing indium and the element M in one molecule, a precursor containing indium and zinc in one molecule, a precursor containing the element M and zinc in one molecule, or the like.

<Composition of Metal Oxide>

The composition of a CAC (Cloud-Aligned Composite)-OS that can be used in a transistor disclosed in one embodiment of the present invention will be described below.

Note that in this specification and the like, CAAC (c-axis aligned crystal) or CAC (Cloud-Aligned Composite) might be stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

[Structure of Metal Oxide]

Oxide semiconductors (metal oxides) can be classified into a single crystal oxide semiconductor and a non-single-crystal oxide semiconductor. Examples of the non-single-crystal oxide semiconductors include a CAAC-OS, a polycrystalline oxide semiconductor, an nc-OS, an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as Vo)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

Note that a structure of an oxide semiconductor (metal oxide) in the semiconductor device of one embodiment of the present invention is not particularly limited; however, the oxide semiconductor (metal oxide) preferably has crystallinity. For example, an oxide 230 can have a CAAC-OS structure and an oxide 243 can have a hexagonal crystal structure. A semiconductor device can have high reliability when the oxide 230 and the oxide 243 have the above crystal structure.

[Impurities]

Here, the influence of each impurity in the metal oxide will be described.

When the metal oxide contains an alkali metal or an alkaline earth metal, defect states are formed and carriers are generated, in some cases. Thus, a transistor using a metal oxide that contains an alkali metal or an alkaline earth metal in its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by secondary ion mass spectrometry (SIMS) is set lower than or equal to $1\times10^{18}$ atoms/$cm^3$, preferably lower than or equal to $2\times10^{16}$ atoms/$cm^3$.

Hydrogen included in a metal oxide reacts with oxygen bonded to a metal atom to become water, and thus forms an oxygen vacancy, in some cases. When hydrogen enters the oxygen vacancy, an electron which is a carrier is generated in some cases. Furthermore, bonding of part of hydrogen to oxygen bonded to a metal atom causes generation of an electron serving as a carrier in some cases. Thus, a transistor using a metal oxide containing hydrogen is likely to have normally-on characteristics.

Accordingly, hydrogen in the metal oxide is preferably reduced as much as possible. Specifically, the hydrogen concentration of the metal oxide, which is obtained by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$. When a metal oxide in which impurities are sufficiently reduced is used in a channel formation region of a transistor, stable electrical characteristics can be given.

Note that as a metal oxide used for a semiconductor of a transistor, a thin film having high crystallinity is preferably used. With the use of the thin film, the stability or the reliability of the transistor can be improved. Examples of the thin film include a thin film of a single-crystal metal oxide and a thin film of a polycrystalline metal oxide. However, to form the thin film of a single-crystal metal oxide or the thin film of a polycrystalline metal oxide over a substrate, a high-temperature process or a laser heating process is needed. Thus, the manufacturing cost is increased, and in addition, the throughput is decreased.

Non-Patent Document 1 and Non-Patent Document 2 have reported that an In—Ga—Zn oxide having a CAAC structure (referred to as CAAC-IGZO) was found in 2009. It has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 3). It has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown a change in average crystal size due to electron beam irradiation to thin films of the above CAAC-IGZO, the above nc-IGZO, and IGZO having low crystallinity. In the thin film of IGZO having low crystallinity, crystalline IGZO of approximately 1 nm was observed even before the electron beam irradiation. Thus, it has been reported that the existence of a completely amorphous structure was not observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for a semiconductor of a transistor.

Non-Patent Document 6 shows that a transistor using a metal oxide has an extremely low leakage current in an off state; specifically, the off-state current per micrometer in the channel width of the transistor is of the order of yA/μm ($10^{-24}$ A/μm). For example, a low-power-consumption CPU applying a characteristic of low leakage current of the transistor using a metal oxide is disclosed (see Non-Patent Document 7).

Furthermore, application of a transistor using a metal oxide to a display device that utilizes the characteristic of a low leakage current of the transistor has been reported (see Non-Patent Document 8). In the display device, a displayed image is changed several tens of times per second. The number of times an image is changed per second is referred to as a refresh rate. The refresh rate is also referred to as driving frequency. Such high-speed screen change that is hard for human eyes to recognize is considered as a cause of eyestrain. Thus, Non-Patent Document 8 has proposed that the refresh rate of the display device be lowered to reduce the number of image rewriting operations. Moreover, driving with a lowered refresh rate enables the power consumption of the display device to be reduced. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI utilizing the characteristics of a low leakage current of the transistor have been studied.

As described above, an ALD method enables deposition of a film on a component with a large aspect ratio and also enables deposition of a film with excellent coverage on a side surface of a structure body. By using an ALD method, a metal oxide having a CAAC structure can be easily formed regardless of the orientation of the deposition surface. For example, a metal oxide with favorable coverage can be formed on a top surface, a bottom surface, and a surface with a slope of a structure body even when the structure body has a projected shape or a recessed shape. In other words, a metal oxide that has a substantially uniform thickness in the normal direction can be formed on each deposition surface. As for the metal oxide that is formed on each of the top surface, the bottom surface, and the surface with the slope of the structure body, the ratio of the minimum thickness to the maximum thickness can be greater than or equal to 0.5 and less than or equal to 1, preferably greater than or equal to 0.7 and less than or equal to 1, more preferably greater than or equal to 0.9 and less than or equal to 1. At this time, in the case where the metal oxide has a crystal structure, the c-axis thereof is aligned in a direction substantially parallel to the normal direction of each of the deposition surfaces. In other words, the c-axis is aligned perpendicularly to each of the deposition surfaces.

FIG. 2 is a diagram illustrating a metal oxide 51 including an In-M-Zn oxide formed on a structure body 50. Here, the structure body refers to a component included in a semiconductor device such as a transistor. The structure body 50 includes a substrate, conductors such as a gate electrode, a source electrode, and a drain electrode, an insulator such as a gate insulating film, an interlayer insulating film, and a base insulating film, a semiconductor such as a metal oxide or silicon, and the like. In FIG. 2(A), a deposition surface of the structure body 50 is positioned parallel to a substrate (or a base, not illustrated). FIG. 2(B) is an enlarged view of a region 53 that is part of the metal oxide 51 in FIG. 2(A). FIG. 2(B) illustrates a state in which a layer containing indium and a layer containing the element M and zinc are stacked over the top surface or the bottom surface of the structure body 50. The layer containing In is positioned parallel to the deposition surface of the structure body 50, and the layer containing the element M and zinc is positioned thereover to be parallel to the deposition surface of the structure body 50. That is, the a-b plane of the metal oxide 51 is substantially parallel to the deposition surface of the structure body 50, and the c-axis of the metal oxide 51 is substantially parallel to the normal direction of the deposition surface of the structure body 50.

Figure 2A:
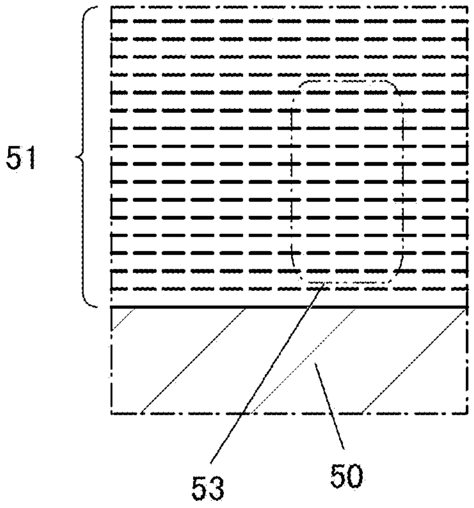
FIGS. 2A to 2D Cross-sectional views of a metal oxide of one embodiment of the present invention.
Figure 2B:
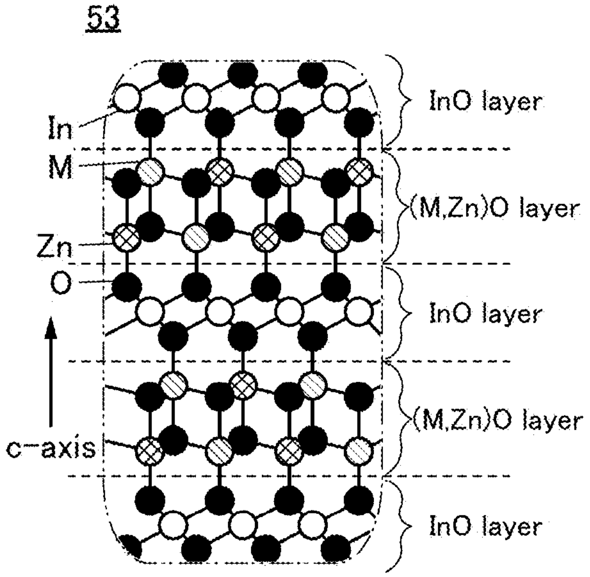
Figure 2C:
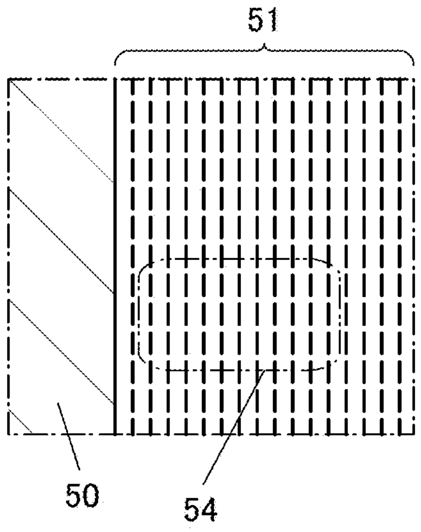
Figure 2D:
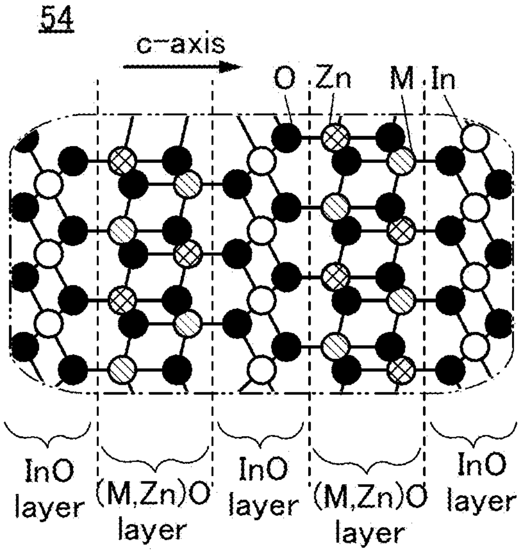

In FIG. 2(C), the deposition surface of the structure body 50 is positioned perpendicularly to a substrate (or a base, not illustrated). FIG. 2(D) is an enlarged view of a region 54 that is part of the metal oxide 51 in FIG. 2(C). FIG. 2(D) illustrates a state in which a layer containing indium and a layer containing the element M and zinc are stacked on the side surface of the structure body 50. The layer containing In is positioned parallel to the deposition surface of the structure body 50, and the layer containing the element M and zinc is positioned thereover to be parallel to the deposition surface of the structure body 50. That is, the a-b plane of the metal oxide 51 is substantially parallel to the deposition surface of the structure body 50, and the c-axis of the metal oxide 51 is substantially parallel to the normal direction of the deposition surface of the structure body 50.

Here, details of a method for forming the metal oxide 51 including an In-M-Zn oxide are described with reference to FIG. 3. Note that FIG. 3 illustrates an example in which an InO layer is formed as the layer containing indium, and an (M,Zn)O layer is formed as the layer containing the element M and zinc thereover; however, this embodiment is not limited thereto. An (M,Zn)O layer may be formed first, and an InO layer may be formed thereover. Alternatively, one of a layer containing the element M and a layer containing zinc may be formed over an InO layer, and the other of the layer containing the element M and the layer containing zinc may be formed thereover.

Figure 3A:
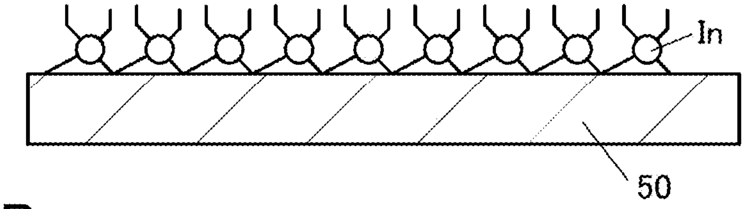
FIGS. 3A to 3E Cross-sectional views illustrating a deposition method of one embodiment of the present invention.
Figure 3B:
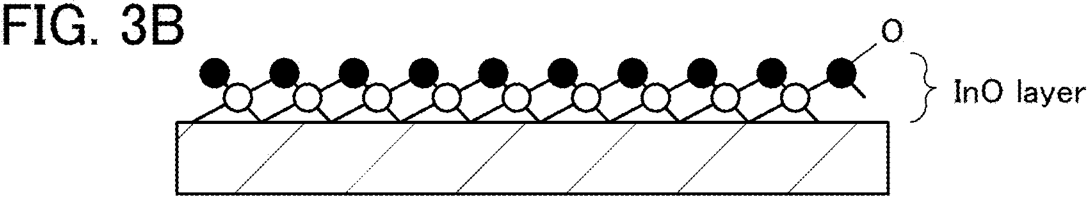

First, a source gas that contains a precursor containing indium is introduced into a chamber, so that the precursor is adsorbed onto a surface of the structure body 50 (see FIG. 3(A)). Here, the source gas contains a carrier gas such as argon or nitrogen in addition to the precursor. Triethylindium, tris(2,2,6,6-tetramethyl-3,5-heptanedione acid)indium, cyclopentadienylindium, or the like can be used as the precursor containing indium. Next, the chamber is purged, whereby an excess precursor, a reaction product, and the like are released from the chamber. Then, an oxidizer is introduced as a reactant into the chamber to react with the adsorbed precursor, and components other than indium are released while indium is adsorbed onto the substrate, so that an InO layer in which indium and oxygen are bonded to each other is formed (see FIG. 3(B)). Ozone, oxygen, water, or the like can be used as the oxidizer. After that, the chamber is purged, whereby an excess reactant, a reaction product, and the like are released from the chamber.

Figure 3C:
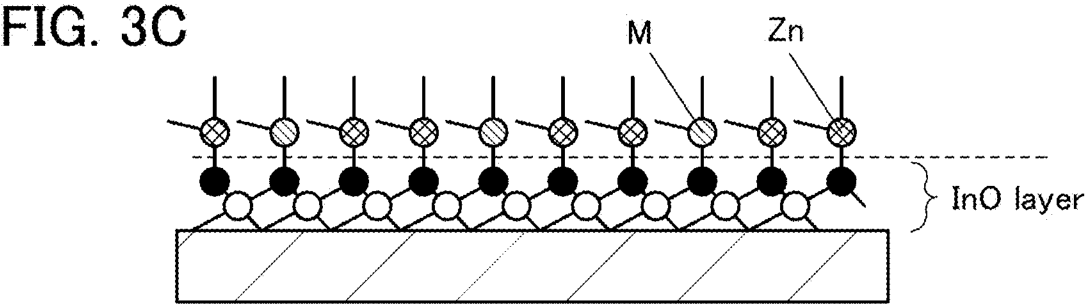
Figure 3D:
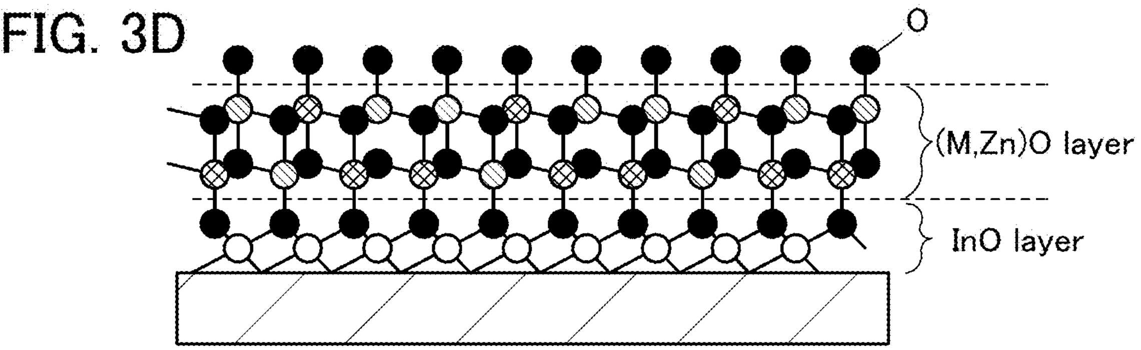

Subsequently, a source gas that contains a precursor containing the element M and a precursor containing zinc is introduced into the chamber, so that the precursors are adsorbed onto the InO layer (see FIG. 3(C)). Here, the source gas contains a carrier gas such as argon or nitrogen in addition to the precursors. In the case where gallium is used as the element M, trimethylgallium, triethylgallium, gallium trichloride, tris(dimethylamide)gallium, gallium (III) acetylacetonate, tris(2,2,6,6-tetramethyl-3,5-heptanedione acid)gallium, dimethylchlorogallium, diethylchlorogallium, or the like can be used as the precursor containing gallium. Dimethylzinc, diethylzinc, bis(2,2,6,6,tetramethyl-3,5-heptanedione acid)zinc, or the like can be use as the precursor containing zinc. Next, the chamber is purged, whereby excess precursors, a reaction product, and the like are released from the chamber. Then, an oxidizer is introduced as a reactant into the chamber to react with the adsorbed precursors, and components other than the element M and zinc are released while the element M and zinc are adsorbed onto the substrate, whereby an (M,Zn)O layer, which is a layer in which the element M and oxygen are bonded to each other and a layer in which zinc and oxygen are bonded to each other, is formed. After that, the chamber is purged, whereby an excess reactant, a reaction product, and the like are released from the chamber. An (M,Zn)O layer having a desired number of atoms and layers and a desired thickness may be formed by repeatedly performing formation of an (M,Zn)O layer a plurality of times (see FIG. 3(D)).

Figure 3E:
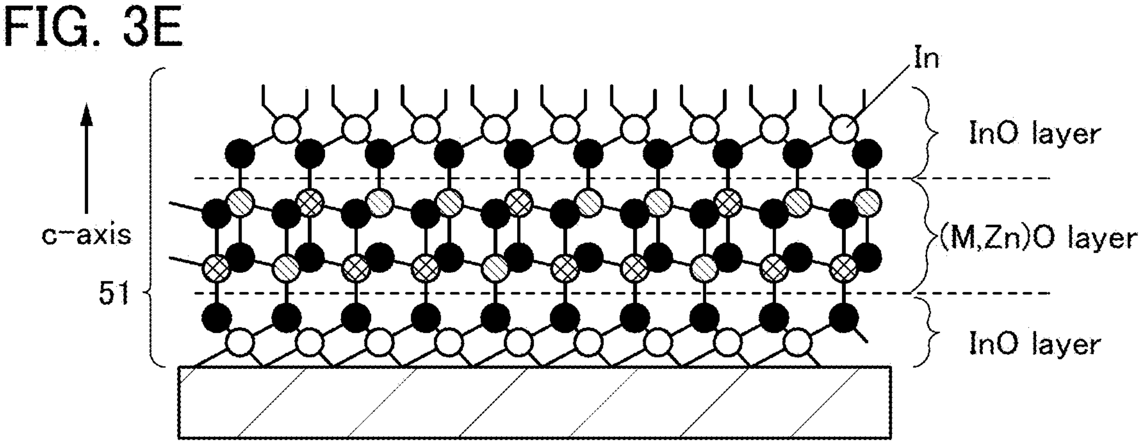

Next, an InO layer is formed again over the (M,Zn)O layer by the above-described method (see FIG. 3(E)). By repeating the above-described method, the metal oxide 51 can be formed over the substrate or the structure body.

Other than the above-described precursors containing the metal elements, there is a precursor that contains one or both of carbon and chlorine. A film that is formed using a precursor containing carbon may contain carbon. A film that is formed using a precursor containing chlorine may contain chlorine.

As described above, the metal oxide 51 is formed by an ALD method, whereby the metal oxide having a CAAC structure, in which the c-axis is aligned substantially parallel to the normal direction of the deposition surface, can be obtained.

Figure 4A:
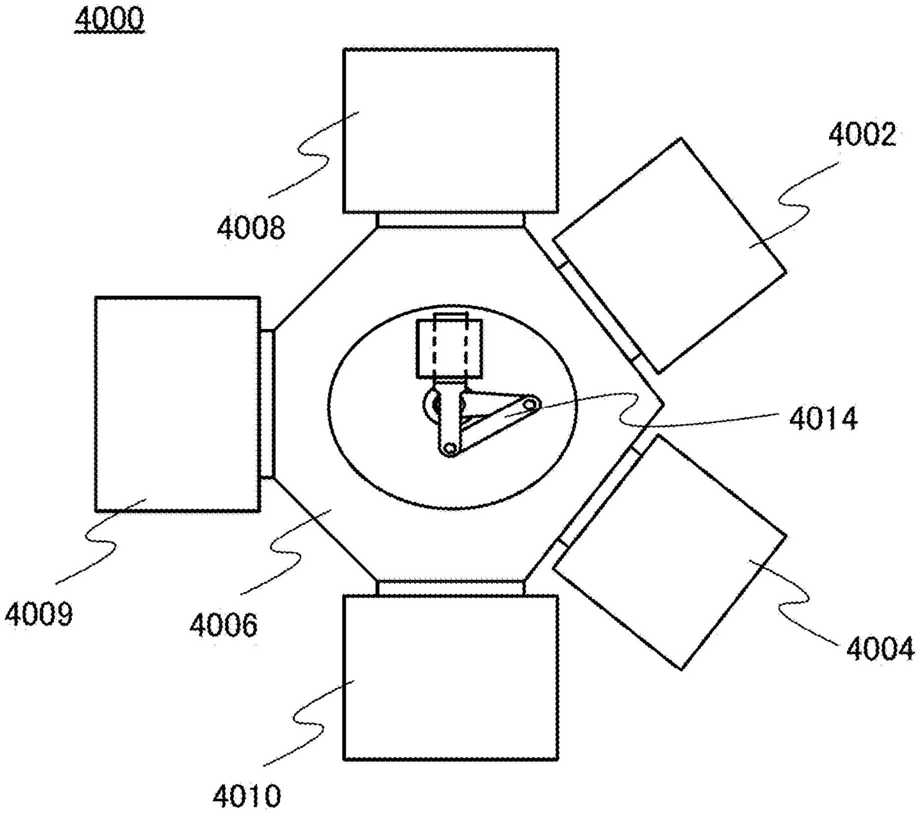
FIGS. 4A and 4B A top view and a cross-sectional view illustrating a deposition apparatus of one embodiment of the present invention.
Figure 4B:
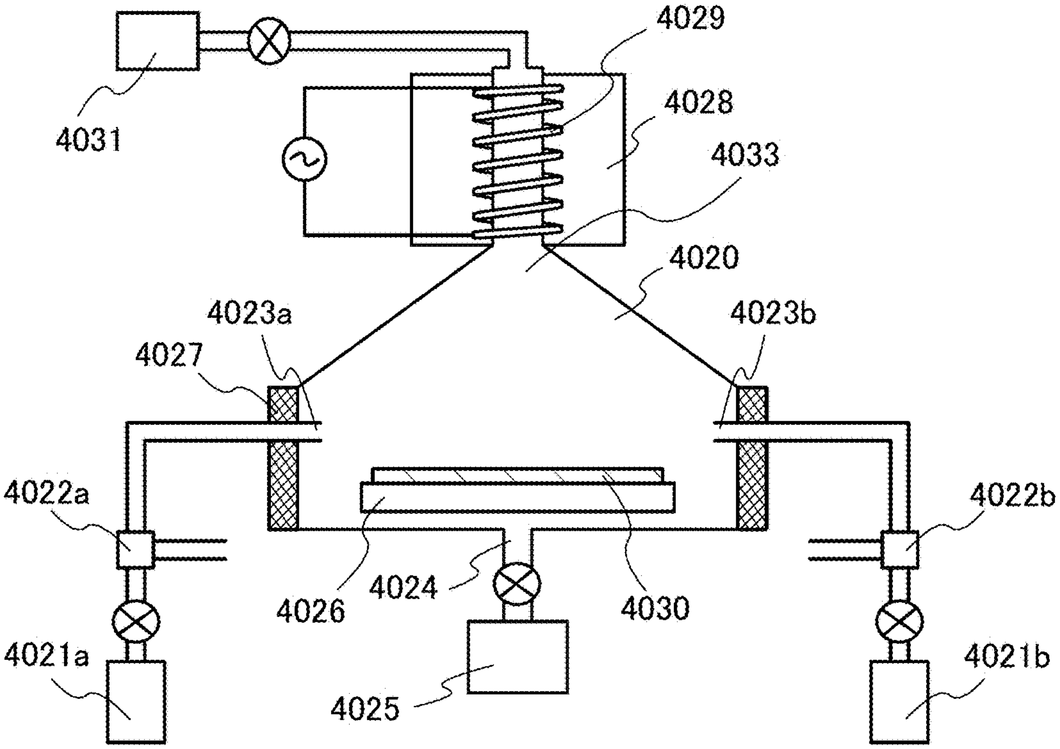

Here, the structure of a deposition apparatus 4000 is described with reference to FIG. 4(A) and FIG. 4(B) as an example of an apparatus with which deposition can be performed by an ALD method. FIG. 4(A) is a schematic view of the multi-chamber type deposition apparatus 4000, and FIG. 4(B) is a cross-sectional view of an ALD apparatus that can be used for the deposition apparatus 4000.

<Structure Example of Deposition Apparatus>

The deposition apparatus 4000 includes a carrying-in/out chamber 4002, a carrying-in/out chamber 4004, a transfer chamber 4006, a deposition chamber 4008, a deposition chamber 4009, a deposition chamber 4010, and a transfer arm 4014. Here, the carrying-in/out chamber 4002, the carrying-in/out chamber 4004, and the deposition chambers 4008 to 4010 are each independently connected to the transfer chamber 4006. Thus, successive deposition can be performed in the deposition chambers 4008 to 4010 without exposure to the air, whereby entry of impurities into a film can be prevented. Moreover, contamination of an interface between a substrate and a film and interfaces between films can be reduced, so that clean interfaces can be obtained.

Note that in order to prevent attachment of moisture and the like, the carrying-in/out chamber 4002, the carrying-in/out chamber 4004, the transfer chamber 4006, and the deposition chambers 4008 to 4010 are preferably filled with an inert gas (such as a nitrogen gas) whose dew point is controlled, and desirably maintain reduced pressure.

An ALD apparatus can be used as the deposition chambers 4008 to 4010. Alternatively, a structure may be employed in which a deposition apparatus other than an ALD apparatus is used as any of the deposition chambers 4008 to 4010. Examples of the deposition apparatus that can be used as any of the deposition chambers 4008 to 4010 include a sputtering apparatus, a plasma CVD (PECVD: Plasma Enhanced CVD) apparatus, a thermal CVD (TCVD) apparatus, a photo CVD apparatus, a metal CVD (MCVD) apparatus, and a metal organic CVD (MOCVD) apparatus. An apparatus having a function other than a deposition apparatus may be provided in one or more of the deposition chambers 4008 to 4010. Examples of the apparatus include a heating apparatus (typically, a vacuum heating apparatus) and a plasma generation apparatus (typically, a μ-wave plasma generation apparatus).

For example, in the case where the deposition chamber 4008 is an ALD apparatus, the deposition chamber 4009 is a PECVD apparatus, and the deposition chamber 4010 is a metal CVD apparatus, a metal oxide can be formed in the deposition chamber 4008, an insulating film functioning as a gate insulating film can be formed in the deposition chamber 4009, and a conductive film functioning as a gate electrode can be formed in the deposition chamber 4010. At that time, the metal oxide, the insulating film thereover, and the conductive film thereover can be formed successively without exposure to the air.

Although the deposition apparatus 4000 has a structure including the carrying-in/out chamber 4002, the carrying-in/out chamber 4004, and the deposition chambers 4008 to 4010, the present invention is not limited thereto. The number of the deposition chambers in the deposition apparatus 4000 may be four or more. The deposition apparatus 4000 may be of a single-wafer type or may be of a batch type, in which case deposition is performed on a plurality of substrates at a time.

<Ald Apparatus>

Next, a structure of an ALD apparatus that can be used as the deposition apparatus 4000 is described with reference to FIG. 4(B). The ALD apparatus includes a deposition chamber (a chamber 4020), a source material supply portion 4021 (a source material supply portion 4021*a* and source material supply portion 4021*b*), a source material supply portion 4031, high-speed valves 4022*a* and 4022*b* that are introduction amount controllers, a source material introduction port 4023 (source material introduction ports 4023*a* and 4023*b*), a source material introduction port 4033, a source material exhaust port 4024, and an evacuation unit 4025. The source material introduction ports 4023*a*, 4023*b*, and 4033 provided in the chamber 4020 are connected to the source material supply portions 4021*a*, 4021*b*, and 4031, respectively, through supply tubes and valves, and the source material exhaust port 4024 is connected to the evacuation unit 4025 through an exhaust tube, a valve, and a pressure controller.

A plasma generation apparatus 4028 is connected to the chamber 4020 as illustrated in FIG. 4(B), whereby deposition can be performed by a plasma ALD method as well as a thermal ALD method. It is preferable that the plasma generation apparatus 4028 be an ICP-type plasma generation apparatus using a coil 4029 connected to a high frequency power source. The high frequency power source is capable of outputting power with a frequency higher than or equal to 10 MHz and lower than or equal to 100 MHz, preferably higher than or equal to 1 MHz and lower than or equal to 60 MHz, more preferably higher than or equal to 10 MHz and lower than or equal to 60 MHz. For example, power with a frequency of 13.56 MHz, 60 MHz can be output. A plasma ALD method enables deposition without decreasing the deposition rate even at low temperatures, and thus is preferably used for a single-wafer type deposition apparatus with low deposition efficiency.

A substrate holder 4026 exists in the chamber, and a substrate 4030 is put over the substrate holder 4026. The substrate holder 4026 may be provided with a mechanism to which a constant potential or a high-frequency wave is applied. Alternatively, the substrate holder 4026 may be floating or grounded. A heater 4027, which is provided on an outside wall of the chamber, can control the temperature inside the chamber 4020 and the temperatures of the substrate holder 4026, the surface of the substrate 4030, and the like. The heater 4027 is preferably capable of controlling the temperature of the surface of the substrate 4030 to higher than or equal to 100° C. and lower than or equal to 500° C., preferably higher than or equal to 200° C. and lower than or equal to 400° C., and is capable of setting the temperature of the heater 4027 itself to higher than or equal to 100° C. and lower than or equal to 500° C.

In the source material supply portions 4021*a*, 4021*b*, and 4031, a source gas is formed from a solid source material or a liquid source material using a vaporizer, a heating unit, or the like. Alternatively, the source material supply portions 4021*a*, 4021*b*, and 4031 may supply a source gas.

Although FIG. 4(B) illustrates the example in which two source material supply portions 4021 and one source material supply portion 4031 are provided, this embodiment is not limited thereto. One or three or more source material supply portions 4021 may be provided. In addition, two or more source material supply portions 4031 may be provided. The high-speed valves 4022*a* and 4022*b* can be precisely controlled by time and are configured to control supply of a source gas from the source material supply portion 4021*a* and supply of a source gas from the source material supply portion 4021*b*.

In the deposition apparatus illustrated in FIG. 4(B), a thin film is formed over a substrate surface in such a manner that after the substrate 4030 is transferred onto the substrate holder 4026 and the chamber 4020 is sealed, the substrate 4030 is set to a desired temperature (e.g., higher than or equal to 100° C. and lower than or equal to 500° C., preferably higher than or equal to 200° C. and lower than or equal to 400° C.) by the heater 4027, and supply of the source gas from the source material supply portion 4021*a*, evacuation with the evacuation unit 4025, supply of the source gas from the source material supply portion 4031, and evacuation with the evacuation unit 4025 are repeated. Furthermore, in the deposition of the thin film, supply of a source gas supplied from the source material supply portion 4021*b* and evacuation with the evacuation unit 4025 may further be performed. The temperature of the heater 4027 is determined as appropriate depending on the kind of the film to be formed, the source gas, a desired film quality, and heat resistances of a substrate and a film and an element that are provided thereover. For example, the deposition may be performed when the temperature of the heater 4027 is set to higher than or equal to 200° C. and lower than or equal to 300° C. or higher than or equal to 300° C. and lower than or equal to 500° C.

When deposition is performed while the substrate 4030 is heated by the heater 4027, heat treatment for the substrate 4030 that is necessary in a later step can be omitted. That is, with the use of the chamber 4020 or the deposition apparatus 4000 provided with the heater 4027, formation of a film over the substrate 4030 can also serve as heat treatment for the substrate 4030.

In the deposition apparatus illustrated in FIG. 4(B), a metal oxide can be formed by appropriate selection of source materials (e.g., a volatile organic compound) used in the source material supply portion 4021 and the source material supply portion 4031. In the case where an In—Ga—Zn oxide, which contains indium, gallium, and zinc, is formed as the metal oxide, it is preferable to use a deposition apparatus provided with at least three source material supply portions 4021 and at least one source material supply portion 4031. It is preferable that a precursor containing indium be supplied from the first source material supply portion 4021, a precursor containing gallium be supplied from the second source material supply portion 4021, and a precursor containing zinc be supplied from the third source material supply portion 4021. In the case where the metal oxide is formed using precursors containing gallium and zinc, at least two source material supply portions 4021 are provided. Any of the above-described precursors can be used as the precursor containing indium, the precursor containing gallium, and the precursor containing zinc.

A reactant is supplied from the source material supply portion 4031. An oxidizer containing at least one of ozone, oxygen, and water can be used as the reactant.

In addition, an insulating layer that is formed to include an oxide (including a composite oxide) containing one or more kinds of elements selected from hafnium, aluminum, tantalum, zirconium, and the like can be deposited by appropriate selection of source materials (e.g., a volatile organometallic compound) used in the source material supply portions 4021*a*, 4021*b*, and 4031. Specifically, an insulating layer that is formed to include hafnium oxide, an insulating layer that is formed to include aluminum oxide, an insulating layer that is formed to include hafnium silicate, an insulating layer that is formed to include aluminum silicate, or the like can be deposited. Alternatively, a thin film, e.g., a metal layer such as a tungsten layer or a titanium layer, or a nitride layer such as a titanium nitride layer can be deposited by appropriate selection of source materials (e.g., a volatile organometallic compound) used for the source material supply portions 4021*a*, 4021*b*, and 4031.

For example, in the case where a hafnium oxide layer is formed by an ALD apparatus, the first source gas which is obtained by vaporizing liquid containing a solvent and a hafnium precursor compound (hafnium alkoxide or hafnium amide such as tetrakis(dimethylamide)hafnium (TDMAHf)), and the second source gas of ozone ($O_3$) and oxygen ($O_2$) as an oxidizer are used. In this case, the first source gas supplied from the source material supply portion 4021*a* is TDMAHf, and the second source gas supplied from the source material supply portion 4031 is ozone and oxygen. Note that the chemical formula of tetrakis(dimethylamide)hafnium is $Hf[N(CH_3)_2]_4$. Furthermore, examples of another material liquid include tetrakis(ethylmethylamide) hafnium. Alternatively, water can be used as the second source gas.

In the case where an aluminum oxide layer is formed by an ALD apparatus, the first source gas which is obtained by vaporizing a liquid containing a solvent and an aluminum precursor compound (e.g., TMA: trimethylaluminum) and the second source gas containing ozone ($O_3$) and oxygen ($O_2$) as an oxidizer are used. In this case, the first source gas supplied from the source material supply portion 4021*a* is TMA, and the second source gas supplied from the source material supply portion 4031 is ozone and oxygen. Note that the chemical formula of trimethylaluminum is $Al(CH_3)_3$. Examples of another material liquid include tris(dimethylamide)aluminum, triisobutylaluminum, and aluminum tris (2,2,6,6-tetramethyl-3,5-heptanedionate). Alternatively, water can be used as the second source gas.

FIG. 5 illustrates a different structure of an ALD apparatus that can be used for the deposition apparatus 4000. Note that detailed description on structures and functions similar to those of the ALD apparatus in FIG. 4(B) are omitted in some cases.

Figure 5A:
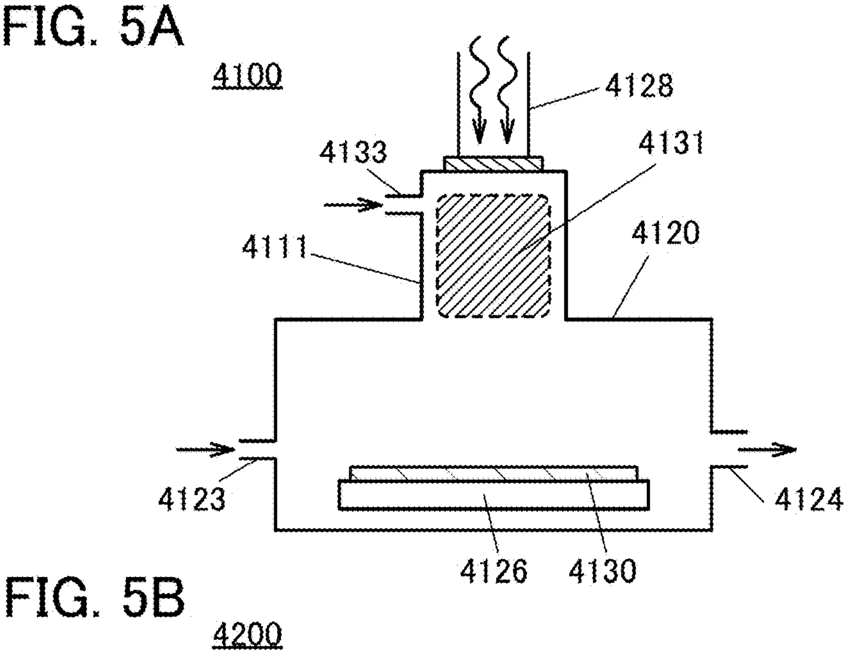
FIGS. 5A to 5C Cross-sectional views illustrating a deposition apparatus of one embodiment of the present invention.

FIG. 5(A) is a schematic view illustrating one embodiment of a plasma ALD apparatus. A plasma ALD apparatus 4100 is provided with a reaction chamber 4120 and a plasma generation chamber 4111 above the reaction chamber 4120. The reaction chamber 4120 can be referred to as a chamber. Alternatively, the reaction chamber 4120 and the plasma generation chamber 4111 can be collectively referred to as a chamber. The reaction chamber 4120 includes a source material introduction port 4123 and a source material exhaust port 4124, and the plasma generation chamber 4111 includes a source material introduction port 4133. Furthermore, by plasma generation apparatus 4128, a high-frequency wave such as RF or a microwave can be applied to a gas introduced to the generation chamber 4111, so that plasma 4131 can be generated in the plasma generation chamber 4111. In the case where the plasma 4131 is generated using a microwave, a microwave with a frequency of 2.45 GHz is typically used. Such plasma generated by the microwave is referred to as ECR (Electron Cyclotron Resonance) plasma in some cases. A substrate holder 4126 is included in the reaction chamber 4120, and a substrate 4130 is provided thereover. A source gas introduced from the source material introduction port 4123 is decomposed by heat from a heater provided in the reaction chamber 4120 and is deposited over the substrate 4130. A source gas introduced from the source material introduction port 4133 turns into a plasma state by the plasma generation apparatus 4128. The source gas in the plasma state is recombined with electrons and other molecules to be in a radical state before it reaches the surface of the substrate 4130, and reaches the substrate 4130. An ALD apparatus that performs deposition using a radical in such a manner may also be referred to as a radical ALD (Radical-Enhanced ALD) apparatus. In the plasma ALD apparatus 4100, the plasma generation chamber 4111 is provided above the reaction chamber 4120; however, this embodiment is not limited to this structure. The plasma generation chamber 4111 may be provided in contact with a side surface of the reaction chamber 4120.

Figure 5B:
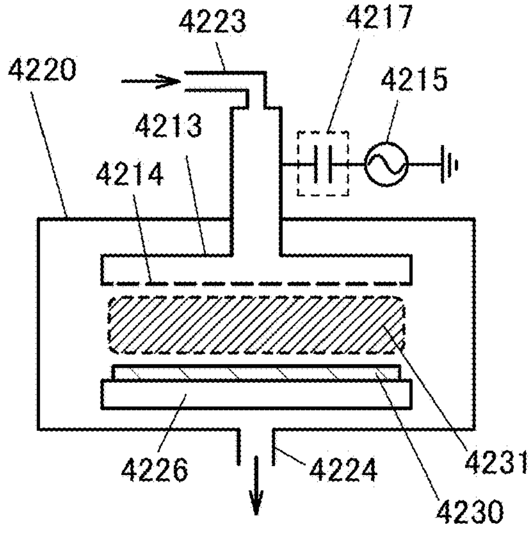

FIG. 5(B) is a schematic view illustrating one embodiment of a plasma ALD apparatus. A plasma ALD apparatus 4200 includes a chamber 4220. The chamber 4220 includes an electrode 4213, a source material exhaust port 4224, and a substrate holder 4226, and a substrate 4230 is put thereover. The electrode 4213 includes a source material introduction port 4223 and a shower head 4214 that supplies the introduced source gas into the chamber 4220. A power source 4215 capable of applying a high-frequency wave through a capacitor 4217 is connected to the electrode 4213. The substrate holder 4226 may be provided with a mechanism to which a constant potential or a high-frequency wave is applied. Alternatively, the substrate holder 4226 may be floating or grounded. The electrode 4213 and the substrate holder 4226 function as an upper electrode and a lower electrode for generating plasma 4231, respectively. A source gas introduced from the source material introduction port 4223 is decomposed by heat from a heater provided in the chamber 4220 and is deposited over the substrate 4230. Alternatively, the source gas introduced from the source material introduction port 4223 becomes in a plasma state between the electrode 4213 and the substrate holder 4226. The source gas in the plasma state enters the substrate 4230 owing to a potential difference (also referred to as an ion sheath) generated between the plasma 4231 and the substrate 4230.

Figure 5C:
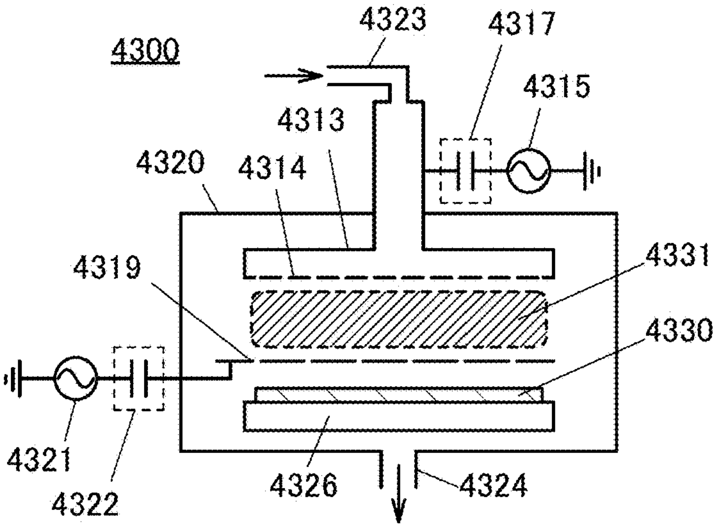

FIG. 5(C) is a schematic view illustrating one embodiment of a plasma ALD apparatus different form that in FIG. 5(B). A plasma ALD apparatus 4300 includes a chamber 4320. The chamber 4320 includes an electrode 4313, a source material exhaust port 4324, and a substrate holder 4326, and a substrate 4330 is provided thereover. The electrode 4313 includes a source material introduction port 4323 and a shower head 4314 that supplies the introduced source gas into the chamber 4320. A power source 4315 capable of applying a high-frequency wave through a capacitor 4317 is connected to the electrode 4313. The substrate holder 4326 may be provided with a mechanism to which a constant potential or a high-frequency wave is applied. Alternatively, the substrate holder 4326 may be floating or grounded. The electrode 4313 and the substrate holder 4326 function as an upper electrode and a lower electrode for generating plasma 4331, respectively. The plasma ALD apparatus 4300 is different from the plasma ALD apparatus 4200 in that a mesh 4319 to which a power source 4321 capable of applying a high-frequency wave through a capacitor 4322 is connected is provided between the electrode 4313 and the substrate holder 4326. With the mesh 4319, the plasma 4231 can be away from the substrate 4130. A source gas introduced from the source material introduction port 4323 is decomposed by heat from a heater provided in the chamber 4320 and is deposited over the substrate 4330. Alternatively, the source gas introduced from the source material introduction port 4323 becomes in a plasma state between the electrode 4313 and the substrate holder 4326. Charge of the source gas in the plasma state is removed by the mesh 4319 and the source gas reaches the substrate 4130 while being in an electrically neutral state such as a radical. Therefore, it is possible to perform deposition with small damage due to entering of ions or plasma.

<Deposition Sequence>

Figure 6A:
FIGS. 6A to 6C Diagrams illustrating a deposition method of one embodiment of the present invention.

FIG. 6(A) shows a deposition sequence using the ALD apparatus illustrated in FIG. 4(B). First, the substrate 4030 is set on the substrate holder 4026 in the chamber 4020 (S101). Next, the temperature of the heater 4027 is adjusted (S102). Then, the substrate 4030 is held on the substrate holder 4026 so that the temperature of the substrate 4030 becomes uniform in the substrate surface (S103). After that, deposition is performed through the first step to the fourth step that are described above. In other words, the first source gas and the second source gas are alternately introduced into the chamber 4020 to perform deposition over the substrate 4030 (S104). In addition, treatment for setting the inside of the chamber 4020 in an oxygen atmosphere may be performed between S103 and S104. The inside of the chamber 4020 is set in an oxygen atmosphere after setting and holding the substrate 4030, whereby oxygen can be added to the substrate 4030 and the film provided over the substrate 4030 in some cases. Furthermore, hydrogen can be released from the substrate 4030 before deposition and the film provided over the substrate 4030 in some cases. Hydrogen in the substrate 4030 or the film sometimes reacts with oxygen added to the substrate 4030 or the film, and is released from the substrate 4030 or the film as water ($H_2O$).

Figure 6B:
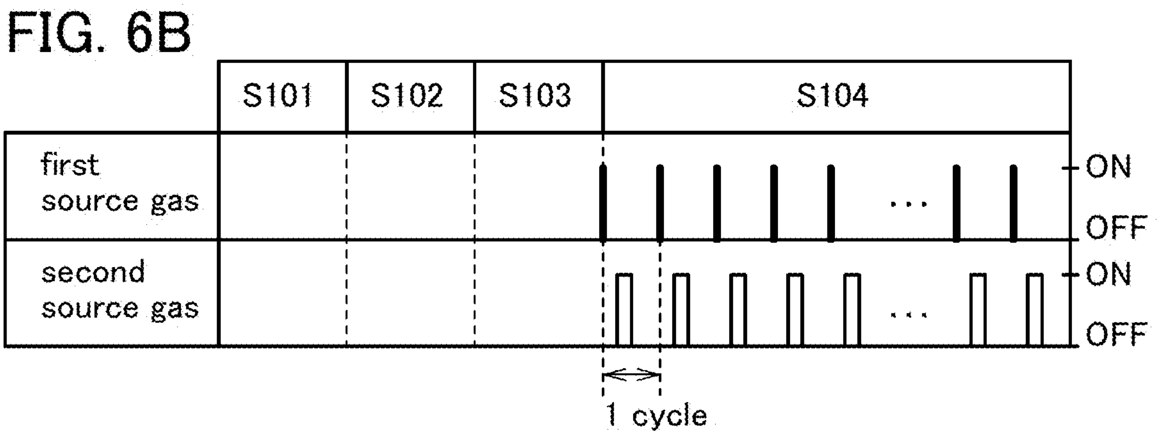

FIG. 6(B) shows a specific example of the above deposition sequence. In accordance with S101 to S103 described above, the substrate 4030 is set on the substrate holder 4026, the temperature of the heater 4027 is adjusted, and the substrate 4030 is held.

Next, the first source gas and the second source gas are alternately introduced to perform deposition over the substrate 4030 (S104). The first source gas and the second source gas are introduced in a pulsed form. In FIG. 6(B), introductions of the first source gas and the second source gas are each indicated by ON, and periods during which the source gases are not introduced are each indicated by OFF. In periods during which neither the first source gas nor the second source gas is introduced, the chamber 4020 is evacuated. The pulse time of introducing the first source gas into the chamber 4020 is preferably longer than or equal to 0.1 seconds and shorter than or equal to 1 second, further preferably longer than or equal to 0.1 seconds and shorter than or equal to 0.5 seconds. The period during which the first source gas is not introduced, that is, the time for evacuating the chamber 4020, is longer than or equal to 1 second and shorter than or equal to 15 seconds, preferably longer than or equal to 1 second and shorter than or equal to 5 seconds. The pulse time of introducing the second source gas into the chamber 4020 is preferably longer than or equal to 0.1 seconds and shorter than or equal to 30 seconds, further preferably longer than or equal to 0.3 seconds and shorter than or equal to 15 seconds. The period during which the second source gas is not introduced, that is, the time for evacuating the chamber 4020, is longer than or equal to 1 second and shorter than or equal to 15 seconds, preferably longer than or equal to 1 second and shorter than or equal to 5 seconds.

In the deposition, introduction of the first source gas (the first step), evacuation of the first source gas (the second step), introduction of the second source gas (the third step), and evacuation of the second source gas (the fourth step) are regarded as one cycle, and a film having a desired thickness is formed by repetition of this cycle.

In the case where treatment for setting the inside of the chamber 4020 in an oxygen atmosphere is performed between S103 and S104, the second source gas may be introduced into the chamber 4020. It is preferable that one or more selected from ozone (03), oxygen ($O_2$), and water ($H_2O$), which function as oxidizers, be introduced as the second source gas. In this embodiment, ozone ($O_3$) and oxygen ($O_2$) are used as the second source gas. In that case, the second source gas is preferably introduced in a pulsed form in a manner similar to that in S104; however, the present invention is not limited thereto. The second source gas may be successively introduced. In the period during which the second source gas is not introduced, the chamber 4020 is evacuated. The pulse time of introducing the second source gas into the chamber 4020 is preferably longer than or equal to 0.1 seconds and shorter than or equal to 30 seconds, further preferably longer than or equal to 0.3 seconds and shorter than or equal to 15 seconds. The period during which the second source gas is not introduced, that is, the time for evacuating the chamber 4020, is longer than or equal to 1 second and shorter than or equal to 15 seconds, preferably longer than or equal to 1 second and shorter than or equal to 5 seconds. When the second source gas such as an oxidizer is introduced into the chamber 4020, the substrate 4030 or the film provided over the substrate 4030 is exposed to the second source gas such as an oxidizer.

Note that after setting the substrate 4030 (S101), adjusting the temperature of the heater 4027 may be omitted if not needed. Moreover, after holding the substrate 4030 (S103), setting the inside of the chamber 4020 in an oxygen atmosphere may be omitted if not needed.

Figure 6C:
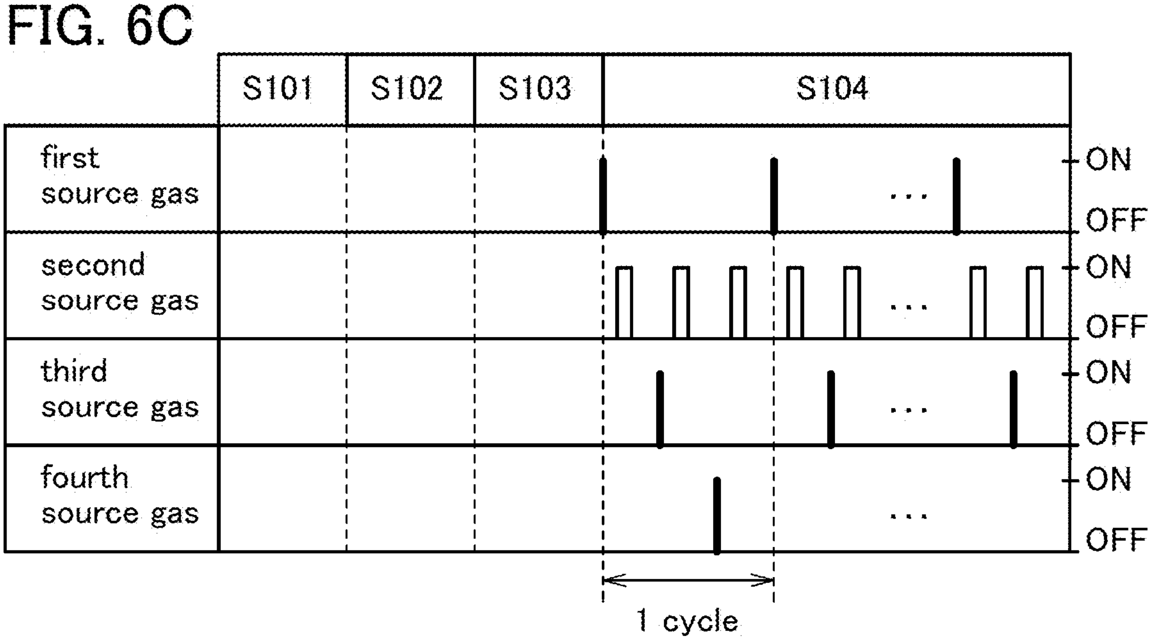

FIG. 6(C) shows an example of a sequence in the case where deposition is performed using two or more kinds of source gases containing precursors. In FIG. 6(C), source gases containing precursors correspond to the first source gas, the third gas, and the fourth source gas, and a source gas containing an oxidizer corresponds to the second source gas. In accordance with S101 to S103 described above, the substrate 4030 is set on the substrate holder 4026, the temperature of the heater 4027 is adjusted, and the substrate 4030 is held.

Next, the first source gas, the second source gas, the third source gas, the second source gas, the fourth source gas, and the second source gas are sequentially introduced to perform deposition over the substrate 4030 (S104). The first source gas to the fourth source gas are introduced in a pulsed form. In FIG. 6(C), introductions of the first source gas to the fourth source gas are each indicated by ON, and periods during which the source gases are not introduced are each indicated by OFF. In periods during which none of the first source gas to the fourth source gas are introduced, the chamber 4020 is evacuated. The pulse time of introducing the first source gas, the third source gas, and the fourth source gas into the chamber 4020 is preferably longer than or equal to 0.1 seconds and shorter than or equal to 1 second, further preferably longer than or equal to 0.1 seconds and shorter than or equal to 0.5 seconds. The period during which the first source gas, the third source gas, and the fourth source gas are not introduced, that is, the time for evacuating the chamber 4020, is longer than or equal to 1 second and shorter than or equal to 15 seconds, preferably longer than or equal to 1 second and shorter than or equal to 5 seconds. The pulse time of introducing the second source gas into the chamber 4020 is preferably longer than or equal to 0.1 seconds and shorter than or equal to 30 seconds, further preferably longer than or equal to 0.3 seconds and shorter than or equal to 15 seconds. The period during which the second source gas is not introduced, that is, the time for evacuating the chamber 4020, is longer than or equal to 1 second and shorter than or equal 20 to 15 seconds, preferably longer than or equal to 1 second and shorter than or equal to 5 seconds.

In the deposition, introduction of the first source gas, evacuation of the first source gas, introduction of the second source gas, evacuation of the second source gas, introduction of the third source gas, evacuation of the third second source gas, introduction of the second source gas, evacuation of the second source gas, introduction of the fourth source gas, evacuation of the fourth source gas, introduction of the second source gas, and evacuation of the second source gas are regarded as one cycle, and a film having a desired thickness is formed by repetition of this cycle.

For example, in the case where the first source gas contains a precursor containing indium, the third source gas contains a precursor containing gallium, and the fourth source gas contains a precursor containing zinc, an In—Ga—Zn oxide can be formed by the sequence shown in FIG. 6(C).

Note that in the sequence shown in FIG. 6(C), the order of introduction of the first source gas, the third source gas, and the fourth source gas is not limited thereto. Furthermore, the number of times of introduction of the first source gas, the third source gas, and the fourth source gas in one cycle is not necessarily one. A certain source gas is introduced a plurality of times in one cycle, whereby a film that has a high concentration of a metal element contained in the source gas can be formed. That is, the atomic ratio of a film to be formed can be controlled by change in the number of times of introduction of the gases. The first source gas, the third source gas, and the fourth source gas, or two kinds of source gases selected from these source gases may be introduced into the chamber 4020 concurrently.

This embodiment can be implemented in an appropriate combination with the structures described in the other embodiments, the examples, and the like.

Embodiment 2

An example of a semiconductor device including a transistor 200 of one embodiment of the present invention is described in this embodiment.

<Structure Example of Semiconductor Device>

FIG. 8 is a top view and cross-sectional views of the transistor 200 of one embodiment of the present invention and the periphery of the transistor 200.

Figure 8A:
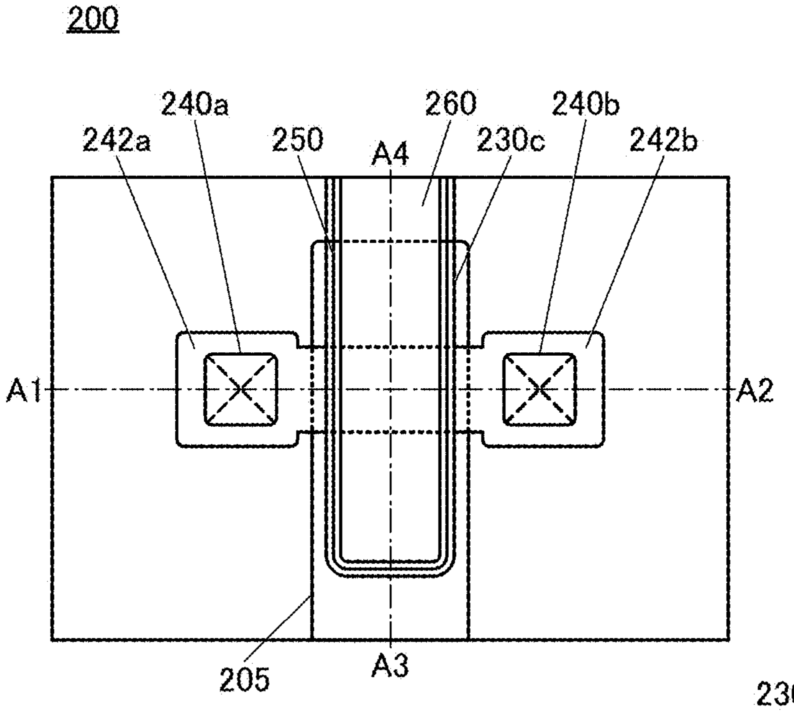
FIGS. 8A to 8C A top view and cross-sectional views of a semiconductor device of one embodiment of the present invention.
Figure 8C:
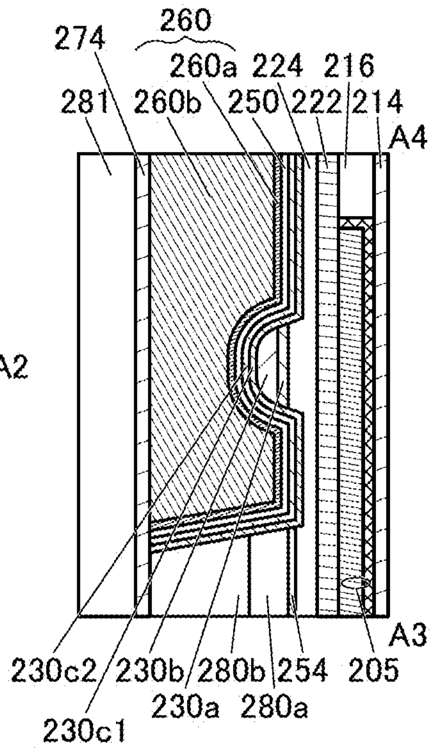
Figure 8B:
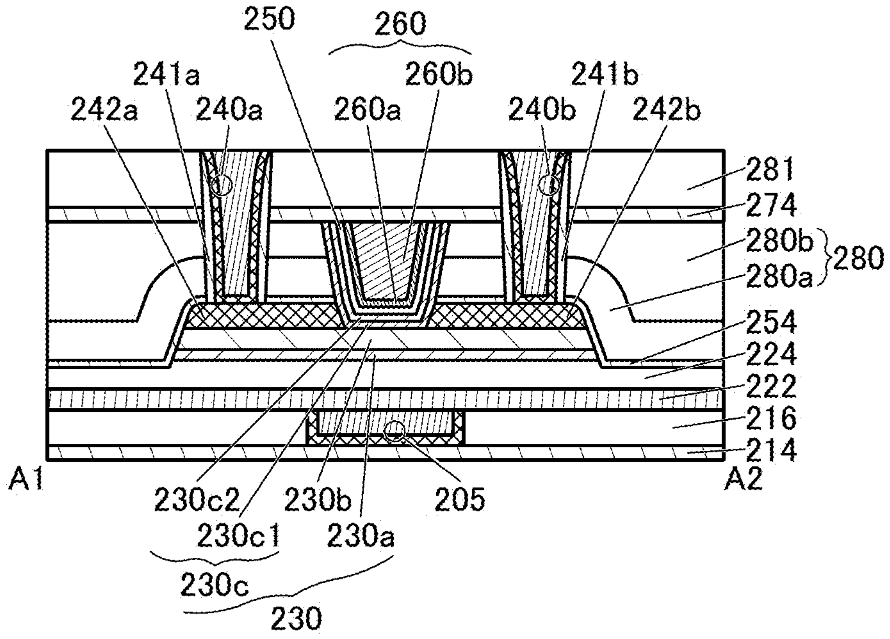

FIG. 8(A) is a top view of the semiconductor device including the transistor 200. FIG. 8(B) and FIG. 8(C) are cross-sectional views of the semiconductor device. Here, FIG. 8(B) is a cross-sectional view of a portion indicated by a dashed-dotted line A1-A2 in FIG. 8(A), and is also a cross-sectional view of the transistor 200 in the channel length direction. FIG. 8(C) is a cross-sectional view of a portion indicated by a dashed-dotted line A3-A4 in FIG. 8(A), and is also a cross-sectional view of the transistor 200 in the channel width direction. Note that for clarity of the drawing, some components are not illustrated in the top view in FIG. 8(A).

The semiconductor device of one embodiment of the present invention includes the transistor 200, and an insulator 214, an insulator 216, an insulator 280 (an insulator 280*a* and an insulator 280*b*), an insulator 274, and an insulator 281 that function as interlayer films. A conductor 240 (a conductor 240*a* and a conductor 240*b*) that is electrically connected to the transistor 200 and functions as a plug is also included. Note that an insulator 241 (an insulator 241*a* and an insulator 241*b*) is provided in contact with a side surface of the conductor 240 functioning as a plug.

The insulator 241 is provided in contact with a side wall of an opening formed in the insulator 280, the insulator 274, the insulator 281, and the like, a first conductor of the conductor 240 is provided in contact with its side surface, and a second conductor of the conductor 240 is further provided on the inner side. Here, the level of a top surface of the conductor 240 and the level of a top surface of the insulator 281 can be substantially the same. Note that although the transistor 200 having a structure in which the first conductor of the conductor 240 and the second conductor of the conductor 240 are stacked is illustrated, the present invention is not limited thereto. The conductor 240 may be provided as a single layer or to have a stacked-layer structure of three or more layers, for example. In the case where a structure body has a stacked-layer structure, layers may be distinguished by ordinal numbers corresponding to the formation order.

The insulator 280 includes the insulator 280*a* and the insulator 280*b* provided over the insulator 280*a*. Although FIG. 8 illustrates an example in which the insulator 280 has a stacked-layer structure of two layers, this embodiment is not limited thereto. The insulator 280 may have a single-layer structure or a stacked-layer structure of three or more layers.

[Transistor 200]

As illustrated in FIG. 8, the transistor 200 includes a conductor 205 positioned over a substrate (not illustrated) to be embedded in the insulator 216; an insulator 222 positioned over the insulator 216 and the conductor 205; an insulator 224 positioned over the insulator 222; the oxide 230 (an oxide 230*a*, an oxide 230*b*, and an oxide 230*c* (an oxide 230*c*1 and an oxide 230*c*2)) positioned over the insulator 224; an insulator 250 positioned over the oxide 230; a conductor 260 (a conductor 260*a* and a conductor 260*b*) positioned over the insulator 250; a conductor 242*a* and a conductor 242*b* in contact with part of a top surface of the oxide 230*b*; and an insulator 254 positioned in contact with part of a top surface of the insulator 224, a side surface of the oxide 230*a*, a side surface of the oxide 230*b*, a side surface of the conductor 242*a*, a top surface of the conductor 242*a*, a side surface of the conductor 242*b*, and a top surface of the conductor 242*b*.

The oxide 230 preferably includes the oxide 230*a* positioned over the insulator 224, the oxide 230*b* positioned over the oxide 230*a*, and the oxide 230*c* that is positioned over the oxide 230*b* and is at least partly in contact with the top surface of the oxide 230*b*. Including the oxide 230*a* below the oxide 230*b* makes it possible to inhibit diffusion of impurities into the oxide 230*b* from the components formed below the oxide 230*a*. Moreover, including the oxide 230*c* over the oxide 230*b* makes it possible to inhibit diffusion of impurities into the oxide 230*b* from the components formed above the oxide 230*c*. The oxide 230*c* preferably includes the oxide 230*c*1 and the oxide 230*c*2 placed over the oxide 230*c*1. Note that although the oxide 230*c* has a two-layer structure of the oxide 230*c*1 and the oxide 230*c*2 in FIG. 8, the oxide 230*c* may have a single-layer structure or a stacked-layer structure of three or more layers.

Note that the transistor 200 has a structure in which the oxide 230 has a three-layer structure of the oxide 230*a*, the oxide 230*b*, and the oxide 230*c* in a channel formation region and its vicinity; however, the present invention is not limited thereto. For example, the oxide 230 may be a single layer of the oxide 230*b* or may have a two-layer structure of the oxide 230*a* and the oxide 230*b*, a two-layer structure of the oxide 230*b* and the oxide 230*c*, or a stacked-layer structure of four or more layers, and each of the oxide 230*a* and the oxide 230*b* may have a stacked-layer structure.

In the transistor 200, a metal oxide functioning as a semiconductor (hereinafter, also referred to as an oxide semiconductor) is preferably used as the oxide 230 (the oxide 230*a*, the oxide 230*b*, and the oxide 230*c*) including a channel formation region.

The transistor 200 using an oxide semiconductor in the channel formation region exhibits extremely low leakage current in a non-conduction state (off-state current); thus, a semiconductor device with low power consumption can be provided. An oxide semiconductor can be deposited by a sputtering method or the like, and can be used for the transistor 200 constituting a highly integrated semiconductor device.

For example, as the oxide 230, a metal oxide such as an In-M-Zn oxide (an element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, an In-M oxide, an In—Zn oxide, or a M-Zn oxide may be used as the oxide 230.

Here, when the oxide 230 contains impurities such as hydrogen, nitrogen, and a metal element, the carrier density may increase and the resistance may be lowered. Furthermore, when the oxygen concentration of the oxide 230 decreases, the carrier density may increase and the resistance may be lowered.

When a conductor 242 (the conductor 242*a* and the conductor 242*b*) that is provided on and in contact with the oxide 230 and functions as a source electrode and a drain electrode has a function of absorbing oxygen in the oxide 230 or has a function of supplying impurities such as hydrogen, nitrogen, and a metal element to the oxide 230, a low-resistance region is partly formed in the oxide 230 in some cases. The conductor 242 is formed over the oxide 230*b* and is not in contact with the side surfaces of the oxide 230*a* and the oxide 230*b*, and the insulator 224. Therefore, oxidation of the conductor 242 due to oxygen contained in at least one of the oxide 230*a*, the oxide 230*b*, and the insulator 224 can be reduced. In addition, oxygen contained in the oxide 230*a* and the oxide 230*b*, in particular, in the channel formation region and its vicinity can be inhibit from being absorbed by the conductor 242 through the side surfaces of the oxide 230*a* and the oxide 230*b*.

Figure 9:
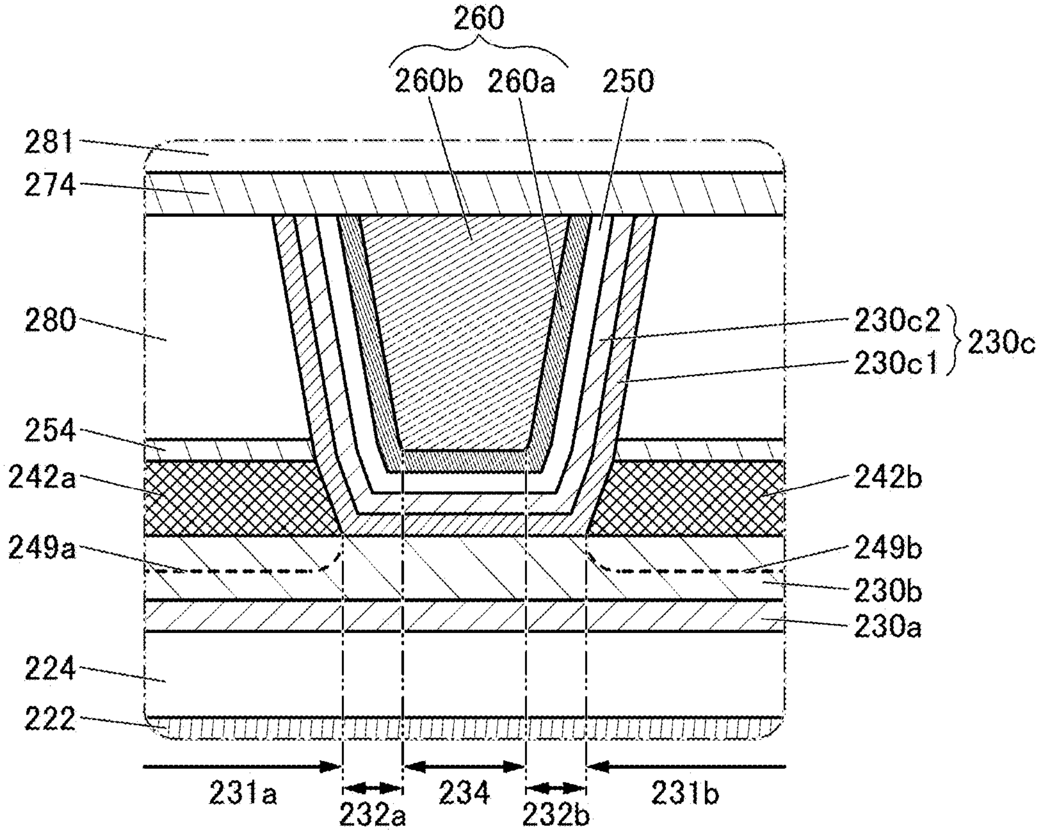
FIG. 9 A cross-sectional view of a semiconductor device of one embodiment of the present invention.

Here, FIG. 9 illustrates an enlarged view of the vicinity of the channel formation region in FIG. 8(B).

As illustrated in FIG. 9, the conductor 242 is provided on and in contact with the oxide 230*b*, and a region 249 (a region 249*a* and a region 249*b*) is formed as a low-resistance region at and near the interface of the oxide 230 with the conductor 242. The oxide 230 includes a region 234 functioning as the channel formation region of the transistor 200, a region 231 (a region 231*a* and a region 231*b*) including the region 249 and functioning as a source region or a drain region, and a region 232 (a region 232*a* and a region 232*b*) between the region 234 and the region 231.

In the region 231 functioning as the source region or the drain region, particularly the region 249 has reduced resistance by having an increased carrier concentration due to a low oxygen concentration or contained impurities such as hydrogen, nitrogen, or a metal element. In other words, the region 231 has higher carrier density and lower resistance than the region 234. Furthermore, the region 234 functioning as the channel formation region is a high-resistance region with a low carrier density because it has a higher oxygen concentration or a lower impurity concentration than specifically the region 249 of the region 231. It is preferable that the oxygen concentration in the region 232 be higher than or equal to the oxygen concentration in the region 231 and lower than or equal to the oxygen concentration in the region 234. Instead, it is preferable that the impurity concentration in the region 232 be lower than or equal to the impurity concentration in the region 231 and higher than or equal to the impurity concentration in the region 234.

That is, when the region 232 has resistance substantially equal to that of the region 234 depending on the concentration of oxygen or impurities contained in the region 232, the region 232 may function as a channel formation region like the region 234 or may function as a low-resistance region having resistance substantially equal to that of the region 231 or a low-resistance region that has higher resistance than the region 231 and lower resistance than the region 234. In particular, in the case where part of the oxide 230 includes a CAAC-OS, impurities contained in the region 231 are easily diffused in the a-b plane direction and the resistance of the region 232 is reduced in some cases.

When the region 249, which is a low-resistance region, contains a metal element, the region 249 preferably contains, in addition to the oxide 230, one or a plurality of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like.

Although the region 249 is formed near the interface of the oxide 230*b* with the conductor 242 in the thickness direction of the oxide 230*b* in FIG. 9, one embodiment of the present invention is not limited thereto. For example, the region 249 may have substantially the same thickness as the oxide 230*b* or may also be formed in the oxide 230*a*. Although the region 249 is formed only in the region 231 in FIG. 9, this embodiment is not limited thereto. In the case where impurities are diffused in the a-b plane direction as described above, the region 249 may be formed in the region 231 and the region 232, in the region 231 and part of the region 232, or in the region 231, the region 232, and part of the region 234.

In the oxide 230, the boundaries between the regions are difficult to detect clearly in some cases. The concentration of a metal element and the concentration of an impurity element such as hydrogen and nitrogen, which are detected in each region, may be not only gradually changed between the regions, but also continuously changed (also referred to as gradation) in each region. That is, the region closer to the channel formation region preferably has a lower concentration of a metal element and a lower concentration of an impurity element such as hydrogen and nitrogen.

To selectively reduce the resistance of the oxide 230, the conductor 242 is preferably formed using, for example, a material containing at least one of impurities and metal elements that increase conductivity, such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum. Alternatively, a conductive film 242A to be the conductor 242 is formed using a material, a deposition method, or the like that injects impurities such as an element that forms oxygen vacancies or an element trapped by oxygen vacancies into the oxide 230. Examples of the elements include hydrogen, boron, carbon, nitrogen, fluorine, phosphorus, sulfur, chlorine, and a rare gas. Typical examples of the rare gas include helium, neon, argon, krypton, and xenon.

A transistor using an oxide semiconductor is likely to have its electrical characteristics changed by impurities and oxygen vacancies in a channel formation region of the oxide semiconductor, which may affect the reliability. Moreover, when the channel formation region of the oxide semiconductor includes oxygen vacancies, the transistor tends to have normally on characteristics. Thus, oxygen vacancies in the region 234 where a channel is formed are preferably reduced as much as possible.

To inhibit the transistor from becoming normally on, the insulator 250 near the oxide 230 preferably contains oxygen that is released by heating (also referred to as excess oxygen). Oxygen in the insulator 250 is diffused into the oxide 230 to reduce oxygen vacancies in the oxide 230 and inhibit the transistor from becoming normally-on.

That is, oxygen contained in the insulator 250 is diffused into the region 234 of the oxide 230, whereby oxygen vacancies in the region 234 of the oxide 230 can be reduced. In addition, oxygen contained in the insulator 280 is diffused into the region 234 of the oxide 230 through the oxide 230*c*, whereby oxygen vacancies in the region 234 of the oxide 230 can be reduced. In that case, the oxide 230*c* may have a stacked-layer structure including the oxide 230*c*1 and the oxide 230*c*2 so that oxygen contained in the insulator 280 is diffused into the region 234 of the oxide 230 through the oxide 230*c*1. In addition, when the oxide 230*c*2 is formed using a material that transmits less oxygen, oxygen contained in the insulator 280 can be inhibited from diffusing into the insulator 250 or the conductor 260, and oxygen of the insulator 280 can be supplied to the region 234 of the oxide 230 efficiently.

With the above-described structure, the amount of oxygen supplied to the oxide 230 can be controlled, so that the transistor which has high reliability and in which normally-on characteristics are inhibited is obtained.

The conductor 260 functions as a gate electrode of the transistor 200, and the conductor 242*a* and the conductor 242*b* function as the source electrode and the drain electrode of the transistor 200. In the transistor 200, the conductor 260 is formed in a self-aligned manner to fill an opening formed in the insulator 280 and the like. The formation of the conductor 260 in this manner allows the conductor 260 to be positioned certainly in a region between the conductor 242*a* and the conductor 242*b* without alignment.

Note that the conductor 260 preferably includes the conductor 260*a* and the conductor 260*b* positioned over the conductor 260*a*. For example, the conductor 260*a* is preferably positioned to cover a bottom surface and a side surface of the conductor 260*b*. Moreover, as illustrated in FIG. 8(B), a top surface of the conductor 260 is substantially level with a top surface of the insulator 250 and a top surface of the oxide 230*c*.

Here, the conductor 260 sometimes functions as a first gate (also referred to as top gate) electrode. The conductor 205 functions as a second gate (also referred to as bottom gate) electrode in some cases. In that case, by changing a potential applied to the conductor 205 not in conjunction with but independently of a potential applied to the conductor 260, the threshold voltage (Vth) of the transistor 200 can be controlled. In particular, Vth of the transistor 200 can be higher than 0 V and the off-state current can be reduced by application of a negative potential to the conductor 205. Thus, drain current when a potential applied to the conductor 260 is 0 V can be lower in the case where a negative potential is applied to the conductor 205 than in the case where the negative potential is not applied to the conductor 205.

The insulator 222 and the insulator 254 preferably have a function of inhibiting diffusion of hydrogen (e.g., at least one of a hydrogen atom, a hydrogen molecule, and the like). In addition, the insulator 222 and the insulator 254 preferably have a function of inhibiting diffusion of oxygen (e.g., at least one of an oxygen atom, an oxygen molecule, and the like). For example, each of the insulator 222 and the insulator 254 preferably has a function of further inhibiting diffusion of one or both of hydrogen and oxygen as compared to the insulator 224. Each of the insulator 222 and the insulator 254 preferably has a function of further inhibiting diffusion of one or both of hydrogen and oxygen as compared to the insulator 250. Each of the insulator 222 and the insulator 254 preferably has a function of further inhibiting diffusion of one or both of hydrogen and oxygen as compared to the insulator 280.

In this specification, a film having a function of inhibiting diffusion of hydrogen or oxygen may be referred to as a film through which hydrogen or oxygen does not pass easily, a film having low permeability of hydrogen or oxygen, a film having a barrier property against hydrogen or oxygen, or a barrier film against hydrogen or oxygen, for example. When a barrier film has conductivity, the barrier film is sometimes referred to as a conductive barrier film.

As illustrated in FIG. 8(B), the insulator 254 is preferably in contact with the top surfaces of the conductor 242*a* and the conductor 242*b*, side surfaces of the conductor 242*a* and the conductor 242*b* other than their side surfaces facing each other, the side surfaces of the oxide 230*a* and the oxide 230*b*, and part of the top surface of the insulator 224. Thus, the insulator 280 is isolated from the insulator 224, the oxide 230*a*, and the oxide 230*b* by the insulator 254. This can inhibit entry of impurities such as hydrogen contained in the insulator 280 and the like into the insulator 224, the oxide 230*a*, and the oxide 230*b*.

As illustrated in FIG. 8(B), the transistor 200 has a structure in which the insulator 274 is in contact with the top surface of each of the conductor 260, the insulator 250, and the oxide 230*c*. Such a structure can inhibit entry of impurities such as hydrogen contained in the insulator 281 and the like into the insulator 250. Thus, adverse effects on the electric characteristics of the transistor and the reliability of the transistor can be suppressed.

The oxide 230*c* is formed over the oxide 230*b* of the channel formation region. The oxide 230*b*, which can serve as a channel formation region, preferably has crystallinity, which is described later. Thus, a deposition method that causes less deposition damage to the oxide 230*b* is preferably used in the formation of the oxide 230*c*. For example, an ALD method is a deposition method that causes less deposition damage to a deposition surface. Therefore, when the oxide 230*c* is deposited by an ALD method, deposition damage to the oxide 230*c* serving as a deposition surface can be reduced, so that the crystallinity of the oxide 230*b* can be kept.

As illustrated in FIG. 8(C), the oxide 230*c* is formed on a bottom portion and a side surface of the opening formed in the insulator 280 and the like. Thus, the oxide 230*c* on the bottom portion and the side surface of the opening preferably has a uniform thickness. An ALD method is a deposition method that provides excellent coverage for a structure body having a step or unevenness. Thus, when the oxide 230*c* is deposited by an ALD method, the oxide 230*c* on the bottom portion and the side surface of the opening can have a uniform thickness. For example, the ratio of the thickness of the oxide 230*c* on the side surface of the opening to the thickness of the oxide 230*c* on the bottom portion of the opening can be greater than or equal to 0.5 and less than or equal to 1, preferably greater than or equal to 0.7 and less than or equal to 1, more preferably greater than or equal to 0.9 and less than or equal to 1. In addition, with an ALD method, the oxide 230*c* on the side surface and the top surface of the oxide 230*b* of the channel formation region can have a uniform thickness. For example, the ratio of the oxide 230*c* on the side surface of the oxide 230*b* of the channel formation region to the thickness of the oxide 230*c* on the top surface of the oxide 230*b* of the channel formation region can be greater than or equal to 0.5 and less than or equal to 1, preferably greater than or equal to 0.7 and less than or equal to 1, more preferably greater than or equal to 0.9 and less than or equal to 1. When the oxide 230*c* formed by an ALD method has a crystal structure, the c-axis thereof can be substantially parallel to the normal direction of the side surface of the opening or the deposition surface such as the side surface of the oxide 230*b*.

As illustrated in FIG. 8(C), in the channel width direction of the transistor 200, with reference to the bottom surface of the insulator 224, the level of the bottom surface of the conductor 260 in a region where the conductor 260 and the oxide 230*b* do not overlap with each other is preferably lower than the level of the bottom surface of the oxide 230*b*. A difference between the level of the bottom surface of the conductor 260 in a region where the oxide 230*b* does not overlap with the conductor 260 and the level of the bottom surface of the oxide 230*b* is set to greater than or equal to 0 nm and less than or equal to 100 nm, preferably greater than or equal to 3 nm and less than or equal to 50 nm, and more preferably greater than or equal to 5 nm and less than or equal to 20 nm.

As described above, the conductor 260, which functions as the gate electrode, covers the side surface and the top surface of the oxide 230*b* of the channel formation region, with the oxide 230*c* and the insulator 250 positioned therebetween; this enables the electrical field of the conductor 260 to easily affect the entire oxide 230*b* of the channel formation region. Thus, the on-state current of the transistor 200 can be increased and the frequency characteristics of the transistor 200 can be improved.

Thus, a semiconductor device having favorable electrical characteristics can be provided. According to one embodiment of the present invention, a highly reliable semiconductor device can be provided. According to one embodiment of the present invention, a semiconductor device that can be miniaturized or highly integrated can be provided. According to one embodiment of the present invention, a semiconductor device with high on-state current can be provided. According to one embodiment of the present invention, a semiconductor device with excellent frequency characteristics can be provided. According to one embodiment of the present invention, a semiconductor device with high productivity can be provided.

The detailed structure of the semiconductor device including the transistor 200 of one embodiment of the present invention will be described below.

The insulator 214 preferably functions as an insulating barrier film that inhibits diffusion of impurities such as water and hydrogen from the substrate side into the transistor 200. Accordingly, for the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use an insulating material having a function of inhibiting diffusion of oxygen (e.g., at least one of an oxygen atom, an oxygen molecule, and the like).

For example, aluminum oxide, silicon nitride, or the like is preferably used for the insulator 214. Accordingly, impurities such as water and hydrogen can be inhibited from diffusing to the transistor 200 side from the substrate side through the insulator 214. Alternatively, oxygen contained in the insulator 224 and the like can be inhibited from diffusing into the substrate side through the insulator 214. Note that the insulator 214 may have a stacked-layer structure of aluminum oxide and silicon nitride.

In addition, the insulator 214 preferably has a low hydrogen concentration and has a function of inhibiting diffusion of hydrogen. When the hydrogen concentration of the insulator 214 becomes lower, impurities such as water and hydrogen can be further inhibited from diffusing to the transistor 200 side from the substrate side through the insulator 214. Specifically, the hydrogen concentration in the insulator 214, which is measured by secondary ion mass spectrometry (SIMS), is lower than $5\times10^{21}$ atoms/$cm^3$, preferably lower than $5\times10^{20}$ atoms/$cm^3$, more preferably lower than $1\times10^{20}$ atoms/$cm^3$. For example, silicon nitride deposited by a sputtering method is preferably used as the insulator 214.

The insulator 216, the insulator 280, and the insulator 281 preferably have a lower permittivity than the insulator 214. When a material with a low permittivity is used for an interlayer film, the parasitic capacitance generated between wirings can be reduced. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate for the insulator 216, the insulator 280, and the insulator 281.

The insulator 216 preferably includes a region that has a low hydrogen concentration and contains oxygen in excess of that in the stoichiometric composition (hereinafter also referred to as an excess-oxygen region), or preferably contains excess oxygen. Thus, entry of hydrogen into the oxide 230 can be inhibited; alternatively, oxygen can be supplied to the oxide 230 to reduce oxygen vacancies in the oxide 230.

In the insulator having a low hydrogen concentration and an excess-oxygen region or excess oxygen, specifically, the hydrogen concentration measured by SIMS is set to lower than $5\times10^{20}$ atoms/cm$^3$, preferably lower than $1\times10^{20}$ atoms/cm$^3$, more preferably lower than $5\times10^{19}$ atoms/cm$^3$. In addition, the amount of released oxygen converted into oxygen molecules is greater than or equal to $2.0\times10^{14}$ molecules/cm$^2$, preferably greater than or equal to $1.0\times10^{15}$ molecules/cm$^2$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 500° C. As the insulator, silicon oxide formed by a sputtering method can be used, for example.

Note that the insulator 216 may have a stacked-layer structure. For example, in the insulator 216, an insulator similar to the insulator 214 may be provided at least in a portion in contact with a side surface of the conductor 205. With such a structure, oxidization of the conductor 205 due to oxygen contained in the insulator 216 can be inhibited. Alternatively, reduction in the amount of oxygen contained in the insulator 216 due to the conductor 205 can be inhibited.

The conductor 205 is positioned to overlap with the oxide 230 and the conductor 260. Furthermore, the conductor 205 is preferably provided to be embedded in the insulator 214 or the insulator 216. Here, the top surface of the conductor 205 is preferably made flat. For example, the average surface roughness (Ra) of the top surface of the conductor 205 is less than or equal to 1 nm, preferably less than or equal to 0.5 nm, more preferably less than or equal to 0.3 nm. This achieves favorable planarity of the insulator 224 formed over the conductor 205 and the increase in crystallinity of the oxide 230*a*, the oxide 230*b*, and the oxide 230*c*.

As illustrated in FIG. 8(A), the size of the conductor 205 is preferably larger than the size of the region of the oxide 230*b* that does not overlap with the conductor 242*a* or the conductor 242*b*. As illustrated in FIG. 8(C), it is particularly preferable that the conductor 205 also extend to a region outside an end portion of the oxide 230*b* that intersects with the channel width direction. That is, the conductor 205 and the conductor 260 preferably overlap with each other with the insulators therebetween outside the side surface of the oxide 230*b* in the channel width direction. A large conductor 205 can sometimes reduce local charging, (referred to as charge up) in a treatment using plasma of a fabrication step after the formation of the conductor 205. Note that one embodiment of the present invention is not limited thereto. The conductor 205 overlaps at least with the oxide 230 positioned between the conductor 242*a* and the conductor 242*b*.

As illustrated in FIG. 8(C), the conductor 205 is extended to function as a wiring. However, without limitation to this structure, a structure where a conductor functioning as a wiring is provided below the conductor 205 may be employed. In addition, the conductor 205 does not necessarily have to be provided in each transistor. For example, the conductor 205 may be shared by a plurality of transistors.

Although the transistor 200 having a structure in which the first conductor of the conductor 205 and the second conductor of the conductor 205 are stacked is illustrated, the present invention is not limited thereto. For example, the conductor 205 may have a single-layer structure or a stacked-layer structure of three or more layers.

Here, for the first conductor of the conductor 205, a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom is preferably used. Alternatively, it is preferable to use a conductive material having a function of inhibiting diffusion of oxygen (e.g., at least one of an oxygen atom, an oxygen molecule, and the like). Note that in this specification, a function of inhibiting diffusion of impurities or oxygen means a function of inhibiting diffusion of any one or all of the impurities and the oxygen.

When a conductive material having a function of inhibiting oxygen diffusion is used for the first conductor of the conductor 205, a reduction in the conductivity of the second conductor of the conductor 205 due to oxidation can be inhibited. As a conductive material having a function of inhibiting diffusion of oxygen, for example, tantalum, tantalum nitride, ruthenium, or ruthenium oxide is preferably used. Accordingly, the first conductor of the conductor 205 is a single layer or stacked layers of the above conductive materials. For example, the first conductor of the conductor 205 may be a stack of tantalum, tantalum nitride, ruthenium, or ruthenium oxide and titanium or titanium nitride.

A conductive material containing tungsten, copper, or aluminum as its main component is preferably used for the second conductor of the conductor 205. Note that the second conductor of the conductor 205 is a single layer in the drawing but may have a stacked-layer structure, for example, a stacked-layer structure of the above conductive material and titanium or titanium nitride.

Furthermore, a structure in which three layers (the first conductor of the conductor 205, the second conductor of the conductor 205 and a third conductor of the conductor 205) are stacked may be employed for the conductor 205. For example, after the first conductor of the conductor 205 and the second conductor of the conductor 205 are formed, part of the second conductor of the conductor 205 may be removed to form a groove in the second conductor of the conductor 205, and the third conductor of the conductor 205 may be embedded in the groove. Thus, the conductor 205 the top surface of which is flat can be formed. The improvement in planarity of the top surfaces of the insulator 216 and the conductor 205 can improve crystallinity of the oxide 230*a*, the oxide 230*b*, and the oxide 230*c*. Note that the third conductor of the conductor 205 is preferably formed using a material similar to that for the first conductor of the conductor 205 or the second conductor of the conductor 205.

The insulator 222 and the insulator 224 function as a gate insulator.

The insulator 222 preferably functions as an insulating barrier film that inhibits diffusion of impurities such as water and hydrogen into the transistor 200 from the substrate side. For example, the insulator 222 preferably has lower hydrogen permeability than the insulator 224. By surrounding the insulator 224, the oxide 230, and the like with the insulator 222 and the insulator 254, diffusion of impurities such as water and hydrogen into the insulator 224 and the oxide 230 from the outside can be inhibited.

It is preferable that the insulator 222 have a function of inhibiting diffusion of oxygen (e.g., at least one of an oxygen atom, an oxygen molecule, and the like). For example, the insulator 222 preferably has lower oxygen permeability than the insulator 224. The insulator 222 preferably has a function of inhibiting diffusion of oxygen and impurities, in which case diffusion of oxygen contained in the oxide 230 to the substrate side can be reduced. Furthermore, the conductor 205 can be inhibited from reacting with oxygen contained in the insulator 224 or the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 and diffusion of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. Silicon oxide, silicon oxynitride, or silicon nitride may be stacked over the insulator.

Alternatively, for example, a single layer or stacked layers of an insulator containing what is called a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) may be used for the insulator 222. With scaling-down and higher integration of transistors, a problem such as leakage current may arise because of a thinner gate insulator. When a high-k material is used for an insulator functioning as the gate insulator, a gate potential during operation of the transistor can be reduced while the physical thickness of the gate insulator is kept.

It is preferable that oxygen be released from the insulator 224 in contact with the oxide 230 by heating. Silicon oxide, silicon oxynitride, or the like is used as appropriate for the insulator 224, for example. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating is preferably used. An oxide from which oxygen is released by heating is, for example, an oxide film in which the amount of released oxygen converted into oxygen molecules is greater than or equal to $1.0\times10^{18}$ molecules/cm$^3$, preferably greater than or equal to $1.0\times10^{19}$ molecules/cm$^3$, more preferably greater than or equal to $2.0\times10^{19}$ molecules/cm$^3$ or greater than or equal to $3.0\times10^{20}$ molecules/cm$^3$ in TDS analysis. Note that the temperature of the film surface in the TDS analysis is preferably higher than or equal to 100° C. and lower than or equal to 700° C., or higher than or equal to 100° C. and lower than or equal to 400° C.

The insulator 224 preferably has a low hydrogen concentration and includes an excess-oxygen region or excess oxygen, and may be formed using a material similar to that for the insulator 216, for example.

Note that the insulator 222 and the insulator 224 may each have a stacked-layer structure of two or more layers. In that case, without limitation to a stacked-layer structure formed of the same material, a stacked-layer structure formed of different materials may be employed. For example, an insulator similar to the insulator 224 may be provided below the insulator 222.

A metal oxide functioning as an oxide semiconductor is preferably used as the oxide 230. For example, as the metal oxide, it is preferable to use a metal oxide having a bandgap of 2 eV or more, preferably 2.5 eV or more. With the use of a metal oxide having such a wide bandgap, the off-state current of the transistor can be reduced. With the use of such a transistor, a semiconductor device with low power consumption can be provided.

Note that the oxide 230 preferably has a stacked-layer structure of oxides that differ in the atomic ratio of metal atoms. Specifically, the atomic ratio of the element M to the constituent elements in the metal oxide used for the oxide **230*a* is preferably greater than the atomic ratio of the element M to the constituent elements in the metal oxide used for the oxide 230*b*. Moreover, the atomic ratio of the element M to In in the metal oxide used for the oxide 230*a* is preferably greater than the atomic ratio of the element M to In in the metal oxide used for the oxide 230*b*. Furthermore, the atomic ratio of In to the element M in the metal oxide used for the oxide 230*b* is preferably greater than the atomic ratio of In to the element M in the metal oxide used for the oxide 230*a*. A metal oxide that can be used for the oxide 230*a* or the oxide 230*b* can be used for the oxide 230*c***.

In the case where the oxide **230*c* has a stacked-layer structure, the oxide 230*c*1 preferably contains at least one of the metal elements contained in the metal oxide used as the oxide 230*b*, and further preferably contains all of these metal elements. For example, it is preferable that an In—Ga—Zn oxide be used as the oxide 230*c*1, and an In—Ga—Zn oxide, a Ga—Zn oxide, or gallium oxide be used as the oxide 230*c*2. Accordingly, the density of defect states at the interface between the oxide 230*b* and the oxide 230*c*1 can be decreased. The oxide 230*c*2 is preferably a metal oxide that inhibits diffusion or passage of oxygen, compared to the oxide 230*c*1. Providing the oxide 230*c*2 between the insulator 250 and the oxide 230*c*1 can inhibit diffusion of oxygen contained in the insulator 280 into the insulator 250. Therefore, the oxygen is more likely to be supplied to the oxide 230 through the oxide 230*c*1**.

The oxide **230*b* preferably has crystallinity. For example, a CAAC-OS (c-axis aligned crystalline oxide semiconductor) is preferably used. An oxide having crystallinity, such as a CAAC-OS, has a dense structure with small amounts of impurities and defects (oxygen vacancies or the like) and high crystallinity. This can inhibit oxygen extraction from the oxide 230*b* by the source electrode or the drain electrode. Therefore, oxygen extraction from the oxide 230*b* can be reduced even when heat treatment is performed; thus, the transistor 200** is stable with respect to high temperatures in a manufacturing process (what is called thermal budget).

In the case where the oxide **230*c* has a stacked-layer structure, it is preferable that the oxide 230*c*1 and the oxide 230*c*2 have crystallinity, and further preferable that the crystallinity of the oxide 230*c*2 be higher than that of the oxide 230*c*1. In particular, a CAAC-OS is preferably used as the oxide 230*c*1 and the oxide 230*c*2; the c-axes of crystals included in the oxide 230*c*1 and the oxide 230*c*2 are preferably aligned in a direction substantially perpendicular to the formation surfaces or the top surfaces of the oxide 230*c*1 and the oxide 230*c*2. The CAAC-OS has a property such that oxygen is less likely to be moved in the c-axis direction. Therefore, providing the oxide 230*c*2 between the oxide 230*c*1 and the insulator 250 can inhibit diffusion of oxygen contained in the oxide 230*c*1 into the insulator 250 and efficiently supply the oxygen to the oxide 230**.

The energy level of the conduction band minimum of each of the oxide **230*a* and the oxide 230*c* is preferably higher than the energy level of the conduction band minimum of the oxide 230***b*. In other words, the electron affinity of each of the oxide 230*a* and the oxide 230*c* is preferably smaller than the electron affinity of the oxide 230*b*.

Here, the energy level of the conduction band minimum gradually changes at junction portions of the oxide 230*a*, the oxide 230*b*, and the oxide 230*c*. In other words, the energy level of the conduction band minimum at the junction portions of the oxide 230*a*, the oxide 230*b*, and the oxide 230*c* continuously changes or is continuously connected. To obtain this, the density of defect states in a mixed layer formed at an interface between the oxide 230*a* and the oxide 230*b* and an interface between the oxide 230*b* and the oxide 230*c* is preferably made low.

In the case where the oxide 230*c* has a stacked-layer structure, the energy level of the conduction band minimum of the oxide 230*a* and the oxide 230*c* is preferably higher than the energy level of the conduction band minimum of the oxide 230*b* and the oxide 230*c*1. In other words, the electron affinity of each of the oxide 230*a* and the oxide 230*c*2 is preferably smaller than the electron affinity of each of the oxide 230*b* and the oxide 230*c*1.

When the oxide 230*a*, the oxide 230*b*, the oxide 230*c*1, and the oxide 230*c*2 have the above structure, the density of defect states at the interface between the oxide 230*a* and the oxide 230*b*, the interface between the oxide 230*b* and the oxide 230*c*1, and the interface between the oxide 230*c*1 and the oxide 230*c*2 can be made low. Thus, the influence of interface scattering on carrier conduction is small, and the transistor 200 can have high on-state current and high frequency characteristics.

Specifically, when the oxide 230*a* and the oxide 230*b* or the oxide 230*b* and the oxide 230*c* contain the same element (as a main component) in addition to oxygen, a mixed layer with a low density of defect states can be formed. For example, an In—Ga—Zn oxide, a Ga—Zn oxide, gallium oxide, or the like may be used for the oxide 230*a* and the oxide 230*c* in the case where the oxide 230*b* is an In—Ga—Zn oxide.

Specifically, as the oxide 230*a*, a metal oxide with In:Ga:Zn=1:3:4 [atomic ratio] or 1:1:0.5 [atomic ratio] is used. As the oxide 230*b*, a metal oxide with In:Ga:Zn=1:1:1 [atomic ratio], In:Ga:Zn=4:2:3 [atomic ratio], or In:Ga:Zn=3:1:2 [atomic ratio] is used. As the oxide 230*c*, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Specific examples of the oxide 230*c* having a stacked-layer structure include a stacked-layer structure of In:Ga:Zn=4:2:3 [atomic ratio] as the oxide 230*c*1 and In:Ga:Zn=1:3:4 [atomic ratio] as the oxide 230*c*2, a stacked-layer structure of In:Ga:Zn=4:2:3 [atomic ratio] as the oxide 230*c*1 and Ga:Zn=2:1 [atomic ratio] as the oxide 230*c*2, a stacked-layer structure of In:Ga:Zn=4:2:3 [atomic ratio] as the oxide 230*c*1 and Ga:Zn=2:5 [atomic ratio] as the oxide 230*c*2, and a stacked-layer structure of In:Ga:Zn=4:2:3 [atomic ratio] as the oxide 230*c*1 and gallium oxide as the oxide 230*c*2. Note that the above atomic ratios each refer to the atomic ratio in a sputtering target or the atomic ratio in the formed film.

At this time, the oxide 230*b* serves as a main carrier path. When the oxide 230*a* and the oxide 230*c* have the above structure, the density of defect states at the interface between the oxide 230*a* and the oxide 230*b* and the interface between the oxide 230*b* and the oxide 230*c* can be made low. Thus, the influence of interface scattering on carrier conduction is small, and the transistor 200 can have high on-state current and high frequency characteristics. Note that in the case where the oxide 230*c* has a stacked-layer structure, in addition to the reduction of density of defect states at the interface between the oxide 230*b* and the oxide 230*c*, the inhibition of diffusion of the constituent element of the oxide 230*c* to the insulator 250 side is expected. More specifically, since the oxide 230*c* has a stacked-layer structure in which an oxide that does not contain In or that has a reduced In concentration is positioned in the upper layer, diffusion of In to the insulator 250 side can be inhibited. Since the insulator 250 functions as a gate insulator, the transistor exhibits poor characteristics when In diffuses. Thus, when the oxide 230*c* has a stacked-layer structure, a highly reliable semiconductor device can be provided.

When the oxide 230*c* has a stacked-layer structure, a main carrier path may be the interface between the oxide 230*b* and the oxide 230*c*1 or its vicinity.

Since the oxide 230*c*1 is in contact with the side surface of the insulator 280, oxygen contained in the insulator 280 can be supplied to the channel formation region of the transistor 200 through the oxide 230*c*1. For the oxide 230*c*2, a material that is less likely to transmit oxygen is preferably used. With the use of the material, oxygen contained in the insulator 280 can be inhibited from passing through the oxide 230*c*2 and being absorbed by the insulator 250 or the conductor 260, and oxygen can be supplied to the channel formation region efficiently.

The conductor 242 (the conductor 242*a* and the conductor 242*b*) functioning as the source electrode and the drain electrode is provided over the oxide 230*b*. The thickness of the conductor 242 is greater than or equal to 1 nm and less than or equal to 50 nm, preferably greater than or equal to 2 nm and less than or equal to 25 nm, for example.

As the conductor 242, it is preferable to use tantalum nitride, titanium nitride, tungsten nitride, a nitride containing titanium and aluminum, a nitride containing tantalum and aluminum, ruthenium oxide, ruthenium nitride, an oxide containing strontium and ruthenium, an oxide containing lanthanum and nickel, or the like. These materials are preferable because they are conductive materials that are not easily oxidized or materials that maintain the conductivity even when absorbing oxygen.

Furthermore, an oxide may be provided between the oxide 230*b* and the conductor 242 (the conductor 242*a* and the conductor 242*b*). Thus, the conductor 242 is not in contact with the oxide 230, so that the conductor 242 can be inhibited from absorbing oxygen of the oxide 230. That is, preventing the oxidation of the conductor 242 can inhibit a decrease in conductivity of the conductor 242. Accordingly, the oxide preferably has a function of inhibiting the oxidation of the conductor 242.

The oxide preferably has conductivity. When the oxide that has conductivity is provided between the conductor 242 and the oxide 230*b*, the electrical resistance between the conductor 242 and the oxide 230*b* is reduced, which is preferable. Such a structure improves the electrical characteristics and reliability of the transistor 200. Note that the oxide may have a crystal structure.

As the oxide, an oxide containing zinc can be used. For example, zinc oxide, gallium zinc oxide, indium zinc oxide, indium gallium zinc oxide, or the like can be used. Alternatively, indium oxide, indium tin oxide, or the like may be used. The oxide is preferably an oxide containing a metal atom having a strong bond to an oxygen atom. The conductivity of the oxide is preferably higher than the conductivity of the oxide 230 (the oxide 230*a*, the oxide 230*b*, and the oxide 230*c*). The thickness of the oxide is preferably greater than or equal to 1 nm and less than or equal to 10 nm, more preferably greater than or equal to 1 nm and less than or equal to 5 nm. The oxide preferably has crystallinity. The oxide having crystallinity can inhibit release of oxygen from the oxide 230. When the oxide has a hexagonal crystal structure, for example, release of oxygen from the oxide 230 can sometimes be inhibited.

Like the insulator 214 and the like, the insulator 254 preferably functions as a barrier film that inhibits diffusion of impurities such as water and hydrogen into the transistor 200 from the insulator 280 side. The insulator 254 preferably has lower hydrogen permeability than the insulator 224, for example. Furthermore, as illustrated in FIG. 8(B), the insulator 254 is preferably in contact with the top surface and the side surface of the conductor 242*a*, the top surface and the side surface of the conductor 242*b*, the side surfaces of the oxide 230*a* and the oxide 230*b*, and part of the top surface of the insulator 224. With such a structure, the insulator 280 is isolated from the insulator 224, the oxide 230*a*, and the oxide 230*b* by the insulator 254. Accordingly, hydrogen contained in the insulator 280 can be inhibited from diffusing into the oxide 230*a* and the oxide 230*b*; hence, the transistor 200 can have favorable electrical characteristics and reliability.

It is also preferable that the insulator 254 have a function of inhibiting diffusion of oxygen (e.g., at least one of an oxygen atom, an oxygen molecule, and the like). For example, the insulator 254 preferably has lower oxygen permeability than the insulator 280 or the insulator 224.

The insulator 254 is preferably deposited by a sputtering method. When the insulator 254 is deposited by a sputtering method in an oxygen-containing atmosphere, oxygen can be added to the vicinity of a region of the insulator 224 that is in contact with the insulator 254. Accordingly, oxygen can be supplied from the region to the oxide 230 through the insulator 224. Here, with the insulator 254 having a function of inhibiting upward oxygen diffusion, oxygen can be prevented from diffusing from the oxide 230 into the insulator 280. Moreover, with the insulator 222 having a function of inhibiting downward oxygen diffusion, oxygen can be prevented from diffusing from the oxide 230 to the substrate side. In this manner, oxygen is supplied to the channel formation region of the oxide 230. Accordingly, oxygen vacancies in the oxide 230 can be reduced, so that the transistor can be inhibited from becoming normally on.

An insulator containing an oxide of one or both of aluminum and hafnium is preferably deposited as the insulator 254, for example. In this case, the insulator 254 is preferably deposited by an ALD method. An ALD method is a deposition method that provides good coverage, and thus can prevent formation of disconnection or the like due to unevenness of the insulator 254.

An insulator containing aluminum nitride may be used as the insulator 254, for example. It is preferable to use a nitride insulator that satisfies the composition formula $AlN_x$ (x is a real number greater than 0 and less than or equal to 2, preferably x is a real number greater than 0.5 and less than or equal to 1.5) as the insulator 254. Accordingly, a film having an excellent insulating property and high thermal conductivity can be obtained, and thus dissipation of heat generated in driving the transistor 200 can be increased. Alternatively, aluminum titanium nitride, titanium nitride, or the like can be used as the insulator 254. In that case, deposition by a sputtering method is preferable because deposition can be performed without using a highly oxidizing gas such as oxygen or ozone as a deposition gas. Alternatively, silicon nitride, silicon nitride oxide, or the like can be used.

Among insulating materials that have a function of inhibiting diffusion of hydrogen or oxygen, an insulating material that contains, as its main component, at least one of the metal elements contained in the metal oxide used as the oxide 230*b* is preferably used as the insulator 254. Thus, when part of the insulator 254 is removed, an impurity derived from the insulator 254 is not generated, so that attachment of the impurity to the region 234 of the oxide 230*b* can be prevented.

When an In-M-Zn oxide is used as the oxide 230*b*, for example, an oxide containing the element M, an M-Zn oxide, an In-M-Zn oxide, or the like can be used for the insulator 254. Note that when an In-M-Zn oxide is used for the insulator 254, the atomic ratio of the element M to indium is preferably large. For example, the atomic ratio is set to greater than or equal to 1. When the atomic ratio is increased, the insulating property of the oxide can be high.

The insulator 254 can have a multilayer structure of two or more layers. For example, the insulator 254 may have a two-layer structure in which the first layer is deposited by a sputtering method in an oxygen-containing atmosphere, after which the second layer is deposited by an ALD method. An ALD method is a deposition method providing good coverage, and thus can prevent formation of disconnection or the like due to unevenness of the first layer. Note that in the case of employing a multilayer structure of two or more layers, the insulator 254 may have a multilayer structure using different materials. For example, a stacked-layer structure of silicon oxide, silicon oxynitride, silicon nitride oxide, or silicon nitride and an insulator having a function of inhibiting the passage of oxygen and impurities such as hydrogen may be employed. As the insulator having a function of inhibiting the passage of oxygen and impurities such as hydrogen, an insulator containing an oxide of one or both of aluminum and hafnium can be used, for example.

The insulator 250 functions as a gate insulator. The insulator 250 is preferably positioned in contact with the top surface of the oxide 230*c*. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which are thermally stable, are preferable.

Like the insulator 224, the insulator 250 is preferably formed using an insulator from which oxygen is released by heating. When an insulator from which oxygen is released by heating is provided as the insulator 250 in contact with the top surface of the oxide 230*c*, oxygen can be efficiently supplied to the channel formation region of the oxide 230*b*. Furthermore, as in the insulator 224, the concentration of impurities such as water and hydrogen in the insulator 250 is preferably reduced. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 into the conductor 260. Provision of the metal oxide that inhibits diffusion of oxygen inhibits diffusion of oxygen from the insulator 250 to the conductor 260. That is, a reduction in the amount of excess oxygen supplied to the oxide 230 can be inhibited. In addition, oxidation of the conductor 260 due to oxygen from the insulator 250 can be inhibited.

Note that the metal oxide functions as part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Accordingly, a gate potential that is applied during operation of the transistor can be reduced while the physical thickness of the gate insulator is kept. In addition, the equivalent oxide thickness (EOT) of an insulator functioning as the gate insulator can be reduced.

The metal oxide may have a function of part of the first gate electrode. For example, an oxide semiconductor that can be used for the oxide 230 can be used as the metal oxide. In that case, when the conductor 260 is deposited by a sputtering method, the metal oxide can have a reduced electric resistance to be a conductor.

With the metal oxide, the on-state current of the transistor 200 can be increased without a reduction in the influence of electric fields from the conductor 260. Since the distance between the conductor 260 and the oxide 230 is kept by the physical thicknesses of the insulator 250 and the metal oxide, leakage current between the conductor 260 and the oxide 230 can be reduced. Moreover, when the stacked-layer structure of the insulator 250 and the metal oxide is provided, the physical distance between the conductor 260 and the oxide 230 and the intensity of electric fields applied to the oxide 230 from the conductor 260 can be easily adjusted as appropriate.

Specifically, a metal oxide containing one kind or two or more kinds selected from hafnium, aluminum, gallium, yttrium, zirconium, tungsten, titanium, tantalum, nickel, germanium, magnesium, and the like can be used. In particular, an insulator containing an oxide of one or both of aluminum and hafnium is preferably used. Furthermore, the oxide semiconductor that can be used for the oxide 230 can also be used for the metal oxide when the resistance thereof is reduced.

Although the conductor 260 has a two-layer structure of the conductor 260*a* and the conductor 260*b* in FIG. 8, the conductor 260 may have a single-layer structure or a stacked-layer structure of three or more layers.

Here, for the conductor 260*a*, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

When the conductor 260*a* has a function of inhibiting diffusion of oxygen, it is possible to prevent a reduction in conductivity of the conductor 260*b* due to oxidation of the conductor 260*b* caused by oxygen contained in the insulator 250. As a conductive material having a function of inhibiting diffusion of oxygen, for example, tantalum, tantalum nitride, ruthenium, or ruthenium oxide is preferably used.

As the conductor 260 also functioning as a wiring, a conductor having high conductivity is preferably used. For example, a conductive material containing tungsten, copper, or aluminum as its main component can be used for the conductor 260*b*. In addition, the conductor 260*b* may have a stacked-layer structure, for example, a stacked-layer structure of any of the above conductive materials and titanium or titanium nitride.

For example, the insulator 280 preferably includes silicon oxide, silicon oxynitride, silicon nitride oxide, silicon oxide to which fluorine is added, silicon oxide to which carbon is added, silicon oxide to which carbon and nitrogen are added, porous silicon oxide, or the like. In particular, silicon oxide and silicon oxynitride, which are thermally stable, are preferable. Materials such as silicon oxide, silicon oxynitride, and porous silicon oxide, in each of which a region containing oxygen that is released by heating can be easily formed, are particularly preferable. In order to supply oxygen contained in the insulator 280 to the oxide 230*b* through the oxide 230*c* (the oxide 230*c*1 in the case where the oxide 230*c* has a stacked-layer structure), it is preferable that the insulator 280 contain a larger amount of oxygen, for example, contain more oxygen than that in the stoichiometric composition. To increase the concentration of oxygen contained in the insulator 280, a deposition gas used for forming the insulator 280 preferably contains oxygen.

The concentration of impurities such as water and hydrogen in the insulator 280 is preferably reduced. The insulator 280 may have a stacked-layer structure of two or more layers. A top surface of the insulator 280 may be planarized. Moreover, the insulator 280 preferably has a low hydrogen concentration and includes an excess-oxygen region or excess oxygen, and may be formed using a material similar to that for the insulator 216, for example.

Note that although the insulator 280 has a two-layer structure of the insulator 280*a* and the insulator 280*b* in FIG. 8, the insulator 280 may have a single-layer structure or a stacked-layer structure of three or more layers.

The insulator 280*a* is provided in contact with part of the top surface of the insulator 224, the side surfaces of the oxide 230*a* and the oxide 230*b*, the side surface of the conductor 242*a*, the top surface of the conductor 242*a*, the side surface of the conductor 242*b*, and the top surface of the conductor 242*b*.

For example, an insulating material including an excess-oxygen region or an insulating material in which an excess-oxygen region is easily formed is preferably used for the insulator 280*a* and the insulator 280*b*. Specifically, silicon oxide formed by a sputtering method is used as the insulator 280*a*, and silicon oxynitride formed by a CVD method is used as the insulator 280*b*. The thickness of the insulator 280*a* is preferably greater than or equal to 30 nm and less than or equal to 100 nm, more preferably greater than or equal to 40 nm and less than or equal to 80 nm. A structure in which such two layers are stacked can improve the coverage with the insulator 280.

For example, it is preferred that an insulating material including an excess-oxygen region or an insulating material in which an excess-oxygen region is likely to be formed be used for the insulator 280*a*, and an insulating material that is likely to form an excess-oxygen region in the film on which the material is formed be used for the insulator 280*b*. Specifically, silicon oxide deposited by a sputtering method is used as the insulator 280*a*, and aluminum oxide deposited by a sputtering method is used as the insulator 280*b*. The structure in which such two layers are stacked can efficiently supply excess oxygen contained in the insulator 280*a* to the oxide 230.

Like the insulator 214 and the like, the insulator 274 preferably functions as an insulating barrier film that inhibits diffusion of impurities such as water and hydrogen into the insulator 280 from above. In addition, the insulator 274 preferably has a low hydrogen concentration and has a function of inhibiting diffusion of hydrogen. As the insulator 274, for example, an insulator that can be used as the insulator 214, the insulator 254, and the like can be used.

The insulator 281 functioning as an interlayer film is preferably provided over the insulator 274. As in the insulator 224 and the like, the concentration of impurities such as water and hydrogen in the insulator 281 is preferably reduced.

The conductor 240*a* and the conductor 240*b* are placed in the openings formed in the insulator 281, the insulator 274, the insulator 280, and the insulator 254. The conductor 240*a* and the conductor 240*b* are placed to face each other with the conductor 260 interposed therebetween. Note that the level of the top surfaces of the conductor 240*a* and the conductor 240*b* may be on the same surface as the top surface of the insulator 281.

Note that the insulator 241*a* is provided in contact with a side wall of the opening in the insulator 281, the insulator 274, the insulator 280, and the insulator 254, and the first conductor of the conductor 240*a* is formed in contact with a side surface of the insulator 241*a*. The conductor 242*a* is located on at least part of the bottom portion of the opening, and thus the conductor 240*a* is in contact with the conductor 242*a*. Similarly, the insulator 241*b* is provided in contact with a side wall of the opening in the insulator 281, the insulator 274, the insulator 280, and the insulator 254, and the first conductor of the conductor 240*b* is formed in contact with a side surface of the insulator 241*b*. The conductor 242*b* is located on at least part of the bottom portion of the opening, and thus the conductor 240*b* is in contact with the conductor 242*b*.

For the conductor 240 (the conductor 240*a* and the conductor 240*b*), a conductive material containing tungsten, copper, or aluminum as its main component is preferably used. The conductor 240 may have a stacked-layer structure.

In the case where the conductor 240 has a stacked-layer structure, a conductive material having a function of inhibiting passage of impurities such as water and hydrogen is preferably used for a conductor that is in contact with the conductor 242 and in contact with the insulator 254, the insulator 280, the insulator 274, and the insulator 281 with the insulator 241 therebetween. For example, tantalum, tantalum nitride, titanium, titanium nitride, ruthenium, ruthenium oxide, or the like is preferably used. The conductive material having a function of inhibiting the passage of impurities such as water and hydrogen may be used as a single layer or stacked layers. The use of the conductive material can prevent oxygen added to the insulator 280 from being absorbed by the conductor 240. Moreover, impurities such as water and hydrogen contained in a layer above the insulator 281 can be inhibited from diffusing into the oxide 230 through the conductor 240.

An insulator that can be used as the insulator 254 and the like is used as the insulator 241 (the insulator 241*a* and the insulator 241*b*), for example. Since the insulator 241 is provided in contact with the insulator 254, impurities such as water and hydrogen contained in the insulator 280 and the like can be inhibited from diffusing into the oxide 230 through the conductor 240. Thus, oxygen contained in the insulator 280 can be prevented from being absorbed by the conductor 240. Note that the insulator 241 can be formed by an ALD method or a CVD method.

Although not illustrated, a conductor functioning as a wiring may be placed in contact with the top surface of the conductor 240. The conductor is preferably formed using a conductive material containing tungsten, copper, or aluminum as its main component. The conductor may have a stacked-layer structure, for example, a stacked layer of any of the above conductive materials and titanium or titanium nitride. Note that the conductor may be formed to be embedded in an opening provided in an insulator.

In addition, although not illustrated, an insulator having resistivity higher than or equal 10 to $1.0\times10^{12}$ Ωcm and lower than or equal to $1.0\times10^{15}$ Ωcm, preferably higher than or equal to $5.0\times10^{12}$ Ωcm and lower than or equal to $1.0\times10^{14}$ Ωcm, more preferably higher than or equal to $1.0\times10^{13}$ Ωcm and lower than or equal to $5.0\times10^{13}$ Ωcm is preferably provided to cover the conductor. It is preferable that an insulator having the above resistivity be provided over the conductor, in which case the insulator can disperse electric charge accumulated in the transistor 200 or between wirings of the conductor or the like and can inhibit poor characteristics and electrostatic breakdown of the transistor and a semiconductor device including the transistor due to the electric charge, while maintaining the insulating property. For such an insulator, silicon nitride or silicon nitride oxide can be used.

<Constituent Material of Semiconductor Device>

Constituent materials that can be used for the semiconductor device will be described below.

<<Substrate>>

As a substrate over which the transistor 200 is formed, an insulator substrate, a semiconductor substrate, or a conductor substrate may be used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon, germanium, or the like as the material, and a compound semiconductor substrate including silicon carbide, silicon germanium, gallium arsenide, indium phosphide, zinc oxide, or gallium oxide. Moreover, a semiconductor substrate in which an insulator region is included in the above semiconductor substrate, e.g., an SOI (Silicon On Insulator) substrate or the like is used. Examples of the conductor substrate include a graphite substrate, a metal substrate, an alloy substrate, and a conductive resin substrate. A substrate including a metal nitride, a substrate including a metal oxide, or the like is used. Moreover, an insulator substrate provided with a conductor or a semiconductor, a semiconductor substrate provided with a conductor or an insulator, a conductor substrate provided with a semiconductor or an insulator, or the like is used. Alternatively, any of these substrates provided with an element may be used. Examples of the element provided for the substrate include a capacitor, a resistor, a switching element, a light-emitting element, and a memory element.

<<Insulator>>

Examples of an insulator include an oxide, a nitride, an oxynitride, a nitride oxide, a metal oxide, a metal oxynitride, and a metal nitride oxide, each of which has an insulating property.

With miniaturization and high integration of a transistor, a problem such as leakage current may arise because of a thinner gate insulator. When a high-k material is used for an insulator functioning as the gate insulator, a voltage during operation of the transistor can be reduced while the physical thickness of the gate insulator is kept. By contrast, when a material with a low relative permittivity is used for the insulator functioning as an interlayer film, the parasitic capacitance generated between wirings can be reduced. Accordingly, a material is preferably selected depending on the function of an insulator.

Examples of the insulator having a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting passage of oxygen and impurities such as hydrogen (e.g., the insulator 214, the insulator 222, the insulator 254, the insulator 274, and the like), the electrical characteristics of the transistor can be stable. As the insulator having a function of inhibiting passage of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, for the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; a metal nitride such as aluminum nitride, aluminum titanium nitride, titanium nitride, silicon nitride oxide or silicon nitride; or the like can be used.

In addition, the insulator functioning as the gate insulator is preferably an insulator including a region containing oxygen that is released by heating. When a structure is employed in which silicon oxide or silicon oxynitride including a region containing oxygen that is released by heating is in contact with the oxide 230, oxygen vacancies included in the oxide 230 can be compensated for.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electrical conductivity, typified by polycrystalline silicon containing an impurity element such as phosphorus, or silicide such as nickel silicide may be used.

Furthermore, a stack including a plurality of conductive layers formed with the above materials may be used. For example, a stacked-layer structure combining a material containing the above metal element and a conductive material containing oxygen may be employed. Furthermore, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably employed for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which a channel is formed. Furthermore, a conductive material containing the above metal element and nitrogen may be used. For example, a conductive material containing nitrogen, such as titanium nitride or tantalum nitride, may be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen included in the metal oxide in which a channel is formed can be trapped in some cases. Alternatively, hydrogen mixed from an external insulator or the like can be trapped in some cases.

<Manufacturing Method of Semiconductor Device>

Next, a method for manufacturing a semiconductor device including the transistor 200 of one embodiment of the present invention, which is illustrated in FIG. 8, will be described with reference to FIG. 10 to FIG. 17.

In FIG. 10 to FIG. 17, (A) of each drawing is a top view. Moreover, (B) of each drawing is a cross-sectional view corresponding to a portion indicated by a dashed-dotted line A1-A2 in (A), and is also a cross-sectional view of the transistor 200 in the channel length direction. Furthermore, (C) of each drawing is a cross-sectional view corresponding to a portion indicated by a dashed-dotted line A3-A4 in (A), and is also a cross-sectional view of the transistor 200 in the channel width direction. Note that for simplification of the drawings, some components are not illustrated in the top view of (A) of each drawing.

First, a substrate (not illustrated) is prepared, and the insulator 214 is deposited over the substrate. The insulator 214 can be deposited by a sputtering method, a chemical vapor deposition (CVD) method, a molecular beam epitaxy (MBE) method, a pulsed laser deposition (PLD) method, an ALD method, or the like.

Note that CVD methods can be classified into a plasma CVD (PECVD: Plasma Enhanced CVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object. For example, a wiring, an electrode, an element (e.g., transistor or capacitor), or the like included in a semiconductor device might be charged up by receiving charges from plasma. In this case, accumulated charges might break the wiring, electrode, element, or the like included in the semiconductor device. By contrast, in the case of a thermal CVD method that does not use plasma, such plasma damage is not caused and the yield of the semiconductor device can be increased. Furthermore, a thermal CVD method does not cause plasma damage during deposition, so that a film with few defects can be obtained.

Unlike a deposition method in which particles ejected from a target or the like are deposited, a CVD method is a deposition method in which a film is formed by reaction at a surface of an object. Thus, a CVD method is a deposition method that enables favorable step coverage almost regardless of the shape of an object.

A CVD method enables control of the composition of a film to be obtained with a flow rate ratio of source gases. By a CVD method, for example, a film with a certain composition can be deposited depending on the flow rate ratio of the source gases. Moreover, by a CVD method, by changing the flow rate ratio of the source gases during the deposition, a film in which the composition is continuously changed can be deposited. In the case of depositing while changing the flow rate ratio of the source gases, as compared with the case of depositing with the use of a plurality of deposition chambers, time taken for the deposition can be shortened because time taken for transfer and pressure adjustment is omitted. Thus, productivity of semiconductor devices can be improved in some cases.

In this embodiment, for the insulator 214, aluminum oxide or silicon nitride is formed by a sputtering method. In addition, the insulator 214 may have a multilayer structure. For example, a structure may be employed in which aluminum oxide is deposited by a sputtering method and aluminum oxide is deposited over the aluminum oxide by an ALD method. Alternatively, a structure may be employed in which aluminum oxide is deposited by an ALD method and aluminum oxide is deposited over the aluminum oxide by a sputtering method.

Next, the insulator 216 is deposited over the insulator 214. The insulator 216 can be deposited by a sputtering method, a CVD method, an MBE method, a PLD method, an ALD method, or the like. In this embodiment, for the insulating film to be the insulator 216, silicon oxide is deposited by a CVD method.

Then, an opening reaching the insulator 214 is formed in the insulator 216. Examples of the opening include a groove and a slit. A region where the opening is formed may be referred to as an opening portion. Wet etching can be used for the formation of the opening; however, dry etching is preferably used for microfabrication. As the insulator 214, it is preferable to select an insulator that functions as an etching stopper film used in forming the groove by etching the insulator 216. For example, in the case where a silicon oxide film is used as the insulator 216 in which the groove is to be formed, a silicon nitride film, an aluminum oxide film, or a hafnium oxide film is preferably used as the insulator 214.

As a dry etching apparatus, a capacitively coupled plasma (CCP) etching apparatus including parallel plate type electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

After the formation of the opening, a conductive film to be the first conductor of the conductor 205 is deposited. The conductive film desirably includes a conductor that has a function of inhibiting oxygen passage. For example, tantalum nitride, tungsten nitride, or titanium nitride can be used. Alternatively, a stacked-layer film of the conductor having a function of inhibiting passage of oxygen and tantalum, tungsten, titanium, molybdenum, aluminum, copper, or a molybdenum-tungsten alloy can be used. The conductive film to be the first conductor of the conductor 205 can be deposited by a sputtering method, a CVD method, an MBE method, a PLD method, an ALD method, or the like.

In this embodiment, as the conductive film to be the first conductor of the conductor 205, a tantalum nitride film or a film in which titanium nitride is stacked over tantalum nitride is formed by a sputtering method. With the use of a metal nitride as the first conductor of the conductor 205, even when a metal that easily diffuses, such as copper, is used for the second conductor of the conductor 205 described later, the metal can be prevented from diffusing outward through the first conductor of the conductor 205.

Next, a conductive film to be the second conductor of the conductor 205 is deposited over the conductive film to be the first conductor of the conductor 205. The conductive film can be formed by a plating method, a sputtering method, a CVD method, an MBE method, a PLD method, an ALD method, or the like. In this embodiment, tungsten is deposited for the conductive film to be the second conductor of the conductor 205.

Next, CMP (Chemical Mechanical Polishing) treatment is performed to partly remove the conductive film to be the first conductor of the conductor 205 and the conductive film to be the second conductor of the conductor 205 to expose the insulator 216. As a result, the conductive film to be the first conductor of the conductor 205 and the conductive film to be the second conductor of the conductor 205 remain only in the opening portion. Thus, the conductor 205 including the first conductor of the conductor 205 and the second conductor of the conductor 205, which has a flat top surface, can be formed (see FIG. 10). Note that the insulator 216 is partly removed by the CMP treatment in some cases.

Note that after the conductor 205 is formed, part of the second conductor of the conductor 205 may be removed, a conductive film may be deposited over the conductor 205 and the insulator 216, and CMP treatment may be performed. By the CMP treatment, part of the conductive film is removed to expose the insulator 216. Note that part of the second conductor of the conductor 205 is preferably removed by a dry etching method or the like. The conductive film is preferably formed using a material similar to that for the first conductor of the conductor 205 or the second conductor of the conductor 205.

Through the above steps, the conductor 205 including the conductive film, which has a flat top surface, can be formed. The improvement in planarity of the top surfaces of the insulator 216 and the conductor 205 results in improved crystallinity of the CAAC-OS that forms the oxide 230*b* and the oxide 230*c*.

Here, a method for forming the conductor 205 which is different from the above is described below.

Next, the conductive film to be the conductor 205 is deposited over the insulator 214. The conductive film can be deposited by a sputtering method, a CVD method, an MBE method, a PLD method, an ALD method, or the like. In addition, the conductive film can be a multilayer film. In this embodiment, tungsten is deposited for the conductive film.

Next, the conductive film is processed by a lithography method, so that the conductor 205 is formed.

In the lithography method, first, a resist is exposed to light through a mask. Next, a region exposed to light is removed or left using a developing solution, so that a resist mask is formed. Then, etching treatment through the resist mask is conducted, whereby a conductor, a semiconductor, an insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask is not necessary in the case of using an electron beam or an ion beam. Note that the resist mask can be removed by dry etching treatment such as ashing, wet etching treatment, wet etching treatment after dry etching treatment, or dry etching treatment after wet etching treatment.

A hard mask formed of an insulator or a conductor may be used instead of the resist mask. In the case where a hard mask is used, a hard mask with a desired shape can be formed by forming an insulating film or a conductive film to be a hard mask material over the conductive film to be the conductor 205, forming a resist mask thereover, and then etching the hard mask material. The etching of the conductive film to be the conductor 205 may be performed after removal of the resist mask or with the resist mask remaining. In the latter case, the resist mask sometimes disappears during the etching. The hard mask may be removed by etching after the etching of the conductive film to be the conductor 205. The hard mask does not need to be removed in the case where the material of the hard mask does not affect the following process or can be utilized in the following process.

Next, the insulating film to be the insulator 216 is deposited over the insulator 214 and the conductor 205. The insulating film is formed to be in contact with the top surface and side surface of the conductor 205. The insulating film can be deposited by a sputtering method, a CVD method, an MBE method, a PLD method, an ALD method, or the like.

Here, the thickness of the insulating film to be the insulator 216 is preferably greater than or equal to the thickness of the conductor 205. For example, when the thickness of the conductor 205 is 1, the thickness of the insulating film to be the insulator 216 is greater than or equal to 1 and less than or equal to 3.

Next, CMP treatment is performed on the insulating film to be the insulator 216, so that part of the insulating film to be the insulator 216 is removed and a surface of the conductor 205 is exposed. Thus, the conductor 205 and the insulator 216 in contact with the side surface of the conductor 205, each of which has a flat top surface, can be formed. The above is another method for forming the conductor 205.

Next, the insulator 222 is deposited over the insulator 216 and the conductor 205. An insulator containing an oxide of one or both of aluminum and hafnium is preferably deposited as the insulator 222. The insulator containing an oxide of one or both of aluminum and hafnium has a barrier property against oxygen, hydrogen, and water. When the insulator 222 has a barrier property against hydrogen and water, hydrogen and water contained in structure bodies provided around the transistor 200 are inhibited from diffusing into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like. In this embodiment, hafnium oxide or aluminum oxide is deposited as the insulator 222 by an ALD method.

Next, heat treatment is preferably performed. The heat treatment may be performed at a temperature higher than or equal to 250° C. and lower than or equal to 650° C., preferably higher than or equal to 300° C. and lower than or equal to 500° C., more preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. Alternatively, the heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

In this embodiment, the heat treatment is performed in such a manner that treatment is performed at 400° C. in a nitrogen atmosphere for one hour after the formation of the insulator 222, and then another treatment is successively performed at 400° C. in an oxygen atmosphere for one hour. By the heat treatment, impurities such as water and hydrogen contained in the insulator 222 can be removed, for example. The heat treatment can also be performed after the deposition of the insulator 224, for example.

Next, the insulator 224 is deposited over the insulator 222. The insulator 224 can be deposited by a sputtering method, a CVD method, an MBE method, a PLD method, an ALD method, or the like. In this embodiment, for the insulator 224, silicon oxide is deposited by a CVD method.

Here, plasma treatment containing oxygen may be performed under reduced pressure so that an excess-oxygen region can be formed in the insulator 224. The plasma treatment containing oxygen is preferably performed using an apparatus including a power source for generating high-density plasma using microwaves, for example. Alternatively, a power source for applying an RF (Radio Frequency) to a substrate side may be included. The use of high-density plasma enables high-density oxygen radicals to be produced, and RF application to the substrate side allows the oxygen radicals generated by the high-density plasma to be efficiently introduced into the insulator 224. Alternatively, after plasma treatment containing an inert gas is performed with this apparatus, plasma treatment containing oxygen may be performed to compensate for released oxygen. Note that impurities such as water and hydrogen included in the insulator 224 can be removed by selecting the conditions for the plasma treatment appropriately. In that case, the heat treatment is not necessarily performed.

Here, aluminum oxide may be deposited over the insulator 224 by a sputtering method and the aluminum oxide may be subjected to CMP treatment until the insulator 224 is reached. The CMP treatment can planarize and smooth the surface of the insulator 224. When the CMP treatment is performed on the aluminum oxide placed over the insulator 224, it is easy to detect the endpoint of the CMP treatment. Although part of the insulator 224 is polished by the CMP treatment and the thickness of the insulator 224 is reduced in some cases, the thickness is adjusted when the insulator 224 is formed. Planarizing and smoothing the surface of the insulator 224 can prevent deterioration of the coverage with an oxide deposited later and prevent a decrease in the yield of the semiconductor device in some cases. The deposition of aluminum oxide over the insulator 224 by a sputtering method is preferred because oxygen can be added to the insulator 224.

Figure 10A:
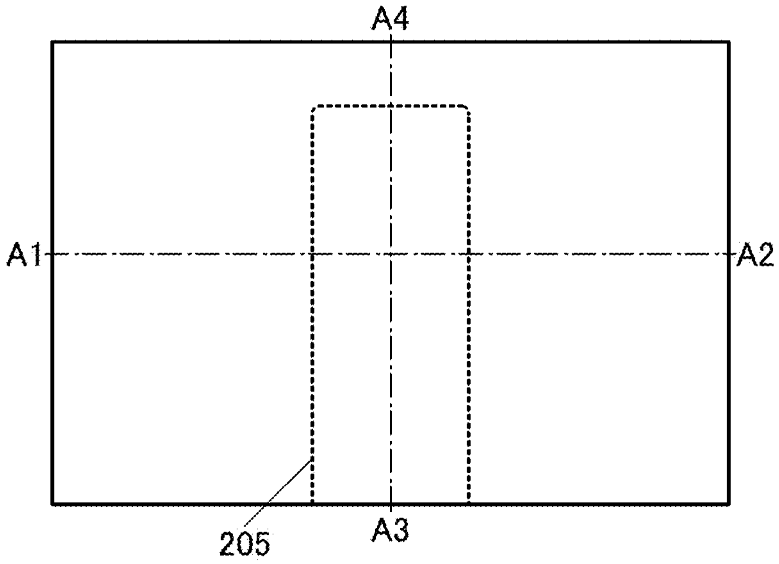
FIGS. 10A to 10C A top view and cross-sectional views illustrating a method for manufacturing a semiconductor device of one embodiment of the present invention.
Figure 10C:
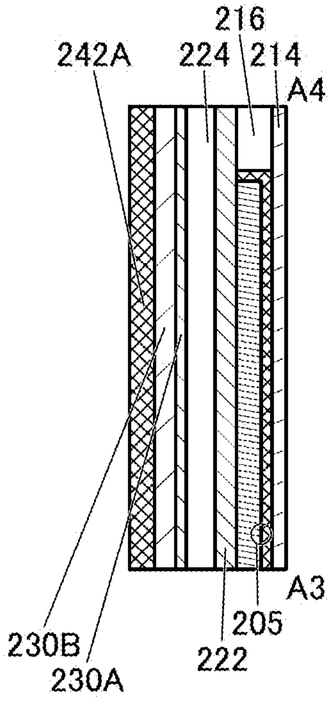
Figure 10B:
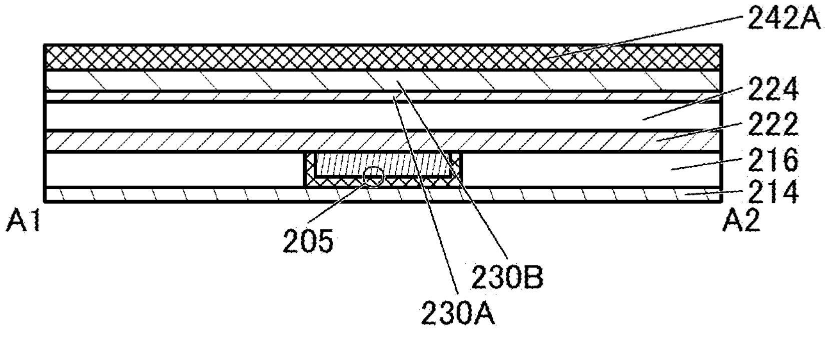

Next, an oxide film 230A and an oxide film 230B are deposited in this order over the insulator 224 (see FIG. 10). Note that it is preferable to deposit the oxide film 230A and the oxide film 230B successively without exposure to the air. By the deposition without exposure to the air, impurities or moisture from the atmospheric environment can be prevented from being attached onto the oxide film 230A and the oxide film 230B, so that the vicinity of the interface between the oxide film 230A and the oxide film 230B can be kept clean.

The oxide film 230A and the oxide film 230B can be formed by a sputtering method, a CVD method, an MBE method, a PLD method, an ALD method, or the like. In the case where the oxide film 230A and the oxide film 230B are formed by an ALD method, the description in the above embodiment can be referred to.

For example, in the case where In—Ga—Zn oxide films are formed as the oxide film 230A and the oxide film 230B by an ALD method, trimethylindium, tris(2,2,6,6-tetramethyl-3,5-heptanedione acid)indium, cyclopentadienylindium, or the like is used as the precursor of indium. In addition, as the precursor of gallium, trimethylgallium, triethylgallium, gallium trichloride, tris(dimethylamide)gallium, gallium(III) acetylacetonate, tris(2,2,6,6-tetramethyl-3,5-heptanedione acid)gallium, dimethylchlorogallium, diethylchlorogallium, or the like is used. Furthermore, as the precursor of zinc, dimethylzinc, diethylzinc, bis(2,2,6,6, tetramethyl-3,5-heptanedione acid)zinc, or the like is used. The kind, amount of introduction, and the like of the precursor used for forming the In—Ga—Zn oxide film are combined appropriately in accordance with properties required for the oxide 230*a* and the oxide 230*a*.

Other than the above-described precursors containing the metal elements, there is a precursor that contains one or both of carbon and chlorine. An oxide film formed using a precursor containing carbon may contain carbon. An oxide film formed using a precursor containing chlorine may contain chlorine.

In the case where the oxide film 230A and the oxide film 230B are deposited by a sputtering method, for example, oxygen or a mixed gas of oxygen and a rare gas is used as a sputtering gas. The amount of excess oxygen in the oxide film to be deposited can be increased by an increase in the proportion of oxygen included in the sputtering gas. In the case where the oxide films are deposited by a sputtering method, the above In-M-Zn oxide target and the like can be used. Furthermore, a direct current (DC) power source or an alternating current (AC) power source such as a radio frequency (RF) power source is connected to the target, and required power can be applied depending on the electric conductivity of the target.

In particular, at the time of depositing the oxide film 230A, part of oxygen contained in the sputtering gas is supplied to the insulator 224 in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained. Note that one embodiment of the present invention is not limited thereto. In the case where the oxide film 230B is formed by a sputtering method and the proportion of oxygen contained in the sputtering gas for deposition is higher than or equal to 1% and lower than or equal to 30%, preferably higher than or equal to 5% and lower than or equal to 20%, an oxygen-deficient oxide semiconductor is formed. In a transistor using an oxygen-deficient oxide semiconductor for its channel formation region, relatively high field-effect mobility can be obtained. Furthermore, when the deposition is performed while the substrate is heated, the crystallinity of the oxide film can be improved.

In this embodiment, the oxide film 230A is deposited by a sputtering method using an In—Ga—Zn oxide target with In:Ga:Zn=1:3:4 [atomic ratio]. The oxide film 230B is deposited by a sputtering method using an In—Ga—Zn oxide target with In:Ga:Zn=4:2:4.1 [atomic ratio]. Note that each of the oxide films is preferably formed to have characteristics required for the oxide 230 by appropriate selection of deposition conditions and an atomic ratio.

Here, the insulator 222, the insulator 224, the oxide film 230A, and the oxide film 230B are preferably deposited without exposure to the air. For example, a multi-chamber deposition apparatus is used.

Next, heat treatment may be performed. For the heat treatment, the conditions for the above-described heat treatment can be used. Through the heat treatment, impurities such as water and hydrogen in the oxide film 230A and the oxide film 230B can be removed, for example. In this embodiment, treatment is performed at 400° C. in a nitrogen atmosphere for one hour, and successively another treatment is performed at 400° C. in an oxygen atmosphere for one hour.

Next, the conductive film 242A is deposited over the oxide film 230B. The conductive film 242A can be deposited by a sputtering method, a CVD method, an MBE method, a PLD method, an ALD method, or the like (see FIG. 10). Note that heat treatment may be performed before the deposition of the conductive film 242A. Heat treatment may be performed under reduced pressure, and the conductive film 242A may be successively deposited without exposure to the air. The treatment can remove moisture and hydrogen adsorbed onto the surface of the oxide film 230B and the like, and further can reduce the moisture concentration and the hydrogen concentration of the oxide film 230A and the oxide film 230B. The heat treatment is preferably performed at a temperature higher than or equal to 100° C. and lower than or equal to 400° C. In this embodiment, the heat treatment is performed at 200° C.

Figure 11A:
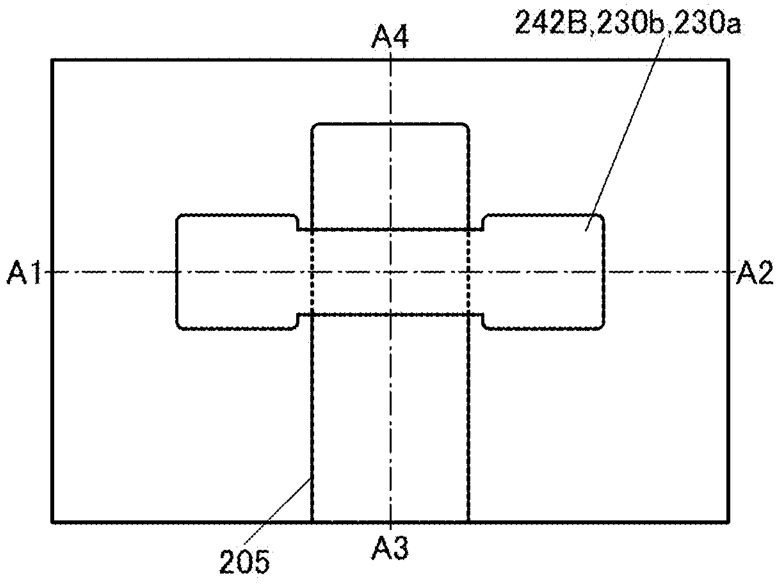
FIGS. 11A to 11C A top view and cross-sectional views illustrating a method for manufacturing a semiconductor device of one embodiment of the present invention.
Figure 11C:
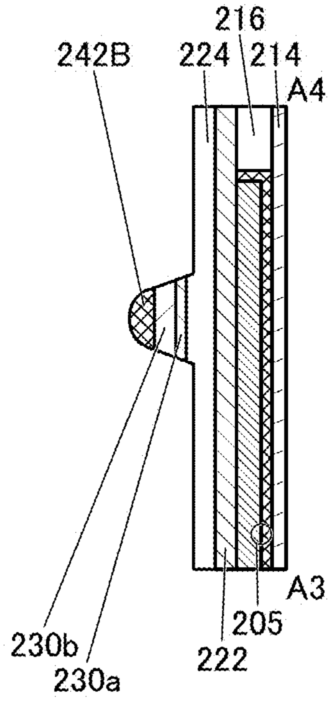
Figure 11B:
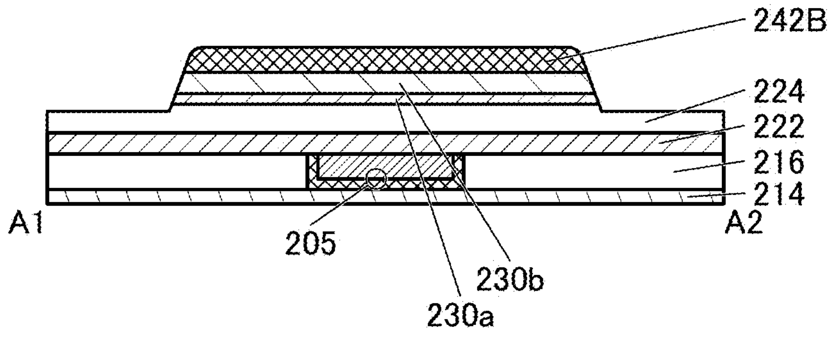

Next, the oxide film 230A, the oxide film 230B, and the conductive film 242A are processed into island shapes to form the oxide 230*a*, the oxide 230*b*, and a conductor layer 242B (see FIG. 11). Note that in this step, the thickness of the region of the insulator 224 that does not overlap with the oxide 230*a* is reduced in some cases.

Here, the oxide 230*a*, the oxide 230*b*, and the conductive layer 242B are formed to at least partly overlap with the conductor 205. It is preferable that the side surfaces of the oxide 230*a*, the oxide 230*b*, and the conductive layer 242B be substantially perpendicular to a top surface of the insulator 224. When the side surfaces of the oxide 230*a*, the oxide 230*b*, and the conductive layer 242B are substantially perpendicular to the top surface of the insulator 224, a plurality of transistors 200 can be provided in a smaller area and at a higher density. Alternatively, a structure may be employed in which an angle formed by the side surfaces of the oxide 230*a*, the oxide 230*b*, and the conductive layer 242B and the top surface of the insulator 224 is a small angle. In that case, the angle formed by the side surfaces of the oxide 230*a*, the oxide 230*b*, and the conductive layer 242B and the top surface of the insulator 224 is preferably greater than or equal to 60° and less than 70°. With such a shape, coverage with the insulator 254 and the like can be improved in a later step, so that defects such as voids can be reduced.

It is preferable that a curved surface be included between the side surface of the conductor layer 242B and the top surface of the conductor layer 242B. That is, an end portion of the side surface and an end portion of the top surface are preferably curved. The radius of curvature of the curved surface at the end portion of the conductive layer 242B is greater than or equal to 3 nm and less than or equal to 10 nm, preferably greater than or equal to 5 nm and less than or equal to 6 nm, for example. When the end portions are not angular, the coverage with films deposited in a later step can be improved.

Note that the oxide film 230A, the oxide film 230B, and the conductive film 242A can be processed by a lithography method. The processing can be performed by a dry etching method or a wet etching method. The processing by a dry etching method is suitable for microfabrication. The oxide film 230A, the oxide film 230B, and the conductive film 242A may be processed under different conditions.

Figure 12A:
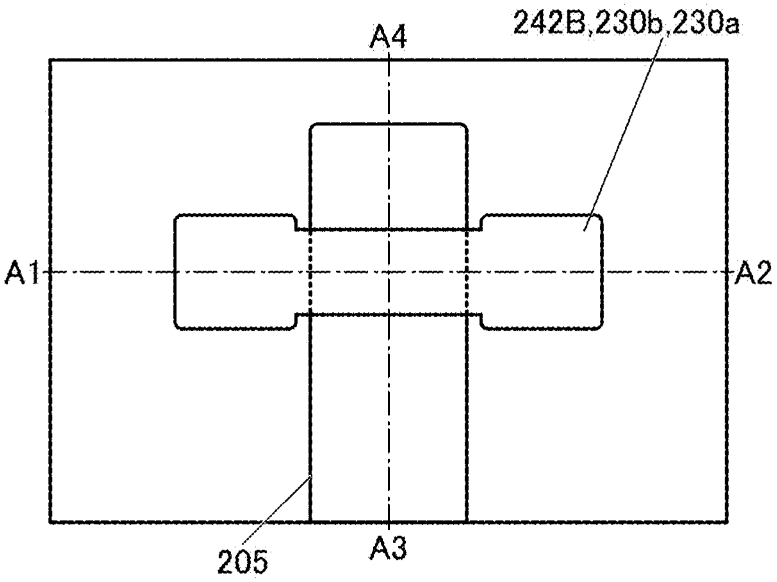
FIGS. 12A to 12C A top view and cross-sectional views illustrating a method for manufacturing a semiconductor device of one embodiment of the present invention.
Figure 12C:
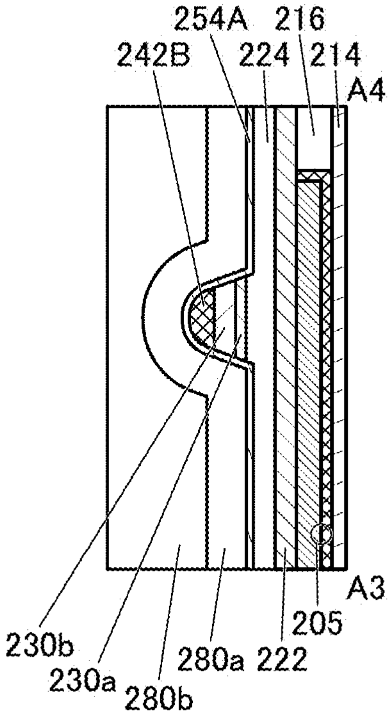
Figure 12B:
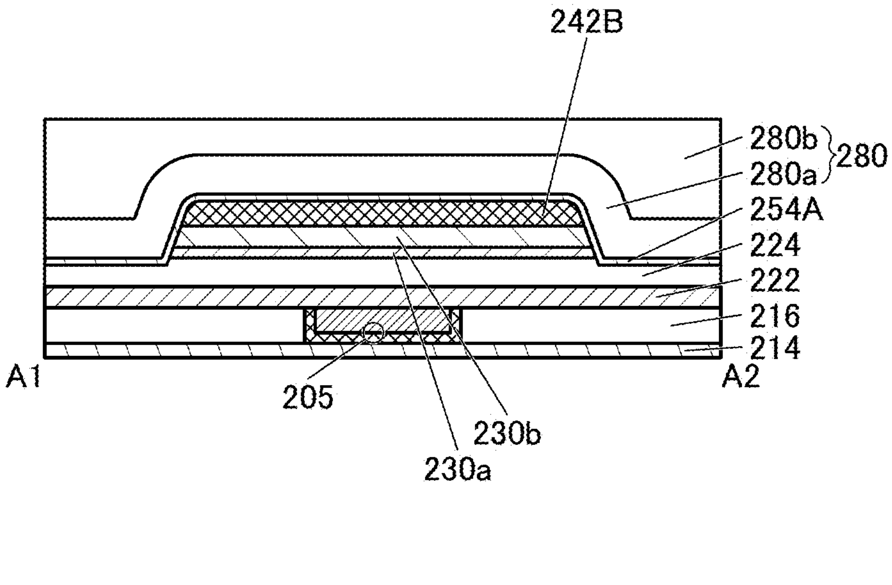
Figure 13A:
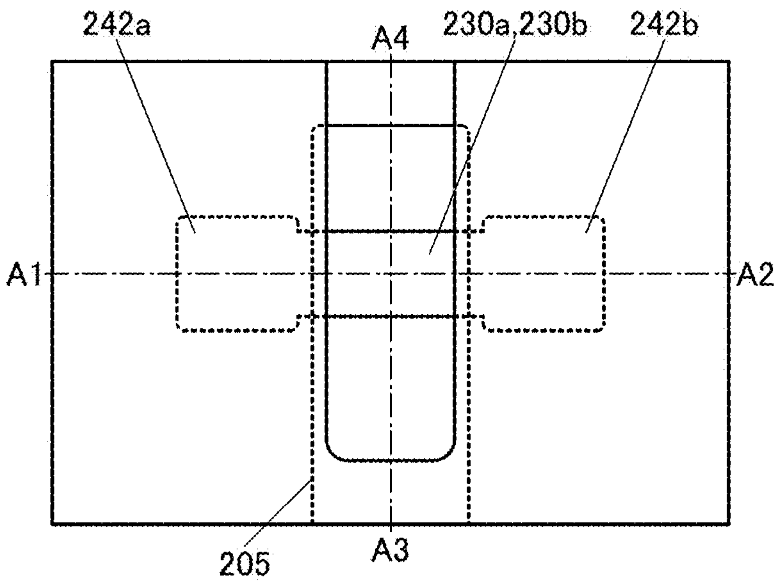
FIGS. 13A to 13C A top view and cross-sectional views illustrating a method for manufacturing a semiconductor device of one embodiment of the present invention.
Figure 13C:
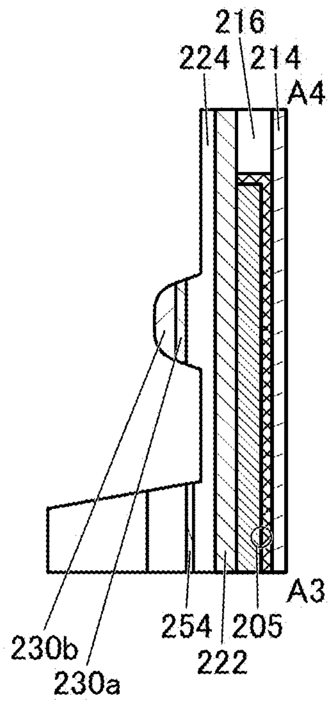
Figure 13B:
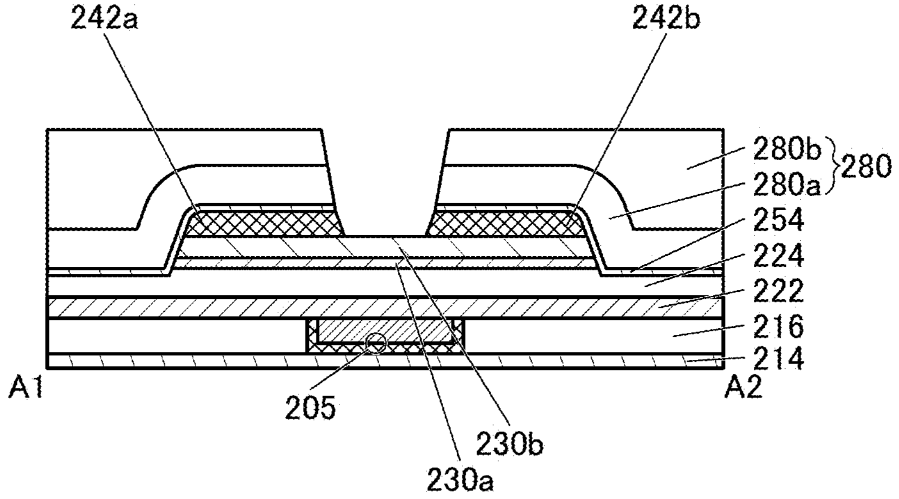
Figure 14A:
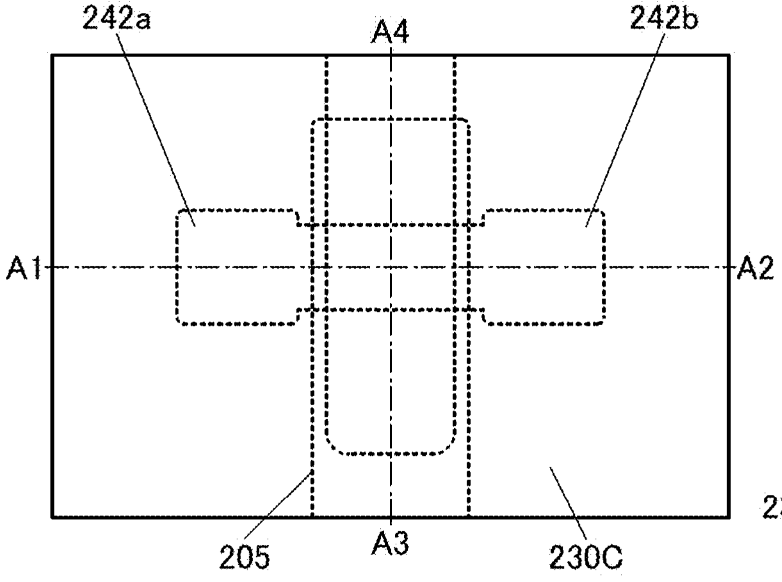
FIGS. 14A to 14C A top view and cross-sectional views illustrating a method for manufacturing a semiconductor device of one embodiment of the present invention.
Figure 14C:
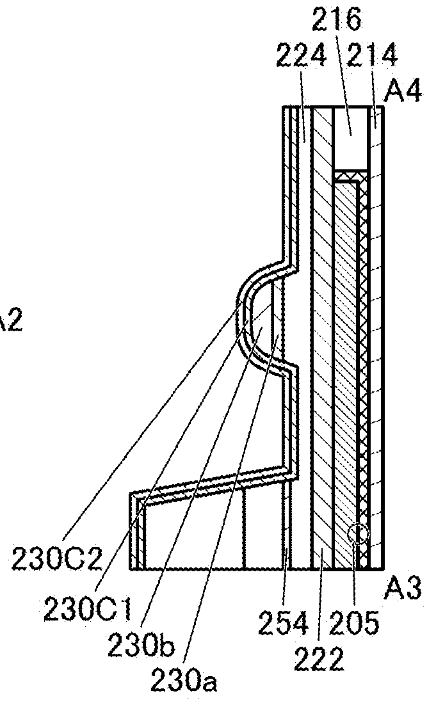
Figure 14B:
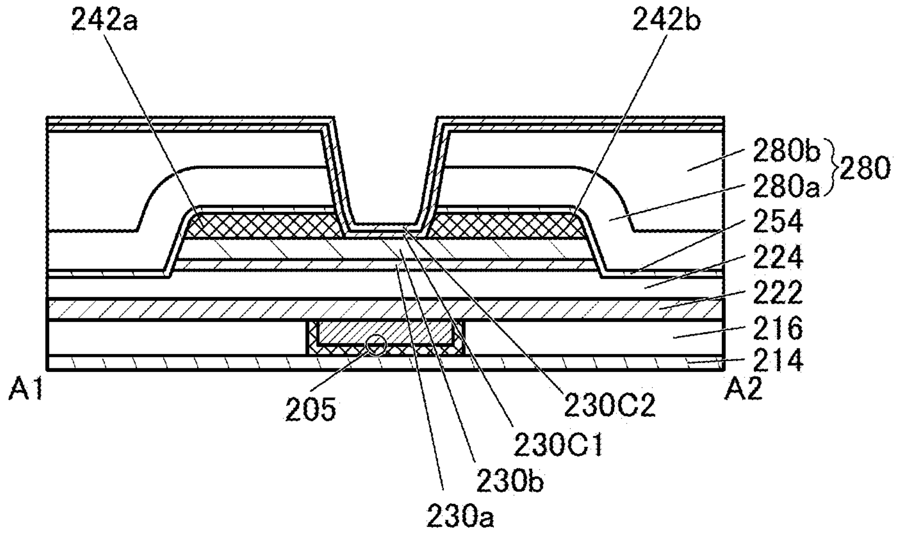
Figure 15A:
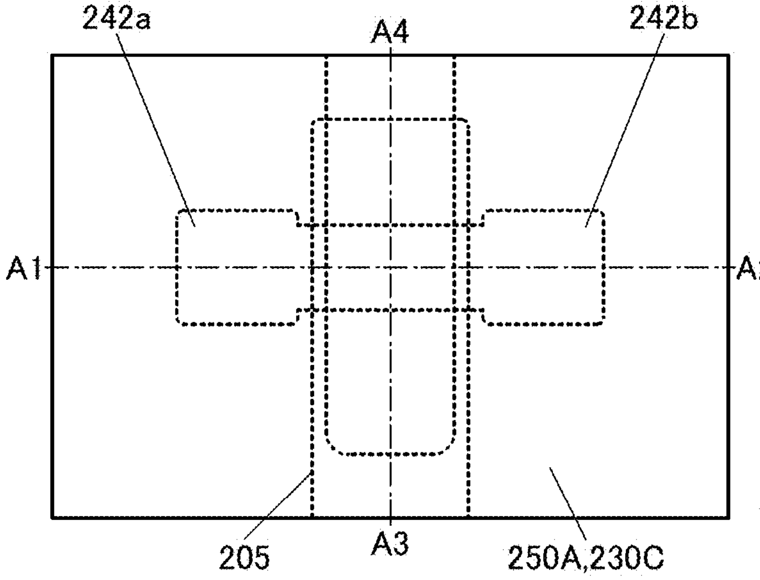
FIGS. 15A to 15C A top view and cross-sectional views illustrating a method for manufacturing a semiconductor device of one embodiment of the present invention.
Figure 15C:
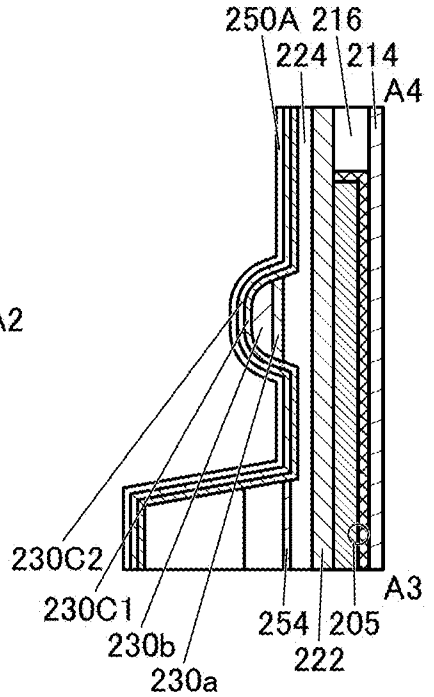
Figure 15B:
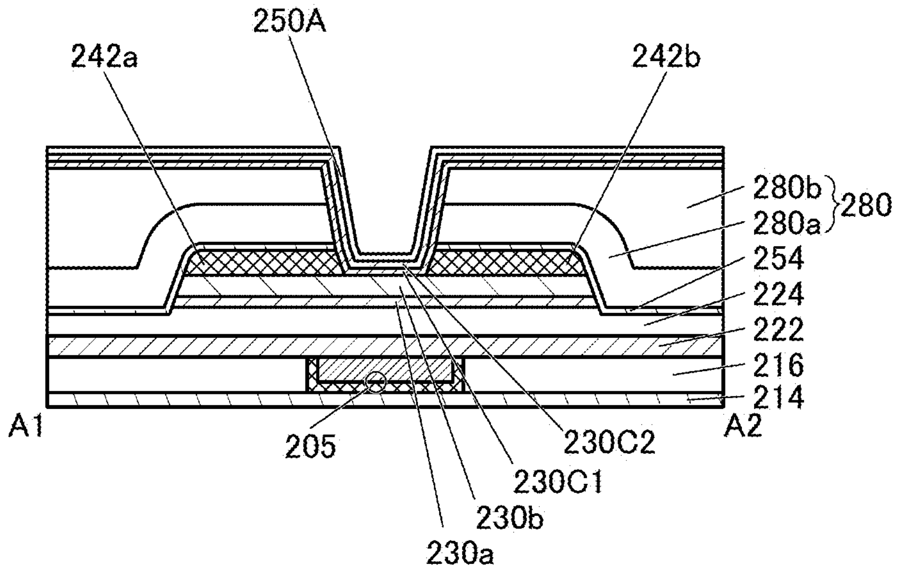
Figure 16A:
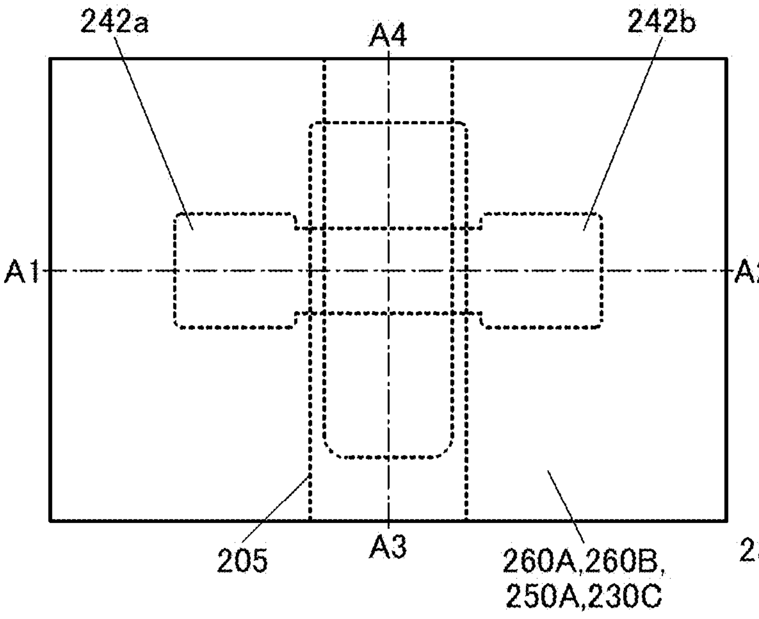
FIGS. 16A to 16C A top view and cross-sectional views illustrating a method for manufacturing a semiconductor device according to one embodiment of the present invention.
Figure 16C:
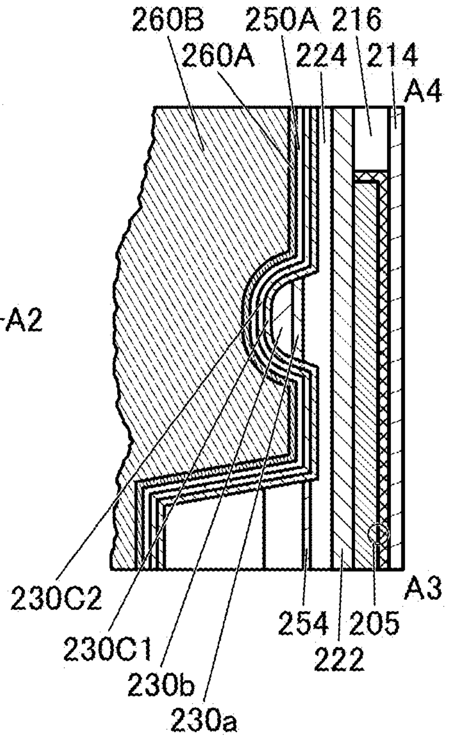
Figure 16B:
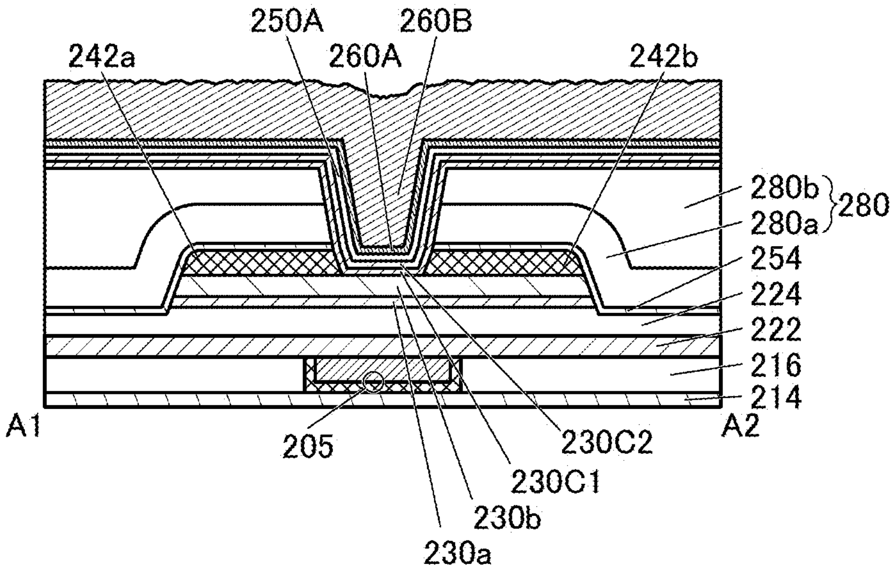

Next, an insulating film 254A to be the insulator 254 is deposited over the insulator 224, the oxide 230*a*, the oxide 230*b*, and the conductive layer 242B (see FIG. 12).

The insulating film 254A can be deposited by a sputtering method, a CVD method, an MBE method, a PLD method, an ALD method, or the like. As the insulating film 254A, an insulating film having a function of inhibiting passage of oxygen is preferably used. For example, silicon nitride, silicon oxide, or aluminum oxide is deposited by a sputtering method. Materials that can be used for the oxide 230*a* and the oxide 230*b* can be used for the insulator 254. For example, the insulator 254 may be formed using a metal oxide with In:Ga:Zn=1:3:4 [atomic ratio].

The insulating film 254A may have a stacked-layer structure of two layers. The lower layer of the insulating film 254A and the upper layer of the insulating film 254A can be deposited by the above method, and the lower layer of the insulating film 254A and the upper layer of the insulating film 254A may be deposited by the same method or different methods. The lower layer of the insulating film 254A and the upper layer of the insulating film 254A can be formed using the above material, and the lower layer of the insulating film 254A and the upper layer of the insulating film 254A may be formed using the same material or different materials. For example, an aluminum oxide film may be deposited by a sputtering method as the lower layer of the insulating film 254A, and an aluminum oxide film may be deposited by an ALD method as the upper layer of the insulating film 254A. Alternatively, an aluminum oxide film may be deposited by a sputtering method as the lower layer of the insulating film 254A, and a silicon nitride film may be deposited by an ALD method as the upper layer of the insulating film 254A.

Next, the insulator 280*a* and the insulator 280*b* are deposited in this order over the insulating film 254A. Note that the insulator 280*a* and the insulator 280*b* can be deposited by a sputtering method, a CVD method, an MBE method, a PLD method, an ALD method, or the like. In this embodiment, a silicon oxide film is deposited as the insulator 280*a* by a sputtering method, and a silicon oxide film is deposited as the insulator 280*b* by a CVD method. Note that heat treatment may be performed before the deposition of the insulator 280*a* and the insulator 280*b*. The heat treatment may be performed under reduced pressure, and the insulating films may be successively formed without exposure to the air. The treatment can remove moisture and hydrogen adsorbed onto the surface of the insulating film 254A and the like, and further can reduce the moisture concentration and the hydrogen concentration of the oxide 230*a*, the oxide 230*b*, and the insulating film 254A. The conditions for the above-described heat treatment can be used.

Next, CMP treatment is performed on the insulator 280*b*, so that a top surface of the insulator 280*b* is planarized (see FIG. 12).

Then, part of the insulator 280 (the insulator 280*a* and the insulator 280*b*), part of the insulating film 254A, and part of the conductive layer 242B are processed to form an opening reaching the oxide 230*b*. The opening is preferably formed to overlap with the conductor 205. The conductor 242*a*, the conductor 242*b*, and the insulator 254 are formed by the opening (see FIG. 13).

Part of the insulator 280, part of the insulating film 254A, and part of the conductive layer 242B may be processed under different conditions. For example, part of the insulator 280 may be processed by a dry etching method, part of the insulating film 254A may be processed by a wet etching method, and part of the conductive layer 242B may be processed by a dry etching method.

Here, it is preferable to remove impurities that are attached onto the surfaces of the oxide 230*a*, the oxide 230*b*, and the like or diffused into the oxide 230*a*, the oxide 230*b*, and the like. The impurities result from components contained in the insulator 280, the insulating film 254A, and the conductive layer 242B; components contained in a member used in an apparatus used to form the opening; and components contained in a gas or a liquid used for etching, for instance. Examples of the impurities include aluminum, silicon, tantalum, fluorine, and chlorine.

In order to remove the above impurities and the like, cleaning treatment is performed. Examples of the cleaning method include wet cleaning using a cleaning solution and the like, plasma treatment using plasma, and cleaning by heat treatment, and any of these cleanings may be performed in appropriate combination.

As the wet cleaning, cleaning treatment may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Further alternatively, such cleaning methods may be performed in combination as appropriate. A frequency greater than or equal to 200 kHz, preferably greater than or equal to 900 kHz is preferably used for the ultrasonic cleaning. Damage to the oxide 230_b_ and the like can be reduced with this frequency.

As the cleaning treatment in this embodiment, wet cleaning using diluted hydrofluoric acid or diluted ammonia water is performed and then, wet cleaning using pure water or carbonated water is performed. The cleaning treatment can remove impurities that are attached onto the surfaces of the oxide 230_a_, the oxide 230_b_, and the like or diffused into the oxide 230_a_, the oxide 230_b_, and the like. Alternatively, the crystallinity of the oxide 230_c_ over the oxide 230_b_ can be increased.

Next, heat treatment may be performed. The heat treatment may be performed under reduced pressure, and an oxide film 230C1 and an oxide film 230C2 may be successively deposited without exposure to the air. The treatment can remove moisture and hydrogen adsorbed onto the surface of the oxide 230_b_ and the like, and further can reduce the moisture concentration and the hydrogen concentration of the oxide 230_a_ and the oxide 230_b_. The temperature of the heat treatment is preferably higher than or equal to 100° C. and lower than or equal to 400° C. In this embodiment, the temperature of the heat treatment is 200° C. (see FIG. 14).

The oxide film 230C1 and the oxide film 230C2 can be deposited by a sputtering method, a CVD method, an MBE method, a PLD method, an ALD method, or the like. The oxide film 230C1 and the oxide film 230C2 may be deposited by a deposition method similar to that for the oxide film 230A or the oxide film 230B or a different deposition method. Note that in the case where the oxide film 230C1 and the oxide film 230C2 are formed by an ALD method, the description in the above embodiment can be referred to. In this embodiment, an In—Ga—Zn oxide with In:Ga:Zn=4:2:3 [atomic ratio] is deposited as the oxide film 230C1 by an ALD method, and an In—Ga—Zn oxide film with In:Ga:Zn=1:3:4 [atomic ratio] is deposited as the oxide film 230C2 by an ALD method.

When the oxide film 230C1 and the oxide film 230C2 are formed by an ALD method, the oxide films in each of which the thickness on the bottom surface of the opening is substantially the same as that on the side surface of the opening can be formed. For example, the ratio of the thickness of the oxide film 230C1 on the side surface of the opening to the thickness of the oxide film 230C1 on the bottom portion of the opening can be greater than or equal to 0.5 and less than or equal to 1, preferably greater than or equal to 0.7 and less than or equal to 1, more preferably greater than or equal to 0.9 and less than or equal to 1. In addition, the ratio of the thickness of the oxide film 230C2 on the side surface of the opening to the thickness of the oxide film 230C2 on the bottom portion of the opening can be greater than or equal to 0.5 and less than or equal to 1, preferably greater than or equal to 0.7 and less than or equal to 1, more preferably greater than or equal to 0.9 and less than or equal to 1. The ratio of the thickness of the oxide film 230C1 on the side surface of the oxide 230_b_ to the thickness of the oxide film 230C1 on the top surface of the oxide 230_b_ is greater than or equal to 0.5 and less than or equal to 1, preferably greater than or equal to 0.7 and less than or equal to 1, more preferably greater than or equal to 0.9 and less than or equal to 1. Furthermore, the ratio of the thickness of the oxide film 230C2 over the side surface of the oxide 230_b_ to the thickness of the oxide film 230C2 over the top surface of the oxide 230_b_ is greater than or equal to 0.5 and less than or equal to 1, preferably greater than or equal to 0.7 and less than or equal to 1, more preferably greater than or equal to 0.9 and less than or equal to 1. When an oxide film formed by an ALD method has a crystal structure, the c-axis thereof can be substantially parallel to the normal direction of the deposition surface.

In the case where the oxide film 230C1 and the oxide film 230C2 are deposited by a sputtering method, part of oxygen contained in the sputtering gas is sometimes supplied to the oxide 230_a_ and the oxide 230_b_ at the time of depositing the oxide film 230C1 and the oxide film 230C2. Therefore, the proportion of oxygen contained in the sputtering gas for the oxide film 230C1 and the oxide film 230C2 is higher than or equal to 70%, preferably higher than or equal to 80%, more preferably 100%.

Next, heat treatment may be performed. Heat treatment may be performed under reduced pressure, and an insulating film 250A may be successively deposited without exposure to the air. The treatment can remove moisture and hydrogen adsorbed onto the surface of the oxide film 230C and the like, and further can reduce the moisture concentration and the hydrogen concentration of the oxide 230_a_, the oxide 230_b_, and the oxide film 230C. The temperature of the heat treatment is preferably higher than or equal to 100° C. and lower than or equal to 400° C. (see FIG. 15).

The insulating film 250A can be deposited by a sputtering method, a CVD method, an MBE method, a PLD method, an ALD method, or the like. In this embodiment, for the insulating film 250A, silicon oxynitride is deposited by a CVD method. Note that the deposition temperature at the time of the deposition of the insulating film 250A is preferably higher than or equal to 350° C. and lower than 450° C., particularly preferably approximately 400° C. When the insulating film 250A is deposited at 400° C., an insulating film having few impurities can be formed.

Next, a conductive film 260A and a conductive film 260B are deposited in this order. The conductive film 260A and the conductive film 260B can be deposited by a sputtering method, a CVD method, an MBE method, a PLD method, an ALD method, or the like. For example, a CVD method is preferably used. In this embodiment, the conductive film 260A is deposited by an ALD method, and the conductive film 260B is deposited by a CVD method (see FIG. 16).

Figure 17A:
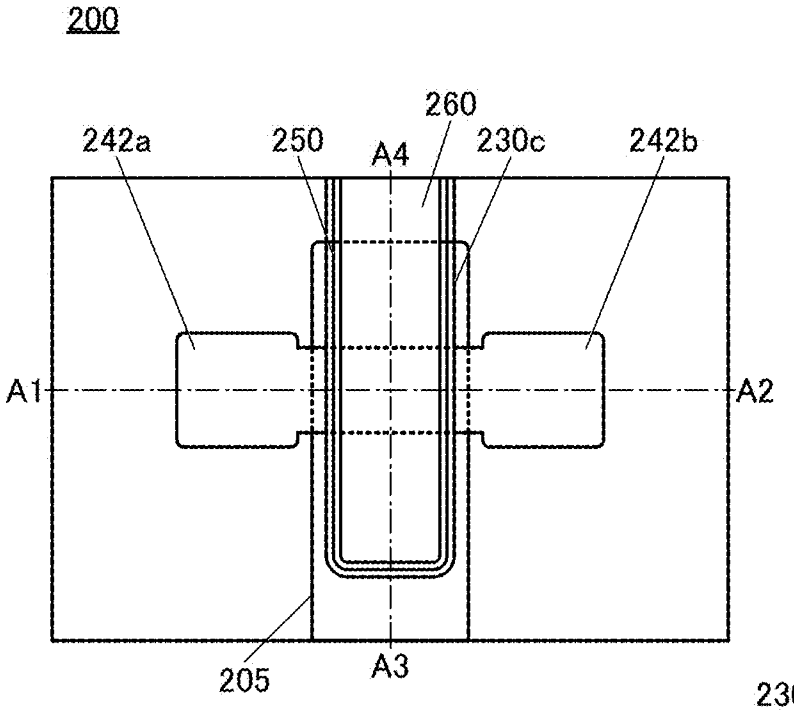
FIGS. 17A to 17C A top view and cross-sectional views illustrating a method for manufacturing a semiconductor device of one embodiment of the present invention.
Figure 17C:
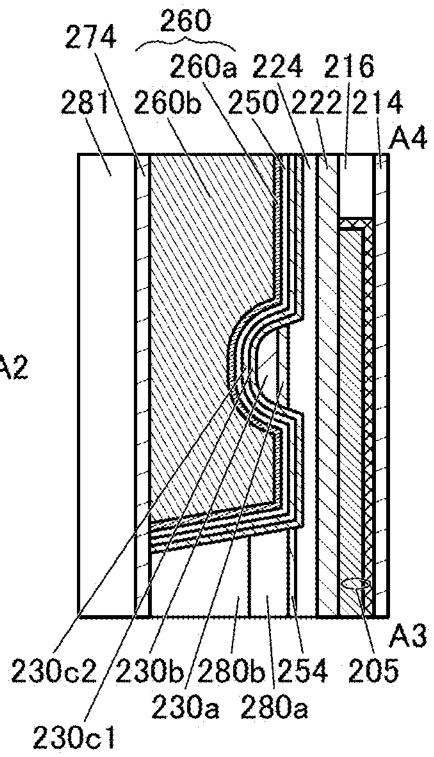
Figure 17B:
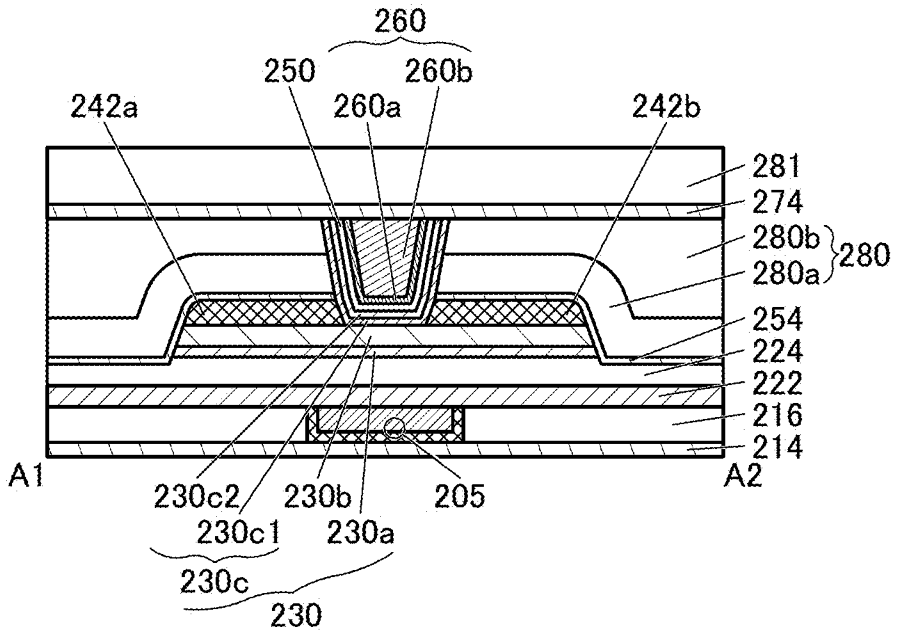

Then, the oxide film 230C1, the oxide film 230C2, the insulating film 250A, the conductive film 260A, and the conductive film 260B are polished by CMP treatment until the insulator 280 is exposed, whereby the oxide 230_c_ (the oxide 230_c_1 and the oxide 230_c_2), the insulator 250, and the conductor 260 (the conductor 260_a_ and the conductor 260_b_) are formed (see FIG. 17). Accordingly, the oxide 230_c_ is positioned to cover the inner wall (the side wall and bottom surface) of the opening that reaches the oxide 230_b_. The insulator 250 is positioned to cover the inner wall of the opening with the oxide 230_c_ therebetween. The conductor 260 is positioned to fill the opening with the oxide 230_c_ and the insulator 250 therebetween.

Next, heat treatment may be performed. In this embodiment, the treatment is performed at 400° C. in a nitrogen atmosphere for one hour. The heat treatment can reduce the moisture concentration and the hydrogen concentration in the insulator 250 and the insulator 280.

Next, the insulator 274 is deposited over the oxide 230_c_, the insulator 250, the conductor 260, and the insulator 280. The insulator 274 can be deposited by a sputtering method, a CVD method, an MBE method, a PLD method, an ALD method, or the like. An aluminum oxide film or a silicon nitride film is preferably deposited as the insulator 274 by a sputtering method, for example. When an aluminum oxide film or a silicon nitride film is deposited by a sputtering method, diffusion of hydrogen contained in the insulator 281 into the oxide 230 can be inhibited. Forming the insulator 274 to be in contact with the conductor 260 is preferable, in which case oxidation of the conductor 260 can be inhibited.

When an aluminum oxide film is formed as the insulator 274 by a sputtering method, oxygen can be supplied to the insulator 280. Oxygen supplied to the insulator 280 is sometimes supplied to the channel formation region included in the oxide 230*b* through the oxide 230*c*. Furthermore, when oxygen is supplied to the insulator 280, oxygen that is contained in the insulator 280 before the formation of the insulator 274 may be supplied to the channel formation region included in the oxide 230*b* through the oxide 230*c*.

In addition, the insulator 274 may have a multilayer structure. For example, a structure may be employed in which an aluminum oxide film is deposited by a sputtering method and a silicon nitride film is deposited over the aluminum oxide film by a sputtering method.

Next, heat treatment may be performed. For the heat treatment, the conditions for the above heat treatment can be used. The heat treatment can reduce the moisture concentration and hydrogen concentration in the insulator 280. Moreover, oxygen contained in the insulator 274 can be injected into the insulator 280.

Note that as a method for depositing the insulator 274, the following may be performed: first, an aluminum oxide film is deposited over the oxide 230*c*, the insulator 250, the conductor 260, and the insulator 280 by a sputtering method, heat treatment is performed under the above heat treatment conditions, the aluminum oxide film is removed by CMP treatment, and then the insulator 274 is deposited. By this method, a larger number of excess-oxygen regions can be formed in the insulator 280. Note that in the step of removing the aluminum oxide film, part of the insulator 280, part of the conductor 260, part of the insulator 250, and part of the oxide 230*c* are removed in some cases.

An insulator may be provided between the insulator 280 and the insulator 274. As the insulator, silicon oxide deposited by a sputtering method can be used, for example. Providing the insulator can form an excess-oxygen region in the insulator 280.

Next, the insulator 281 may be deposited over the insulator 274. The insulator 281 can be deposited by a sputtering method, a CVD method, an MBE method, a PLD method, an ALD method, or the like (see FIG. 17).

Then, openings that reach the conductor 242*a* and the conductor 242*b* are formed in the insulator 254, the insulator 280, the insulator 274, and the insulator 281. The openings are formed by a lithography method.

Next, an insulating film to be the insulator 241 is deposited and the insulating film is subjected to anisotropic etching, so that the insulator 241 is formed. The insulating film can be deposited by a sputtering method, a CVD method, an MBE method, a PLD method, an ALD method, or the like. As the insulating film, an insulating film having a function of inhibiting the passage of oxygen is preferably used. For example, an aluminum oxide film is preferably deposited by an ALD method. Alternatively, a silicon nitride film may be deposited by an ALD method or a CVD method. In the case where a silicon nitride film is deposited by an ALD method, a precursor containing silicon and halogen or precursors of aminosilanes can be used. As the precursor containing silicon and halogen, $SiCl_4$, $SiH_2Cl_2$, $Si_2Cl_6$, $Si_3Cl_8$, or the like can be used. As the precursors of aminosilanes, monovalent, divalent, or trivalent aminosilanes can be used. Moreover, as a nitriding gas, ammonia or hydrazine can be used. For the anisotropic etching, a dry etching method or the like is employed, for example. When the side wall portions of the openings have such a structure, passage of oxygen from the outside can be inhibited and oxidation of the conductor 240*a* and the conductor 240*b* to be formed next can be prevented. Furthermore, impurities such as water and hydrogen can be prevented from diffusing from the conductor 240*a* and the conductor 240*b* to the outside.

Next, a conductive film to be the conductor 240*a* and the conductor 240*b* is deposited. The conductive film to be the conductor 240*a* and the conductor 240*b* desirably has a stacked-layer structure including a conductor having a function of inhibiting diffusion of impurities such as water and hydrogen. For example, a stack of tantalum nitride, titanium nitride, or the like and tungsten, molybdenum, copper, or the like can be employed. The conductive film to be the conductor 240 can be deposited by a sputtering method, a CVD method, an MBE method, a PLD method, an ALD method, or the like.

Next, CMP treatment is performed to remove part of the conductive film to be the conductor 240*a* and the conductor 240*b*, so that the insulator 281 is exposed. As a result, the conductive film remains only in the openings, so that the conductor 240*a* and the conductor 240*b* having flat top surfaces can be formed (see FIG. 8). Note that the insulator 281 is partly removed by the CMP treatment in some cases.

According to one embodiment of the present invention, a highly reliable semiconductor device can be provided. According to one embodiment of the present invention, a semiconductor device with excellent electrical characteristics can be provided. According to one embodiment of the present invention, a semiconductor device with a high on-state current can also be provided. According to one embodiment of the present invention, a semiconductor device with excellent frequency characteristics can be provided. According to one embodiment of the present invention, a semiconductor device that can be miniaturized or highly integrated can be provided. According to one embodiment of the present invention, a semiconductor device with low off-state current can be provided. According to one embodiment of the present invention, a semiconductor device with reduced power consumption can be provided. According to one embodiment of the present invention, a semiconductor device with high productivity can be provided.

The structure, method, and the like described above in this embodiment can be used in combination as appropriate with the structures, methods, and the like described in the other embodiments.

Embodiment 3

In this embodiment, one embodiment of a semiconductor device is described with reference to FIG. 18 to FIG. 23.

[Memory Device 1]

Figure 18:
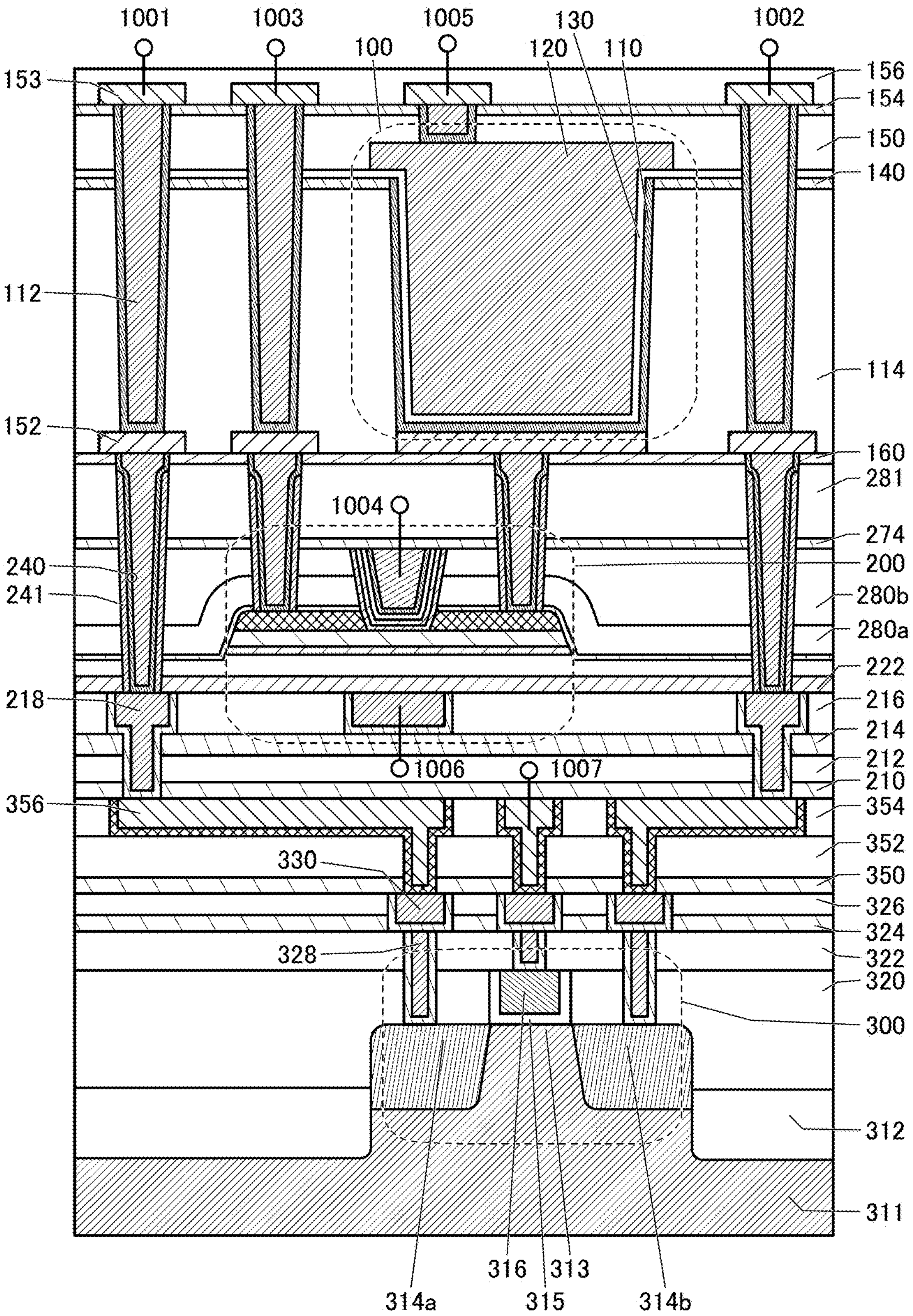
FIG. 18 A cross-sectional view illustrating a structure of a memory device of one embodiment of the present invention.

FIG. 18 illustrates an example of a semiconductor device (memory device) in which a capacitor of one embodiment of the present invention is used. In the semiconductor device of one embodiment of the present invention, the transistor 200 is provided above a transistor 300, and a capacitor 100 is provided above the transistor 200. Preferably, at least part of the capacitor 100 or the transistor 300 overlaps with the transistor 200. Accordingly, an area occupied by the capacitor 100, the transistor 200, and the transistor 300 in a top view can be reduced, whereby the semiconductor device of this embodiment can miniaturized or highly integrated. The semiconductor device in this embodiment can be applied to logic circuits typified by a CPU (Central Processing Unit) and a GPU (Graphics Processing Unit) and memory circuits typified by a DRAM (Dynamic Random Access Memory) and an NVM (Non-Volatile Memory), for example.

The transistor 200 described in the above embodiment can be used as the transistor 200. Therefore, for the transistor 200 and layers including the transistor 200, the description in the above embodiment can be referred to.

The transistor 200 is a transistor whose channel is formed in a semiconductor layer containing an oxide semiconductor. Since the transistor 200 has a low off-state current, a memory device including the transistor 200 can retain stored data for a long time. In other words, such a memory device does not require refresh operation or has an extremely low frequency of the refresh operation, which leads to a sufficient reduction in power consumption of the memory device. The transistor 200 exhibits favorable electrical characteristics at high temperatures, in comparison with a transistor including silicon in a semiconductor layer. For example, the transistor 200 has favorable electrical characteristics even in the temperature range of 125° C. to 150° C. Moreover, the transistor 200 has an on/off ratio of 1010 or larger in the temperature range of 125° C. to 150° C. In other words, in comparison with a transistor including silicon in a semiconductor layer, the transistor 200 excels in characteristics such as on-state current and frequency characteristics at higher temperatures.

In the semiconductor device illustrated in FIG. 18, a wiring 1001 is electrically connected to a source of the transistor 300, a wiring 1002 is electrically connected to a drain of the transistor 300, and a wiring 1007 is electrically connected to a gate of the transistor 300. A wiring 1003 is electrically connected to one of the source and the drain of the transistor 200, a wiring 1004 is electrically connected to the first gate of the transistor 200, and a wiring 1006 is electrically connected to the second gate of the transistor 200. The other of the source and the drain of the transistor 200 is electrically connected to one of electrodes of the capacitor 100, and a wiring 1005 is electrically connected to the other electrode of the capacitor 100.

The semiconductor device illustrated in FIG. 18 has characteristics of being capable of retaining charge stored in one of the electrodes of the capacitor 100 by switching of the transistor 200; thus, writing, retention, and reading of data can be performed. The transistor 200 is an element in which the second gate is provided in addition to the source, the first gate, and the drain. That is, the transistor 200 is a four-terminal element; hence, its input and output can be controlled independently of each other in a simpler manner than that in two-terminal elements typified by MRAM (Magnetoresistive Random Access Memory) utilizing MTJ (Magnetic Tunnel Junction) properties, ReRAM (Resistive Random Access Memory), and phase-change memory. In addition, the structure of MRAM, ReRAM, and phase-change memory may change at the atomic level when data is rewritten. In contrast, the semiconductor device in FIG. 18 features in high write endurance and a few structure changes because data rewriting is performed by charging or discharging of electrons with the transistor and the capacitor.

Furthermore, by arranging the semiconductor devices illustrated in FIG. 18 in a matrix, a memory cell array can be formed. In this case, the transistor 300 can be used for a read circuit, a driver circuit, or the like that is connected to the memory cell array. As described above, the semiconductor device illustrated in FIG. 18 constitutes the memory cell array. When the semiconductor device in FIG. 18 is used as a memory element, for example, an operating frequency of 200 MHz or higher is achieved at a driving voltage of 2.5 V and an evaluation environment temperature ranging from −40° C. to 85° C.

<Transistor 300>

The transistor 300 is provided on a substrate 311 and includes a conductor 316 functioning as a gate electrode, an insulator 315 functioning as a gate insulator, a semiconductor region 313 that is part of the substrate 311, and a low-resistance region 314*a* and a low-resistance region 314*b* functioning as a source region and a drain region.

Here, the insulator 315 is placed over the semiconductor region 313, and the conductor 316 is placed over the insulator 315. The transistors 300 formed in the same layer are electrically isolated from one another by an insulator 312 functioning as an element isolation insulating layer. The insulator 312 can be formed using an insulator similar to an insulator 326 or the like described later. The transistor 300 may be a p-channel transistor or an n-channel transistor.

In the substrate 311, a region of the semiconductor region 313 where a channel is formed, a region in the vicinity thereof, the low-resistance region 314*a* and the low-resistance region 314*b* functioning as the source region and the drain region, and the like preferably contain a semiconductor such as a silicon-based semiconductor, further preferably single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 300 may be an HEMT (High Electron Mobility Transistor) using GaAs and GaAlAs, or the like.

The low-resistance region 314*a* and the low-resistance region 314*b* contain an element that imparts n-type conductivity, such as arsenic or phosphorus, or an element that imparts p-type conductivity, such as boron, in addition to the semiconductor material used for the semiconductor region 313.

The conductor 316 functioning as the gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to obtain both conductivity and embeddability, it is preferable to use stacked layers of metal materials such as tungsten and aluminum for the conductor, and it is particularly preferable to use tungsten in terms of heat resistance.

Here, in the transistor 300 illustrated in FIG. 18, the semiconductor region 313 (part of the substrate 311) in which the channel is formed has a convex shape. Furthermore, the conductor 316 is provided so as to cover a side surface and the top surface of the semiconductor region 313 with the insulator 315 positioned therebetween. Such a transistor 300 is also referred to as a FIN-type transistor because it utilizes a convex portion of the semiconductor substrate. Note that an insulator functioning as a mask for forming the convex portion may be placed in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 18 is an example and the structure is not limited thereto; an appropriate transistor is used in accordance with a circuit structure or a driving method.

As illustrated in FIG. 18, the semiconductor device includes a stack of the transistor 300 and the transistor 200. For example, the transistor 300 can be formed using a silicon-based semiconductor material, and the transistor 200 can be formed using an oxide semiconductor. That is, in the semiconductor device in FIG. 18, a silicon-based semiconductor material and an oxide semiconductor can be used in different layers. The semiconductor device illustrated in FIG. 18 can be manufactured in a process similar to that employing a manufacturing apparatus that is used in the case of a silicon-based semiconductor material, and can be highly integrated.

<Capacitor 100>

The capacitor 100 includes an insulator 114 over an insulator 160, an insulator 140 over the insulator 114, a conductor 110 positioned in an opening formed in the insulator 114 and the insulator 140, an insulator 130 over the conductor 110 and the insulator 140, a conductor 120 over the insulator 130, and an insulator 150 over the conductor 120 and the insulator 130. Here, at least parts of the conductor 110, the insulator 130, and the conductor 120 are positioned in the opening formed in the insulator 114 and the insulator 140.

The conductor 110 functions as a lower electrode of the capacitor 100, the conductor 120 functions as an upper electrode of the capacitor 100, and the insulator 130 functions as a dielectric of the capacitor 100. The capacitor 100 has a structure in which the upper electrode and the lower electrode face each other with the dielectric positioned therebetween on a side surface as well as the bottom surface of the opening in the insulator 114 and the insulator 140; thus, the capacitance per unit area can be increased. Thus, the deeper the opening is, the larger the capacitance of the capacitor 100 can be. Increasing the capacitance per unit area of the capacitor 100 in this manner can promote miniaturization or higher integration of the semiconductor device.

An insulator that can be used for the insulator 280 can be used as the insulator 114 and the insulator 150. The insulator 140 preferably functions as an etching stopper at the time of forming the opening in the insulator 114 and is formed using an insulator that can be used for the insulator 214.

The shape of the opening formed in the insulator 114 and the insulator 140 when seen from above may be a quadrangular shape, a polygonal shape other than a quadrangular shape, a polygonal shape with rounded corners, or a circular shape including an elliptical shape. Here, the area where the opening and the transistor 200 overlap with each other is preferably large in the top view. Such a structure can reduce the area occupied by the semiconductor device including the capacitor 100 and the transistor 200.

The conductor 110 is provided in contact with the opening formed in the insulator 140 and the insulator 114. The top surface of the conductor 110 is preferably substantially level with the top surface of the insulator 140. A conductor 152 provided over the insulator 160 is in contact with the bottom surface of the conductor 110. The conductor 110 is preferably deposited by an ALD method, a CVD method, or the like; for example, a conductor that can be used for the conductor 205 is used.

The insulator 130 is positioned to cover the conductor 110 and the insulator 140. The insulator 130 is preferably deposited by an ALD method or a CVD method, for example. The insulator 130 can be provided to have stacked layers or a single layer using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 130, an insulating film in which zirconium oxide, aluminum oxide, and zirconium oxide are stacked in this order can be used, for example.

For the insulator 130, a material with high dielectric strength, such as silicon oxynitride, or a high dielectric constant (high-k) material is preferably used. Alternatively, a stacked-layer structure using a material with high dielectric strength and a high dielectric (high-k) material may be employed.

As an insulator of a high dielectric constant (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, and the like can be given. The use of such a high-k material can ensure sufficient capacitance of the capacitor 100 even when the insulator 130 has a large thickness. When the insulator 130 has a large thickness, leakage current generated between the conductor 110 and the conductor 120 can be inhibited.

Examples of the material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride ($SiN_x$) deposited by an ALD method, silicon oxide ($SiO_x$) deposited by a plasma ALD method, and silicon nitride ($SiN_x$) deposited by an ALD method are stacked in this order. The use of such an insulator having high dielectric strength can increase the dielectric strength and inhibit electrostatic breakdown of the capacitor 100.

The conductor 120 is positioned to fill the opening formed in the insulator 140 and the insulator 114. The conductor 120 is electrically connected to the wiring 1005 through a conductor 112 and a conductor 153. The conductor 120 is preferably deposited by an ALD method, a CVD method, or the like and is formed using a conductor that can be used as the conductor 205, for example.

Since the transistor 200 has a structure in which an oxide semiconductor is used, the transistor 200 is highly compatible with the capacitor 100. Specifically, since the transistor 200 containing an oxide semiconductor has a low off-state current, a combination of the transistor 200 and the capacitor 100 enables stored data to be retained for a long time.

<Wiring Layers>

Wiring layers provided with an interlayer film, a wiring, a plug, and the like may be provided between the structure bodies. A plurality of wiring layers can be provided in accordance with the design. Note that a plurality of conductors functioning as plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

For example, an insulator 320, an insulator 322, an insulator 324, and the insulator 326 are stacked over the transistor 300 in this order as interlayer films. Moreover, a conductor 328, a conductor 330, and the like that are electrically connected to the conductor 153 functioning as a terminal are embedded in the insulator 320, the insulator 322, the insulator 324, and the insulator 326. Note that the conductor 328 and the conductor 330 function as plugs or wirings.

The insulator functioning as an interlayer film may function as a planarization film that covers an uneven shape thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 18, an insulator 350, an insulator 352, and an insulator 354 are provided to be stacked in this order. Furthermore, a conductor 356 is formed in the insulator 350, the insulator 352, and the insulator 354. The conductor 356 functions as a plug or a wiring.

An insulator 210, an insulator 212, the insulator 214, and the insulator 216 are stacked in this order over the insulator 354 and the conductor 356. A conductor 218, a conductor (the conductor 205) included in the transistor 200, and the like are embedded in the insulator 210, the insulator 212, the insulator 214, and the insulator 216. Note that the conductor 218 functions as a plug or a wiring that is electrically connected to the transistor 300.

The conductor 112, conductors included in the capacitor 100 (the conductor 120 and the conductor 110) and the like are embedded in the insulator 114, the insulator 140, the insulator 130, the insulator 150, and an insulator 154. Note that the conductor 112 functions as a plug or a wiring that electrically connects the capacitor 100, the transistor 200 or the transistor 300 to the conductor 153 functioning as a terminal.

The conductor 153 is provided over the insulator 154 and is covered with an insulator 156. Here, the conductor 153 is in contact with a top surface of the conductor 112 and functions as a terminal of the capacitor 100, the transistor 200, or a transistor 300.

Examples of an insulator that can be used as an interlayer film include an oxide, a nitride, an oxynitride, a nitride oxide, a metal oxide, a metal oxynitride, and a metal nitride oxide, each of which has an insulating property. For example, when a material having a low relative permittivity is used as the insulator functioning as an interlayer film, the parasitic capacitance generated between wirings can be reduced. Accordingly, a material is preferably selected depending on the function of an insulator.

For example, for the insulator 320, the insulator 322, the insulator 326, the insulator 352, the insulator 354, the insulator 212, the insulator 114, the insulator 150, the insulator 156, and the like, an insulator with low relative permittivity is preferably used. For example, the insulators each preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators each preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

It is preferable that the resistivity of an insulator provided over or under the conductor 152 or the conductor 153 be higher than or equal to $1.0\times10^{12}$ Ωcm and lower than or equal to $1.0\times10^{15}$ Ωcm, preferably higher than or equal to $5.0\times10^{12}$ Ωcm and lower than or equal to $1.0\times10^{14}$ Ωcm, more preferably higher than or equal to $1.0\times10^{13}$ Ωcm and lower than or equal to $5.0\times10^{13}$ Ωcm. The resistivity of the insulator provided over or under the conductor 152 or the conductor 153 is preferably within the above range because the insulator can disperse charges accumulated between the transistor 200, the transistor 300, the capacitor 100, and wirings such as the conductor 152 while maintaining the insulating property, and thus, poor characteristics and electrostatic breakdown of the transistor and the semiconductor device including the transistor due to the charges can be inhibited. For such an insulator, silicon nitride or silicon nitride oxide can be used. For example, the resistivity of the insulator 160 or the insulator 154 can be set within the above range.

When a transistor using an oxide semiconductor is surrounded by insulators having a function of inhibiting passage of oxygen and impurities such as hydrogen, the electrical characteristics of the transistor can be stable. Thus, an insulator having a function of inhibiting the passage of oxygen and impurities such as hydrogen is used as the insulator 324, the insulator 350, the insulator 210, and like.

As the insulator having a function of inhibiting the passage of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, for the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride can be used.

For the conductors that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, the conductor 152, the conductor 153, and the like, a single layer or stacked layers of a conductive material such as a metal material, an alloy material, a metal nitride material, a metal oxide material, and the like that are formed using the above materials can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<Wiring or Plug in Layer Provided with Oxide Semiconductor>

In the case where an oxide semiconductor is used in the transistor 200, an insulator including an excess-oxygen region is provided in the vicinity of the oxide semiconductor in some cases. In that case, an insulator having a barrier property is preferably provided between the insulator including the excess-oxygen region and a conductor provided in the vicinity of the insulator including the excess-oxygen region.

For example, the insulator 241 is preferably provided between the insulator 280 (the insulator 280*a* and the insulator 280*b*) including excess oxygen and the conductor 240 in FIG. 18. The insulator 241 and the insulator 274 are preferably provided in contact with each other. the conductor 240 and the transistor 200 can be sealed by the insulator 241 and the insulator 274 that have a barrier property.

That is, the excess oxygen contained in the insulator 280 can be inhibited from being absorbed by the conductor 240 when the insulator 241 is provided. In addition, diffusion of hydrogen, which is an impurity, into the transistor 200 through the conductor 240 can be inhibited when the insulator 241 is provided.

Here, the conductor 240 functions as a plug or a wiring that is electrically connected to the transistor 200 or the transistor 300.

The above is the description of the structure example. With the use of this structure, a semiconductor device using a transistor including an oxide semiconductor can be miniaturized or highly integrated. Alternatively, a change in electrical characteristics can be inhibited and reliability can be improved in a semiconductor device using a transistor including an oxide semiconductor. Alternatively, a transistor including an oxide semiconductor and having a high on-state current can be provided. Alternatively, a transistor including an oxide semiconductor and having a low off-state current can be provided. Alternatively, a semiconductor device with low power consumption can be provided.

Note that although an example in which the capacitor 100 is provided over the transistor 200 is illustrated in FIG. 18, the semiconductor device described in this embodiment is not limited thereto. For example, a structure may be employed in which a capacitor 100*a* is positioned over a transistor 200*a* and a capacitor 100*b* is positioned below a transistor 200*b* in adjacent memory cells, as illustrated in FIG. 19.

Figure 19:
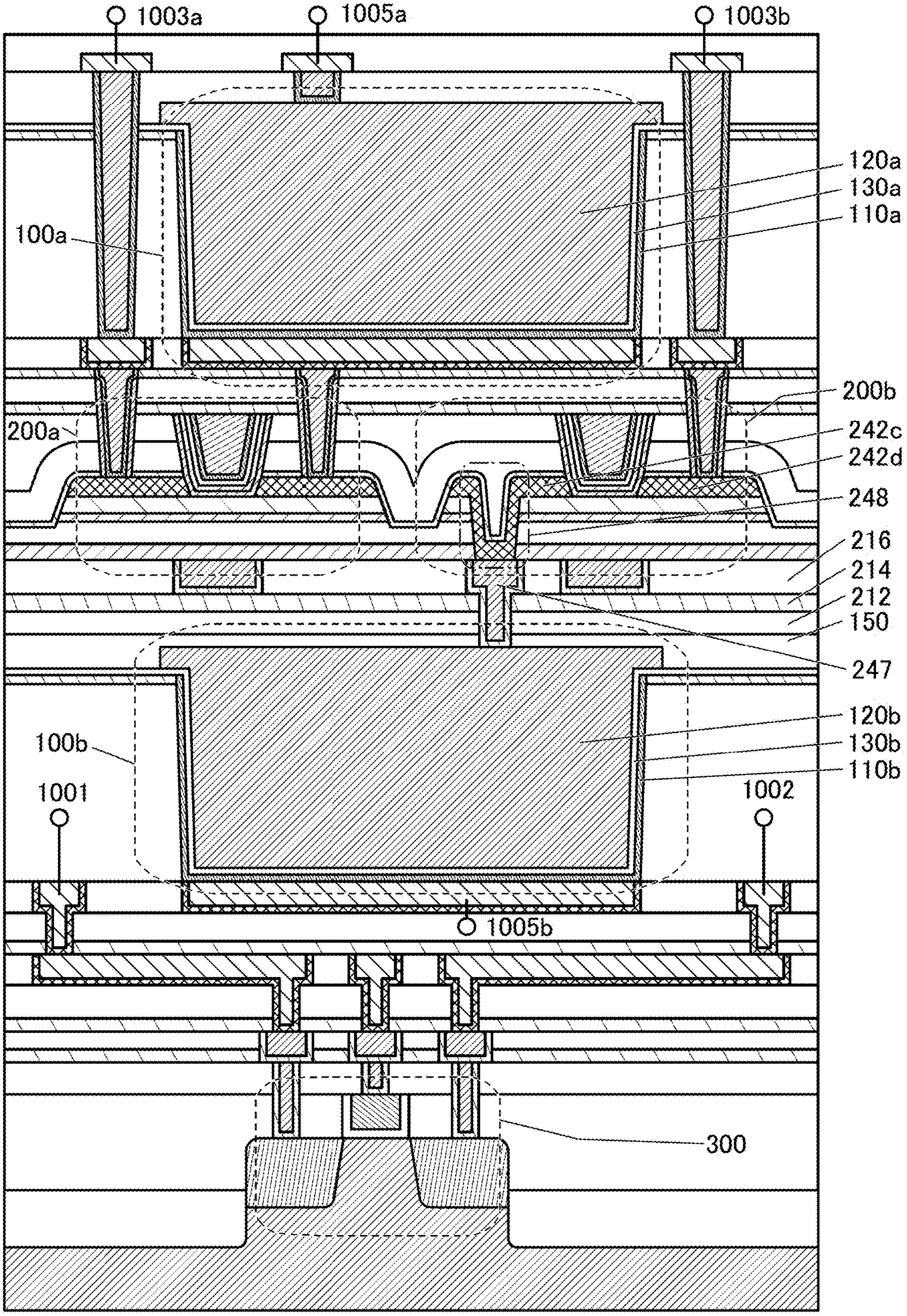
FIG. 19 A cross-sectional view illustrating a structure of a memory device of one embodiment of the present invention.

In the memory device illustrated in FIG. 19, the wiring 1001 is electrically connected to a source of the transistor 300, and the wiring 1002 is electrically connected to a drain of the transistor 300. A wiring 1003*a* is electrically connected to one of a source and a drain of the transistor 200*a*. The other of the source and the drain of the transistor 200*a* is electrically connected to one electrode of the capacitor 100*a*, and a wiring 1005*a* is electrically connected to the other electrode of the capacitor 100*a*. A wiring 1003*b* is electrically connected to one of a source and a drain of the transistor 200*b*. The other of the source and the drain of the transistor 200*b* is electrically connected to one electrode of the capacitor 100*b*, and a wiring 1005*b* is electrically connected to the other electrode of the capacitor 100*b*.

FIG. 19 illustrates the transistor 200*a* and the capacitor 100*a*, and the transistor 200*b* and the capacitor 100*b*, which are included in adjacent memory cells. The transistor 200*a* and the transistor 200*b* each have a structure similar to that of the transistor 200. Note that the transistor 200*b* is different from the transistor 200 in that a conductor 242*c* is in contact with at least part of a top surface of a conductor 247 through an opening 248. Differences from the transistor 200 are described below.

The transistor 200*b* includes the conductor 247 and the opening 248. The conductor 242*c* is in contact with at least part of the top surface of the conductor 247 through the opening 248. By connecting the conductor 242*c* and the conductor 247, electrical resistance between the other of the source and the drain of the transistor 200*b* and the conductor 247 can be reduced.

The conductor 247 is positioned in the opening formed in the insulator 150, the insulator 212, the insulator 214, and the insulator 216. At least part of the top surface of the conductor 247 is exposed from the insulator 216, and the top surface of the conductor 247 is preferably substantially level with the top surface of the insulator 216.

Here, the conductor 247 functions as a plug for electrical connection with the one electrode of the capacitor 100*b* provided in a lower layer than the insulator 212. Note that the conductor 247 may be electrically connected to the gate of the transistor provided in the lower layer than the insulator 212 or electrically connected to a wiring provided in the lower layer than the insulator 212. Note that the conductor 247 may be extended to function as a wiring.

In addition, the opening 248 from which at least part of the conductor 247 is exposed is formed in the insulator 222, the insulator 224, the oxide 230*a*, and the oxide 230*b*.

Although the conductor 247 is provided below the conductor 242*c* in FIG. 19, the semiconductor device described in this embodiment is not limited thereto. For example, the conductor 247 may be provided below the conductor 242*d* or the conductor 247 may be provided below both of the conductor 242*c* and the conductor 242*d*.

The capacitor 100*a* and the capacitor 100*b* have the same structure as the capacitor 100. In other words, the capacitor 100*a* includes a conductor 110*a*, an insulator 130*a*, and a conductor 120*a*, and the capacitor 100*b* includes a conductor 110*b*, an insulator 130*b*, and a conductor 120*b*. The conductor 110*a* and the conductor 110*b* have the same structure as the conductor 110. The insulator 130*a* and the insulator 130*b* have the same structure as the insulator 130. The conductor 120*a* and the conductor 120*b* have the same structure as the conductor 120.

Here, the capacitor 100*a* preferably overlaps with the transistor 200*a* and the transistor 200*b* for example, the capacitor 100*a* preferably overlaps with the channel formation region of the transistor 200*a* and the channel formation region of the transistor 200*b*. Furthermore, the capacitor 100*b* preferably overlaps with the transistor 200*a* and the transistor 200*b*; for example, the capacitor 100*b* preferably overlaps with the channel formation region of the transistor 200*a* and the channel formation region of the transistor 200*b*.

By providing the capacitor 100*a* and the capacitor 100*b* in this manner, the capacitance of the capacitor 100*a* and the capacitor 100*b* can be increased without increasing the area occupied by the capacitor 100*a*, the capacitor 100*b*, the transistor 200*a*, and the transistor 200*b* in a top view. As a result, the semiconductor device of this embodiment can be miniaturized or highly integrated.

Figure 20:
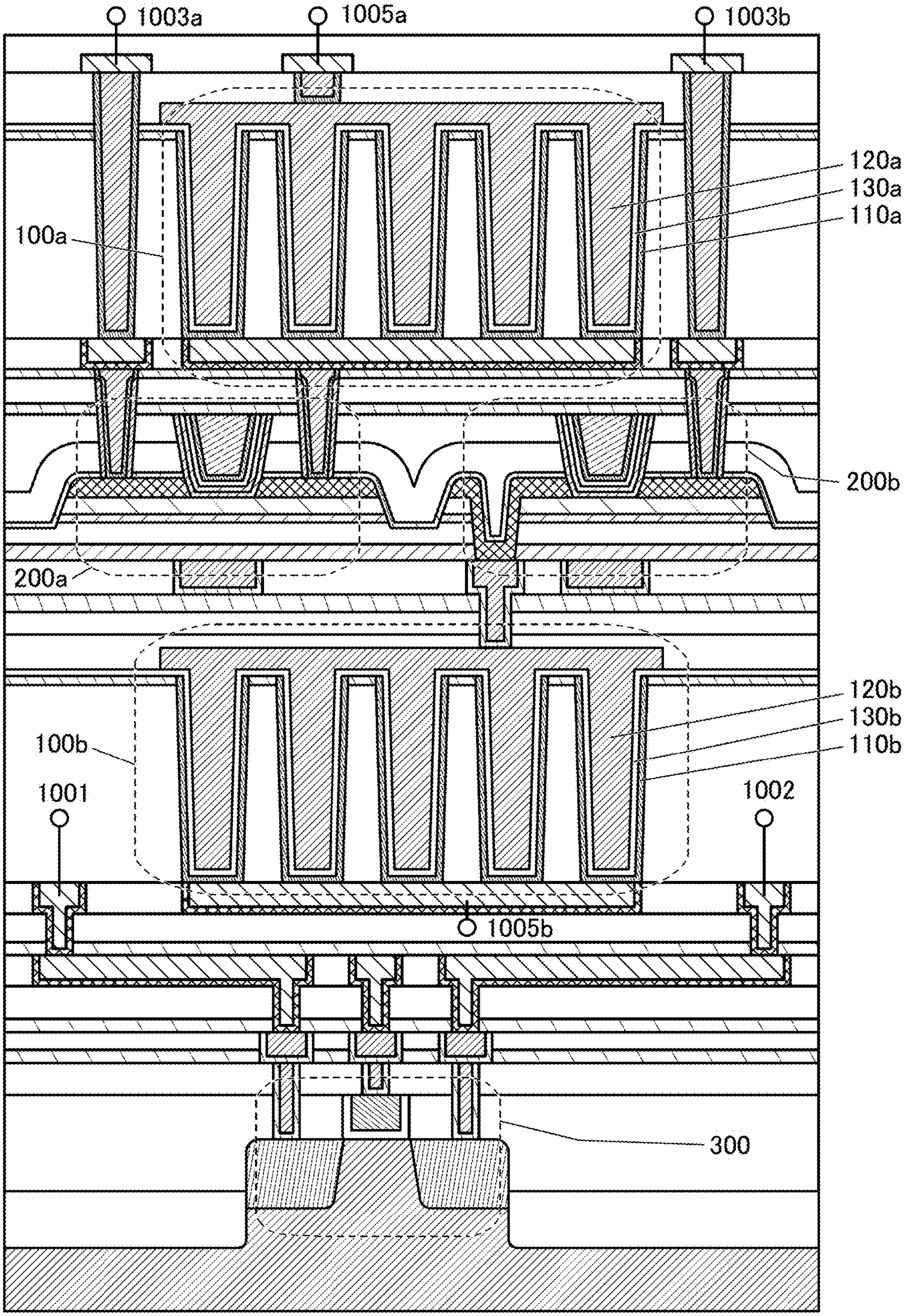
FIG. 20 A cross-sectional view illustrating a structure of a memory device of one embodiment of the present invention.

As illustrated in FIG. 20, a plurality of openings in which the capacitor 100*a* and capacitor 100*b* are provided may be provided. The conductor 110*a* may be separately provided by each opening. Similarly, the conductor 110*b* may be separated to be provided by each opening. Thus, the capacitor 100*a* and the capacitor 100*b* can be formed on the side surface of each opening. Accordingly, the capacitor 100*a* and the capacitor 100*b* illustrated in FIG. 20 can have larger capacitance than the capacitor 100*a* and the capacitor 100*b* in FIG. 19 while the area occupied can be approximately the same.

Although FIG. 19 and FIG. 20 each illustrate the example in which the capacitor 100*a* and the capacitor 100*b* are provided above and under the transistor 200*a* and the transistor 200*b*, respectively, the semiconductor device described in this embodiment is not limited thereto. For example, a structure may be employed in which the capacitor 100*a* and the transistor 200*a* are not provided and the capacitor 100*b* and the transistor 200*b* are provided. Note that it is preferable that at least part of the capacitor 100*b* or the transistor 300 overlap with the transistor 200*b*. In that case, the area occupied by the capacitor 100*b*, the transistor 200*b*, and the transistor 300 in the top view can be reduced, whereby the semiconductor device of this embodiment can be miniaturized or highly integrated.

In the manufacturing process of the capacitor 100*b*, high-temperature heat treatment of higher than 700° C. is needed in some cases. When such a high-temperature heat treatment is performed after the formation of the transistor 200*b*, the oxide 230 might be affected by the diffusion of oxygen or impurities such as hydrogen or water, which might degrade the electrical characteristics of the transistor 200*b*.

However, when the transistor 200*b* is formed over the capacitor 100*b* as described in this modification example, the thermal budget in the manufacturing process of the capacitor 100*b* does not affect the transistor 200*b*. Thus, degradation in electrical characteristics of the transistor 200*b* can be prevented and a semiconductor device having stable electrical characteristics can be provided.

[Memory Device 2]

Figure 21:
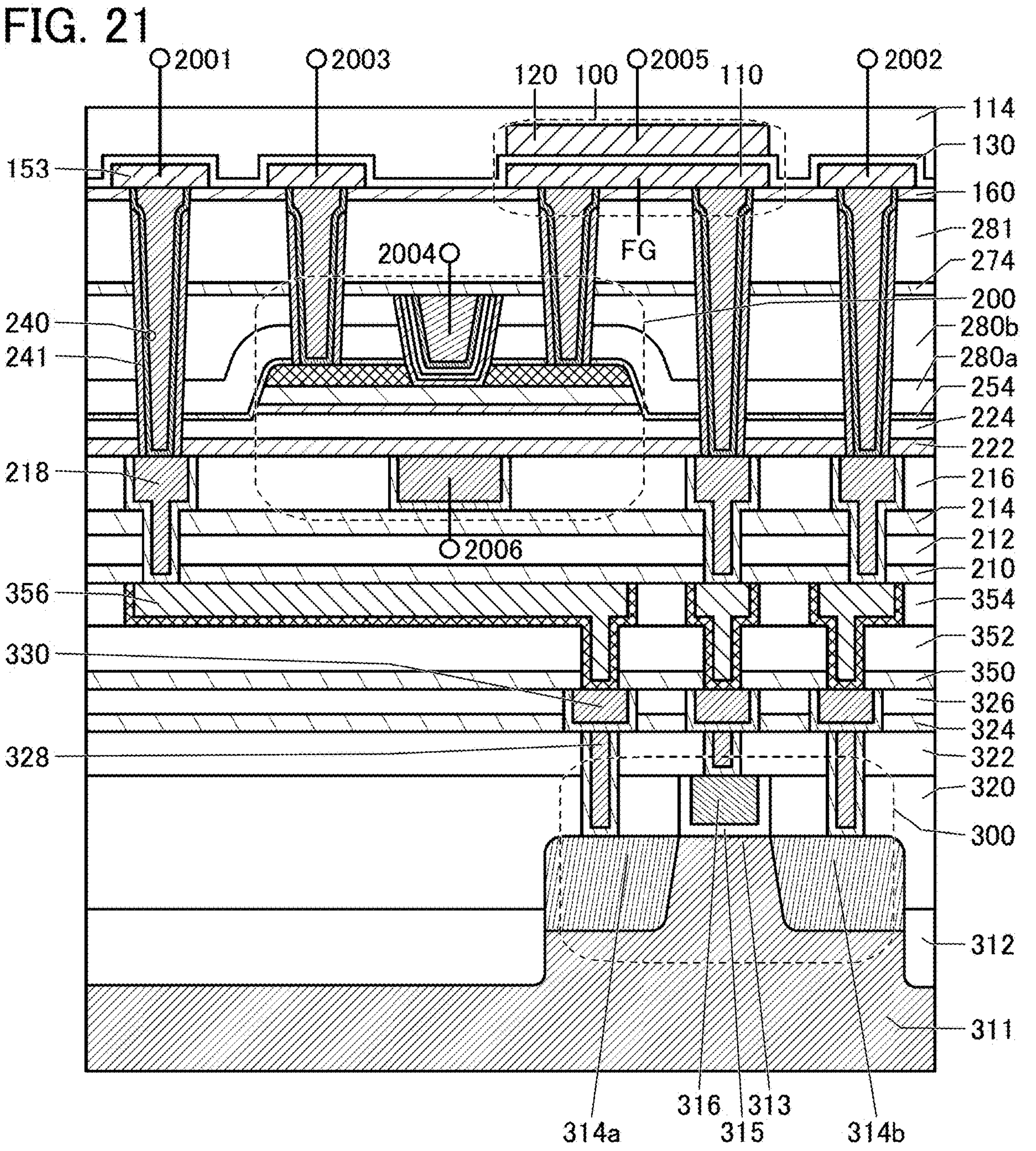
FIG. 21 A cross-sectional view illustrating a structure of a memory device of one embodiment of the present invention.

FIG. 21 shows an example of a semiconductor device (memory device) using the semiconductor device of one embodiment of the present invention. Like the semiconductor device illustrated in FIG. 18, the semiconductor device illustrated in FIG. 21 includes the transistor 200, the transistor 300, and the capacitor 100. Note that the semiconductor device in FIG. 21 differs from the semiconductor device in FIG. 18 in that the capacitor 100 is a planar capacitor and that the transistor 200 is electrically connected to the transistor 300.

In the semiconductor device of one embodiment of the present invention, the transistor 200 is provided above the transistor 300, and the capacitor 100 is provided above the transistor 300 and the transistor 200. Preferably, at least part of the capacitor 100 or the transistor 300 overlaps with the transistor 200. Accordingly, the area occupied by the capacitor 100, the transistor 200, and the transistor 300 in a top view can be reduced, whereby the semiconductor device of this embodiment can be miniaturized or highly integrated.

Note that the transistor 200 and the transistor 300 mentioned above can be used as the transistor 200 and the transistor 300, respectively. Therefore, the above description can be referred to for the transistor 200, the transistor 300, and the layers including them.

In the semiconductor device illustrated in FIG. 21, a wiring 2001 is electrically connected to the source of the transistor 300, and a wiring 2002 is electrically connected to the drain of the transistor 300. A wiring 2003 is electrically connected to one of the source and the drain of the transistor 200, a wiring 2004 is electrically connected to a first gate of the transistor 200, and a wiring 2006 is electrically connected to a second gate of the transistor 200. A gate of the transistor 300 and the other of the source and the drain of the transistor 200 are electrically connected to one electrode of the capacitor 100, and a wiring 2005 is electrically connected to the other electrode of the capacitor 100. Note that a node where the gate of the transistor 300, the other of the source and the drain of the transistor 200, and the one electrode of the capacitor 100 are connected to one another is hereinafter referred to as a node FG in some cases.

The semiconductor device in FIG. 21 is capable of retaining the potential of the gate of the transistor 300 (the node FG) by switching of the transistor 200; thus, data writing, retention, and reading can be performed.

By arranging the semiconductor devices illustrated in FIG. 21 in a matrix, a memory cell array can be formed.

The layer including the transistor 300 has the same structure as that in the semiconductor device illustrated in FIG. 18, and therefore the above description can be referred to for the structure below the insulator 354.

The insulator 210, the insulator 212, the insulator 214, and the insulator 216 are positioned over the insulator 354. Here, an insulator having a function of inhibiting the passage of oxygen and impurities such as hydrogen is used as the insulator 210, like the insulator 350 and the like.

The conductor 218 is embedded in the insulator 210, the insulator 212, the insulator 214, and the insulator 216. The conductor 218 functions as a plug or a wiring that is electrically connected to the capacitor 100, the transistor 200, or the transistor 300. For example, the conductor 218 is electrically connected to the conductor 316 functioning as the gate electrode of the transistor 300.

Note that the conductor 240 functions as a plug or a wiring that is electrically connected to the transistor 200 or the transistor 300. For example, the conductor 240 electrically connects the conductor 242*b* functioning as the other of the source and the drain of the transistor 200 and the conductor 110 functioning as one electrode of the capacitor 100 through the conductor 240.

The planar capacitor 100 is provided above the transistor 200. The capacitor 100 includes the conductor 110 functioning as a first electrode, the conductor 120 functioning as a second electrode, and the insulator 130 functioning as a dielectric. Note that as the conductor 110, the conductor 120, and the insulator 130, those described above in Memory device 1 can be used.

The conductor 153 and the conductor 110 are provided in contact with the top surface of the conductor 240. The conductor 153 is in contact with the top surface of the conductor 240 and functions as a terminal of the transistor 200 or the transistor 300.

The conductor 153 and the conductor 110 are covered with the insulator 130, and the conductor 120 is positioned to overlap the conductor 110 with the insulator 130 therebetween. In addition, the insulator 114 is positioned over the conductor 120 and the insulator 130.

Although FIG. 21 illustrates an example in which a planar capacitor is used as the capacitor 100, the semiconductor device of this embodiment is not limited thereto. For example, as illustrated in FIG. 22, the capacitor 100 may be a cylinder capacitor 100 like that illustrated in FIG. 18.

Here, the description of FIG. 18 can be referred to for the details of the capacitor 100. As illustrated in FIG. 22, the conductor 152 is preferably positioned over the conductor 240, and the conductor 112 is preferably positioned over the conductor 152. Such a structure 30 enables the conductor 240 to be electrically connected to the conductor 112 with more certainty.

The insulator 154 is preferably positioned over the insulator 150. An insulator that can be used as the insulator 160 can be used as the insulator 154. The conductor 153 is provided in contact with the top surface of the conductor 112. Here, the conductor 153 is in contact with the top surface of the conductor 112 and functions as a terminal of the capacitor 100, the transistor 200, or the transistor 300. In addition, the insulator 156 is provided over the conductor 153 and the insulator 154.

Figure 22:
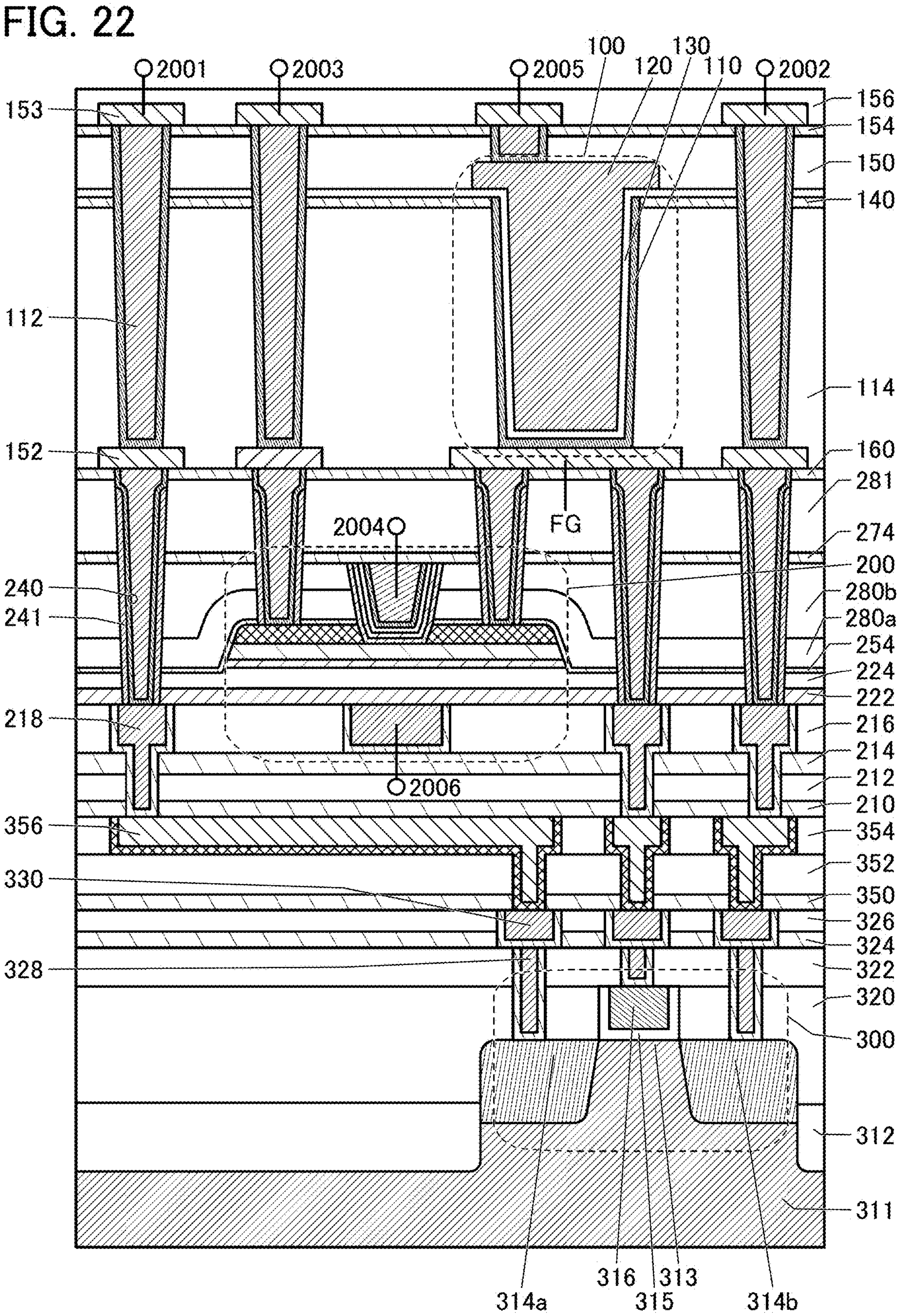
FIG. 22 A cross-sectional view illustrating a structure of a memory device of one embodiment of the present invention.
Figure 23:
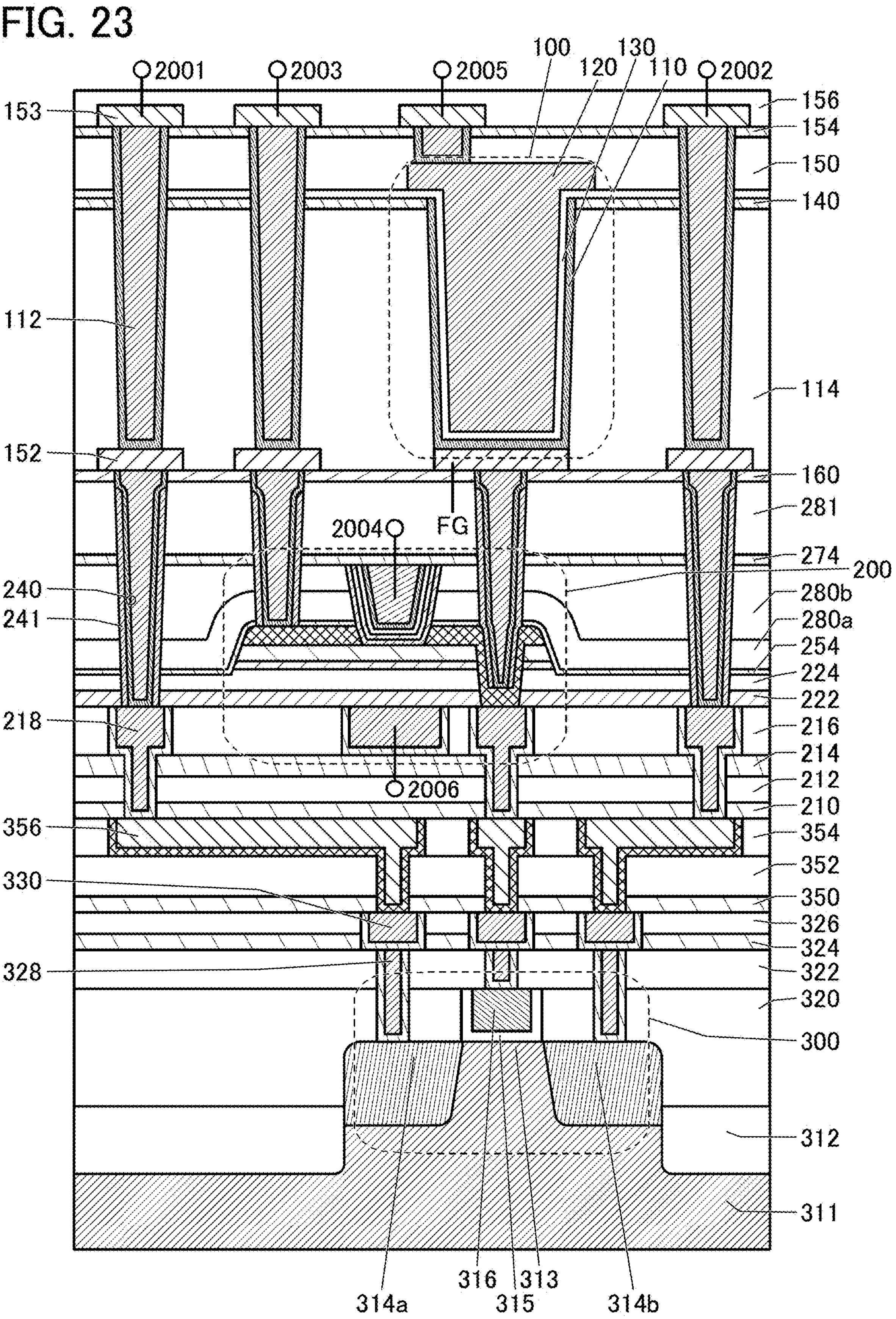
FIG. 23 A cross-sectional view illustrating a structure of a memory device according to one embodiment of the present invention.

FIG. 22 illustrates an example in which the gate of the transistor 300 is electrically connected to the other of the source and the drain of the transistor 200 through one electrode of the capacitor 100; however, the semiconductor device of this embodiment is not limited thereto. For example, as illustrated in FIG. 23, the gate of the transistor 300 may be electrically connected to the one electrode of the capacitor 100 through the other of the source and the drain of the transistor 200. Accordingly, the area occupied by the capacitor 100, the transistor 200, and the transistor 300 in a top view can be reduced, whereby the semiconductor device of this embodiment can be miniaturized or highly integrated.

This embodiment can be implemented in combination with any of the structures described in the other embodiments and the like, as appropriate.

Embodiment 4

In this embodiment, a memory device of one embodiment of the present invention including a transistor in which oxide is used as a semiconductor (hereinafter referred to as an OS transistor in some cases) and a capacitor (hereinafter such a memory device is also referred to as an OS memory device in some cases) will be described with reference to FIG. 24 and FIG. 25. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 24A:
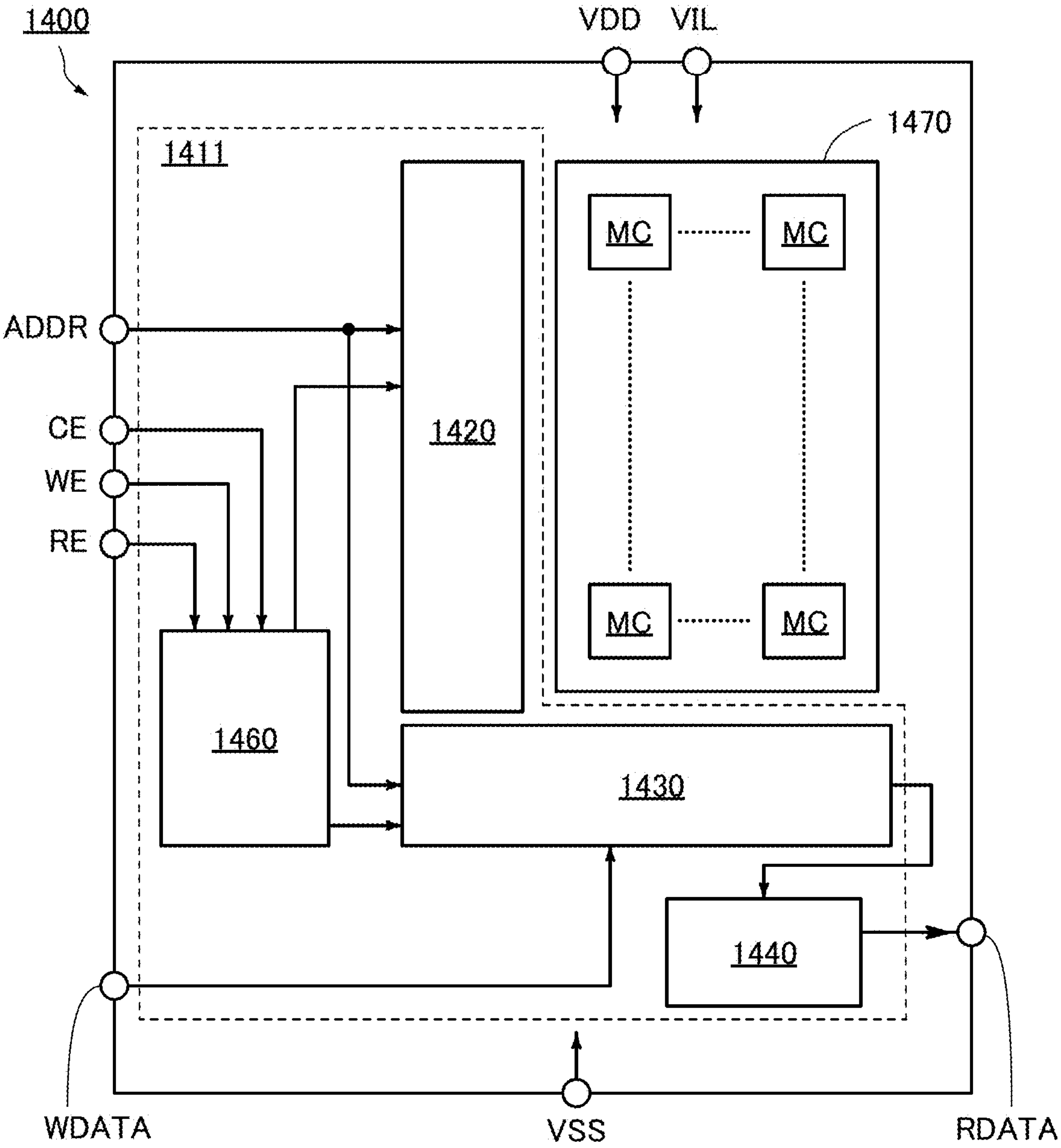
FIGS. 24A and 24B A block diagram and a perspective view illustrating a structure example of a memory device of one embodiment of the present invention.

FIG. 24(A) illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and will be described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and WDATA is input to the write circuit.

The control logic circuit 1460 processes the signals (CE, WE, and RE) input from the outside, and generates control signals for the row decoder and the column decoder. CE denotes a chip enable signal, WE denotes a write enable signal, and RE denotes a read enable signal. Signals processed by the control logic circuit 1460 are not limited thereto, and other control signals may be input as necessary.

The memory cell array 1470 includes a plurality of memory cells MC arranged in a matrix and a plurality of wirings. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 24B:
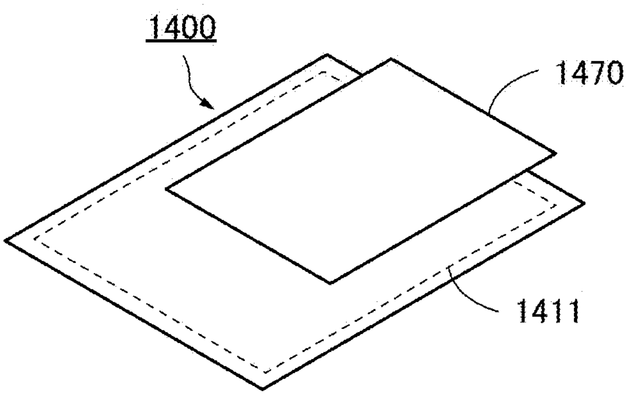

Note that FIG. 24(A) illustrates an example in which the peripheral circuit 1411 and the memory cell array 1470 are formed on the same plane; however, this embodiment is not limited thereto. For example, as illustrated in FIG. 24(B), the memory cell array 1470 may be provided over the peripheral circuit 1411 to partly overlap with the peripheral circuit 1411. For example, the sense amplifier may be provided below the memory cell array 1470 so that they overlap with each other.

FIG. 25 illustrate structure examples of memory cells applicable to the memory cell MC.

[DOSRAM]

Figure 25A:
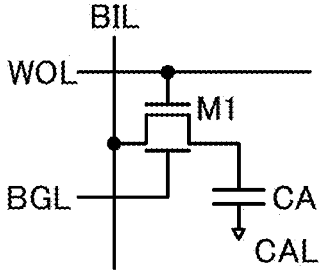
FIGS. 25A to 25H Circuit diagrams illustrating structure examples of a memory device of one embodiment of the present invention.
Figure 25B:
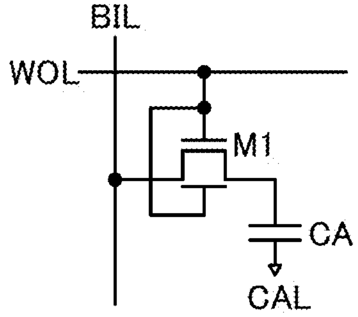
Figure 25C:
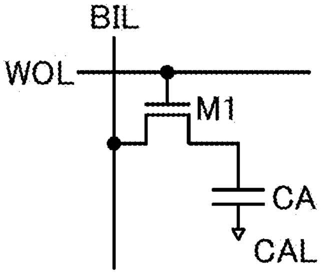

FIG. 25(A) to FIG. 25(C) each illustrate a circuit structure example of a DRAM memory cell. In this specification and the like, a DRAM using a memory cell including one OS transistor and one capacitor is sometimes referred to as a DOSRAM (Dynamic Oxide Semiconductor Random Access Memory). A memory cell 1471 illustrated in FIG. 25(A) includes a transistor M1 and a capacitor CA. Note that the transistor M1 includes a gate (also referred to as a top gate in some cases) and a back gate.

A first terminal of the transistor M1 is connected to a first terminal of the capacitor CA. A second terminal of the transistor M1 is connected to a wiring BIL. A gate of the transistor M1 is connected to a wiring WOL. A back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

Here, the memory cell 1471 illustrated in FIG. 25(A) corresponds to the memory device illustrated in FIG. 18. That is, the transistor M1, the capacitor CA, the wiring BIL, the wiring WOL, the wiring BGL, and the wiring CAL correspond to the transistor 200, the capacitor 100, the wiring 1003, the wiring 1004, the wiring 1006, and the wiring 1005, respectively. Note that the transistor 300 illustrated in FIG. 18 corresponds to a transistor provided in the peripheral circuit 1411 of the memory device 1400 illustrated in FIG. 24(B).

The memory cell MC is not limited to the memory cell 1471, and the circuit structure can be changed. For example, as in a memory cell 1472 illustrated in FIG. 25(B), the back gate of the transistor M1 may be connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 illustrated in FIG. 25(C).

In the case where the semiconductor device described in the above embodiment is used in the memory cell 1471 or the like, the transistor 200 can be used as the transistor M1, and the capacitor 100 can be used as the capacitor CA. The use of an OS transistor as the transistor M1 enables the leakage current of the transistor M1 to be extremely low. That is, written data can be retained for a long time with the transistor M1; thus, the frequency of refresh of the memory cell can be reduced. Alternatively, the refresh operation of the memory cell can be omitted. In addition, the extremely low leakage current allows multi-level data or analog data to be retained in the memory cell 1471, the memory cell 1472, or the memory cell 1473.

In addition, in the DOSRAM, when the sense amplifier is provided below the memory cell array 1470 to overlap with the memory cell array 1470 as described above, the bit line can be shortened. This reduces bit line capacity, which reduces the storage capacity of the memory cell.

[NOSRAM]

FIGS. 25(D) to 25(G) each illustrate a circuit structure example of a gain-cell memory cell including two transistors and one capacitor. A memory cell 1474 illustrated in FIG. 25(D) includes a transistor M2, a transistor M3, and a capacitor CB. Note that the transistor M2 includes a top gate (simply referred to as a gate in some cases) and a back gate. In this specification and the like, a memory device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to the wiring RBL, a second terminal of the transistor M3 is connected to the wiring SL, and a gate of the transistor M3 is connected to the first terminal of the capacitor CB.

The wiring WBL functions as a write bit line. The wiring RBL functions as a read bit line. The wiring WOL functions as a word line. The wiring CAL functions as a wiring for applying a predetermined potential to the second terminal of the capacitor CB. During data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

Figure 25D:
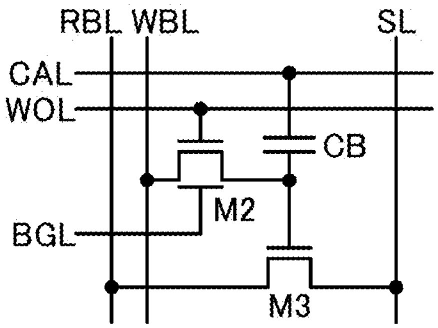
Figure 25E:
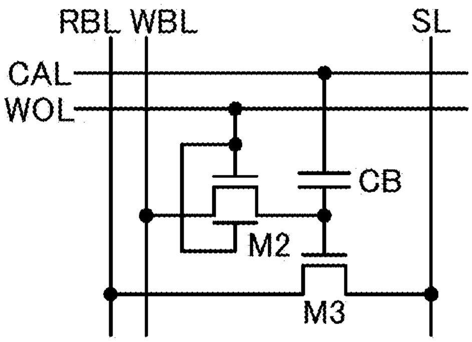
Figure 25F:
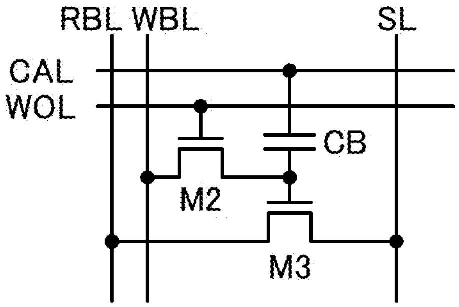
Figure 25G:
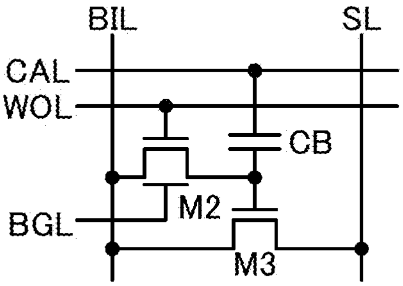

Here, the memory cell 1474 illustrated in FIG. 25(D) corresponds to the memory device illustrated in FIG. 21. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 2003, the wiring 2004, the wiring 2006, the wiring 2005, the wiring 2002, and the wiring 2001, respectively.

The memory cell MC is not limited to the memory cell 1474, and the circuit structure can be changed as appropriate. For example, as in a memory cell 1475 illustrated in FIG. 25(E), a structure may be employed in which the back gate of the transistor M2 is connected not to the wiring BGL but to the wiring WOL in the memory cell MC. Alternatively, for example, like a memory cell 1476 illustrated in FIG. 25(F), the memory cell MC may be a memory cell including a single-gate transistor, that is, the transistor M2 that does not include a back gate. Alternatively, for example, like a memory cell 1477 illustrated in FIG. 25(G), the memory cell MC may have a structure where the wiring WBL and the wiring RBL are combined into one wiring BIL.

In the case where the semiconductor device described in the above embodiment is used in the memory cell 1474 or the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, written data can be retained for a long time with the transistor M2; thus, the frequency of refresh of the memory cell can be reduced. Alternatively, the refresh operation of the memory cell can be omitted. In addition, the extremely low leakage current allows multi-level data or analog data to be retained in the memory cell 1474. The same applies to the memory cell 1475 to the memory cell 1477.

Note that the transistor M3 may be a transistor containing silicon in a channel formation region (hereinafter such a transistor is referred to as a Si transistor in some cases). The conductivity type of the Si transistor may be either an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the memory device can be achieved.

Alternatively, the transistor M3 may be an OS transistor. When OS transistors are used as the transistor M2 and the transistor M3, the circuit of the memory cell array 1470 can be formed using only n-channel transistors.

Figure 25H:
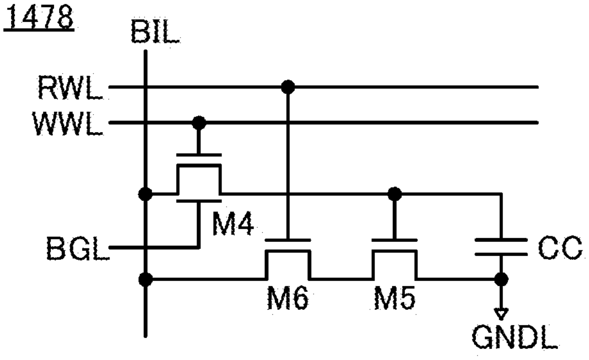

In addition, FIG. 25(H) illustrates an example of a gain-cell memory cell including three transistors and one capacitor. A memory cell 1478 illustrated in FIG. 25(H) includes a transistor M4 to a transistor M6 and a capacitor CC. The capacitor CC is provided as appropriate. The memory cell 1478 is electrically connected to a wiring BIL, a wiring RWL, a wiring WWL, a wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors, in which case the circuit of the memory cell array 1470 can be formed using only n-channel transistors.

In the case where the semiconductor device described in the above embodiment is used in the memory cell 1478, the transistor 200 can be used as the transistor M4, the transistors 300 can be used as the transistor M5 and the transistor M6, and the capacitor 100 can be used as the capacitor CC. The use of an OS transistor as the transistor M4 enables the leakage current of the transistor M4 to be extremely low.

Note that the structures of the peripheral circuit 1411, the memory cell array 1470, and the like described in this embodiment are not limited to those described above. The arrangement and functions of these circuits and the wirings, circuit components, and the like connected to the circuits can be changed, removed, or added as needed.

The structure described in this embodiment can be used in an appropriate combination with the structures described in the other embodiments and the like.

Embodiment 5

In this embodiment, an example of a chip 1200 on which the semiconductor device of the present invention is mounted will be described with reference to FIG. 26. A plurality of circuits (systems) are mounted on the chip 1200. The technique for integrating a plurality of circuits (systems) on one chip as described above is referred to as system on chip (SoC) in some cases.

Figure 26A:
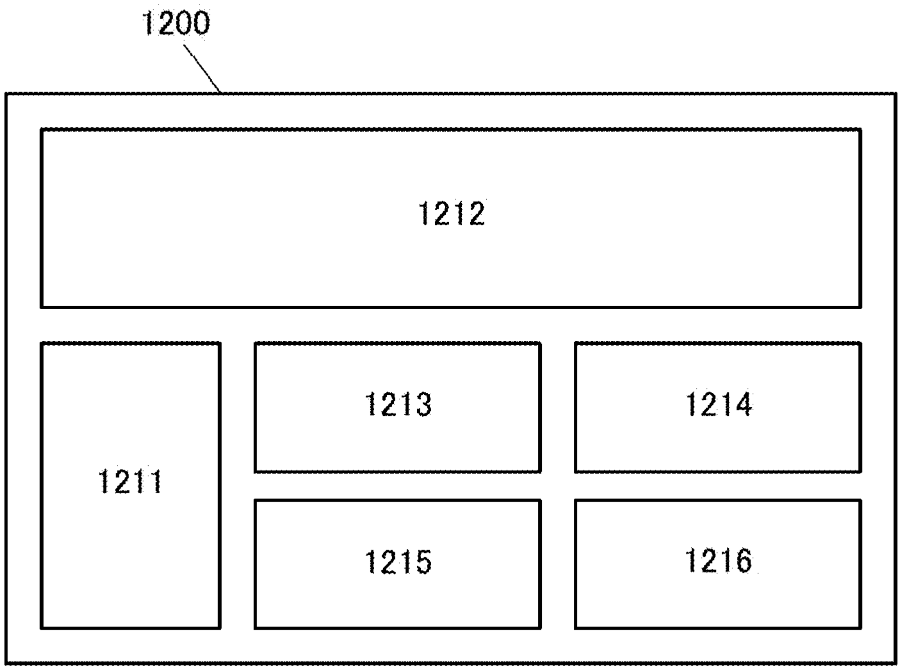
FIGS. 26A and 26B Schematic views of a semiconductor device of one embodiment of the present invention.

As illustrated in FIG. 26(A), the chip 1200 includes a CPU 1211, a GPU 1212, one or more of analog arithmetic units 1213, one or more of memory controllers 1214, one or more of interfaces 1215, one or more of network circuits 1216, and the like.

Figure 26B:
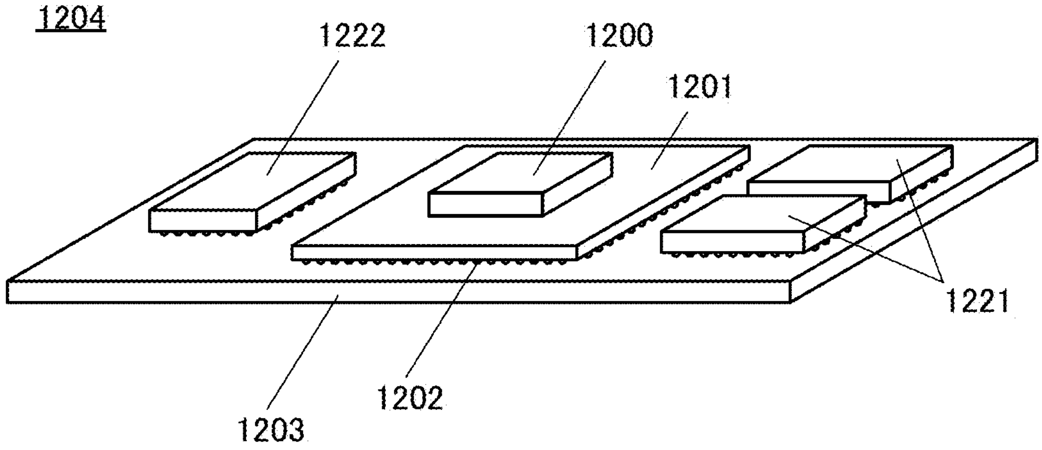

A bump (not illustrated) is provided on the chip 1200, and as illustrated in FIG. 26(B), the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can execute a method in a deep neural network (DNN), a convolutional neural network (CNN), a recurrent neural network (RNN), an autoencorder, a deep Boltzmann machine (DBM), a deep belief network (DBN), or the like; thus, the chip 1200 can be used as an AI chip or the GPU module 1204 can be used as an AI system module.

The structure described in this embodiment can be used in an appropriate combination with the structures described in the other embodiments and the like.

Embodiment 6

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 27 schematically illustrates some structure examples of removable memory devices. The semiconductor device described in the above embodiment is processed into a packaged memory chip and used in a variety of storage devices and removable memories, for example.

Figure 27A:
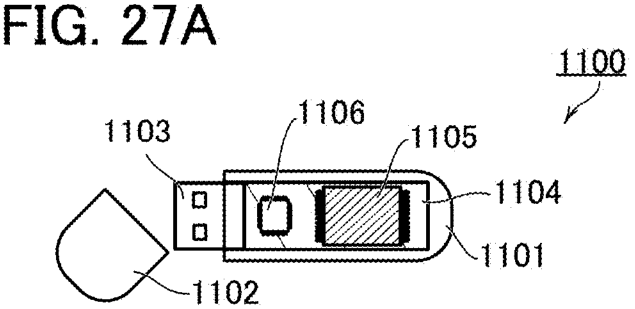
FIGS. 27A to 27E Schematic views of memory devices of one embodiment of the present invention.

FIG. 27(A) is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

Figure 27B:
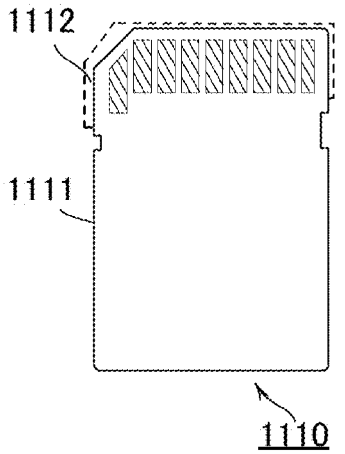
Figure 27C:
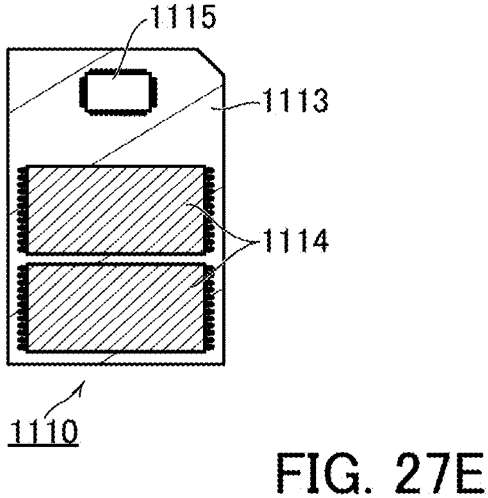

FIG. 27(B) is a schematic external view of an SD card, and FIG. 27(C) is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

Figure 27D:
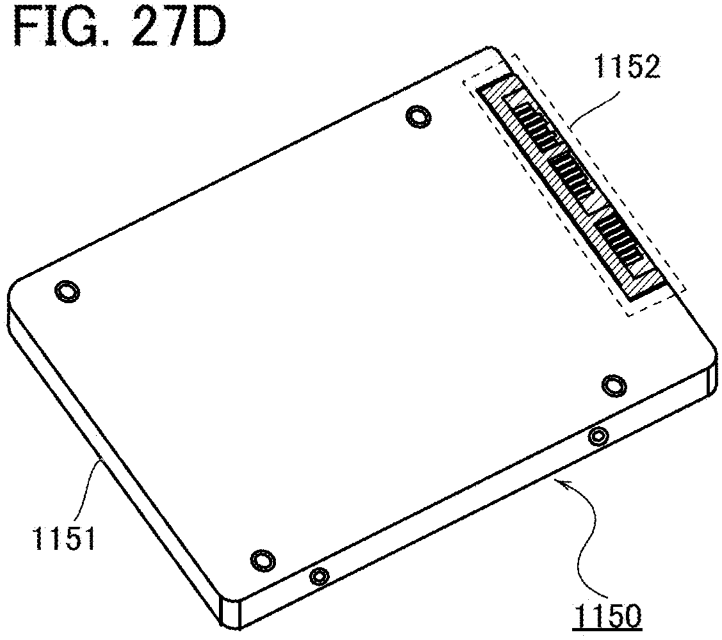
Figure 27E:
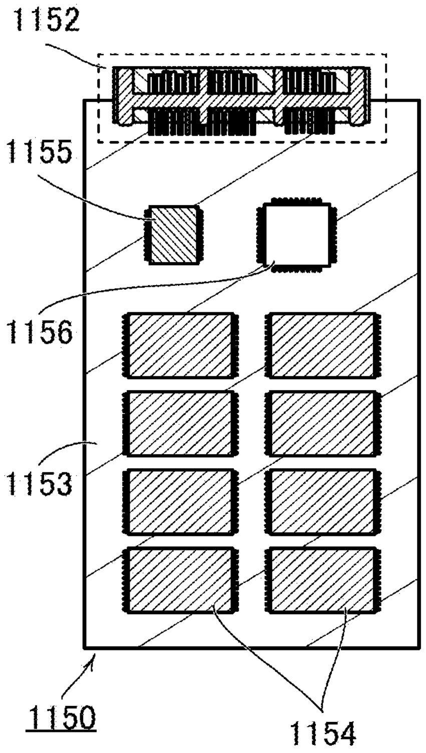

FIG. 27(D) is a schematic external view of an SSD, and FIG. 27(E) is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like on the substrate 1153.

This embodiment can be implemented in combination with any of the structures described in the other embodiments and the like, as appropriate.

Embodiment 7

The semiconductor device of one embodiment of the present invention can be used for a chip or a processor such as a CPU or a GPU. FIG. 28 illustrates specific examples of electronic devices including a processor such as a CPU or a GPU or a chip of one embodiment of the present invention.

<Electronic Device and System>

The GPU or the chip of one embodiment of the present invention can be incorporated into a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. When the GPU or the chip of one embodiment of the present invention is provided in an electronic device, the electronic device can include artificial intelligence.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 28 illustrates examples of electronic devices.

[Information Terminal]

Figure 28A:
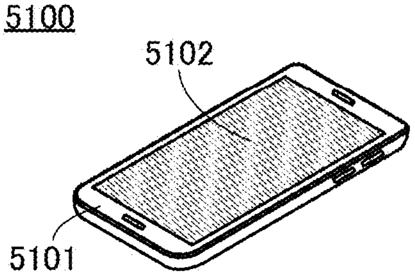
FIGS. 28A to 28H Diagrams illustrating electronic devices of one embodiment of the present invention.

FIG. 28(A) illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

The information terminal 5100 can execute an application utilizing artificial intelligence, with the use of the chip of one embodiment of the present invention. Examples of the application utilizing artificial intelligence include an application for interpreting a conversation and displaying its content on the display portion 5102; an application for recognizing letters, figures, and the like input to the touch panel of the display portion 5102 by a user and displaying them on the display portion 5102; and an application for biometric authentication using fingerprints, voice prints, or the like.

Figure 28B:
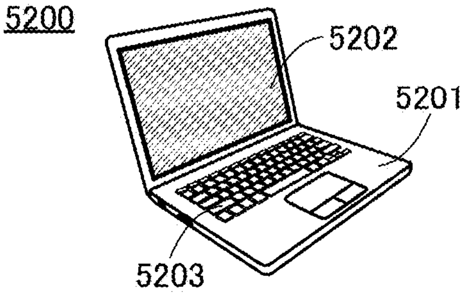

FIG. 28(B) illustrates a notebook information terminal 5200. The notebook information terminal 5200 includes a main body 5201 of the information terminal, a display portion 5202, and a keyboard 5203.

Like the information terminal 5100 described above, the notebook information terminal 5200 can execute an application utilizing artificial intelligence, with the use of the chip of one embodiment of the present invention. Examples of the application utilizing artificial intelligence include design-support software, text correction software, and software for automatic menu generation. Furthermore, with the use of the notebook information terminal 5200, novel artificial intelligence can be developed.

Note that although the smartphone and the notebook information terminal are respectively illustrated in FIG. 28(A) and FIG. 28(B) as examples of the electronic device, one embodiment of the present invention can be applied to an information terminal other than the smartphone and the notebook information terminal. Examples of an information terminal other than the smartphone and the notebook information terminal include a PDA (Personal Digital Assistant), a desktop information terminal, and a workstation.

[Game Machine]

Figure 28C:
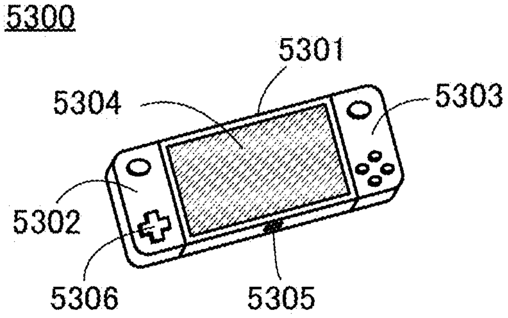

FIG. 28(C) illustrates a portable game machine 5300, which is an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), a video to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into a chip provided on a substrate in the housing 5301, the housing 5302, and the housing 5303, for example.

Figure 28D:
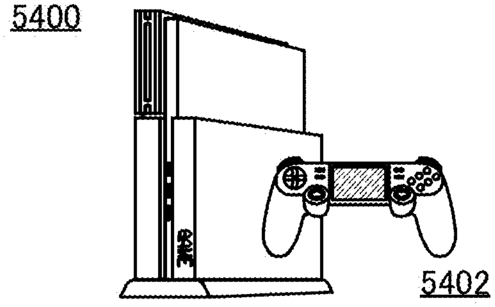

FIG. 28(D) illustrates a stationary game machine 5400, which is an example of a game machine. A controller 5402 is connected to the stationary game machine 5400 with or without a wire.

Using the GPU or the chip of one embodiment of the present invention in a game machine such as the portable game machine 5300 and the stationary game machine 5400 can achieve a low-power-consumption game machine. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5300, the portable game machine 5300 including artificial intelligence can be obtained.

In general, the progress of a game, the actions and words of game characters, and expressions of a phenomenon and the like in the game are determined by the program in the game; however, the use of artificial intelligence in the portable game machine 5300 enables expressions not limited by the game program. For example, questions posed by the player, the progress of the game, timing when an event occurs in the game, the actions and words of the game characters, and the like can be changed for various expressions without being limited by the game program.

When a game requiring a plurality of players is played on the portable game machine 5300, the artificial intelligence can create a virtual game player; thus, the game can be played alone with the game player created by the artificial intelligence as an opponent.

Although the portable game machine and the stationary game machine are respectively illustrated in FIG. 28(C) and FIG. 28(D) as examples of a game machine, the game machine using the GPU or the chip of one embodiment of the present invention is not limited thereto. Examples of the game machine using the GPU or the chip of one embodiment of the present invention include an arcade game machine installed in entertainment facilities (a game center, an amusement park, and the like) and a throwing machine for batting practice installed in sports facilities.

[Large Computer]

The GPU or the chip of one embodiment of the present invention can be used in a large computer.

Figure 28E:
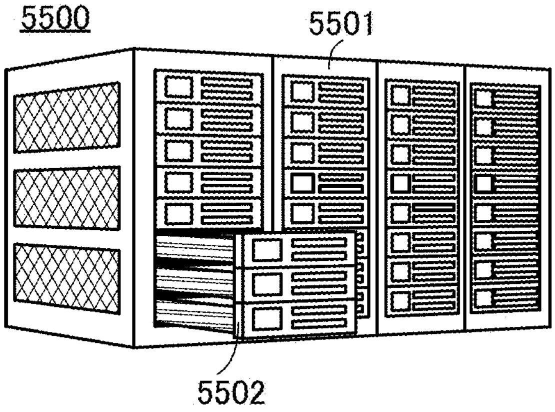
Figure 28F:
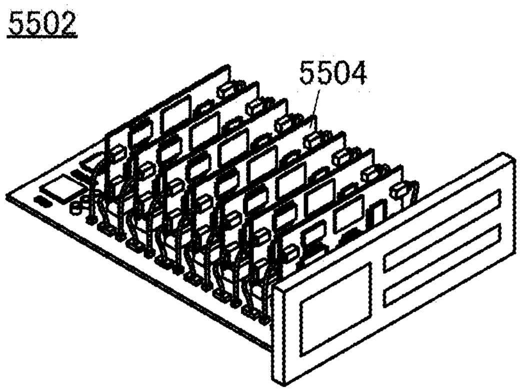

FIG. 28(E) illustrates a supercomputer 5500 as an example of a large computer. FIG. 28(F) illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504, and the GPU or the chip described in the above embodiment can be mounted on the substrates.

The supercomputer 5500 is a large computer mainly used for scientific computation. In scientific computation, an enormous amount of arithmetic operation needs to be processed at a high speed; hence, power consumption is high and chips generate a large amount of heat. Using the GPU or the chip of one embodiment of the present invention in the supercomputer 5500 can achieve a low-power-consumption supercomputer. Moreover, heat generation from a circuit can be reduced owing to low power consumption; thus, the influence of heat generation on the circuit, the peripheral circuit, and the module can be reduced.

Although a supercomputer is illustrated as an example of a large computer in FIG. 28(E) and FIG. 28(F), a large computer using the GPU or the chip of one embodiment of the present invention is not limited thereto. Examples of a large computer using the GPU or the chip of one embodiment of the present invention include a computer that provides service (a server) and a large general-purpose computer (a mainframe).

[Moving Vehicle]

The GPU or the chip of one embodiment of the present invention can be used in an automobile, which is a moving vehicle, and around a driver's seat in the automobile.

Figure 28G:
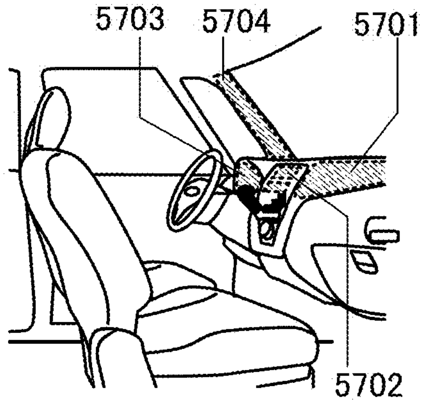

FIG. 28(G) illustrates the periphery of a windshield inside an automobile, which is an example of a moving vehicle. FIG. 28(G) illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, a mileage, a fuel meter, a gear-shift indicator, air-condition setting, and the like. The content, layout, or the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (a blind spot) by showing an image taken by an imaging device (not illustrated) provided on the outside of the automobile. That is, displaying an image taken by the imaging device provided on the outside of the automobile leads to compensation for the blind spot and enhancement of safety. In addition, showing an image for compensating for the area that cannot be seen makes it possible to confirm the safety more naturally and comfortably. The display panel 5704 can also be used as a lighting device.

Since the GPU or the chip of one embodiment of the present invention can be used as a component of artificial intelligence, the chip can be used in an automatic driving system of the automobile, for example. The chip can also be used for a system for navigation, risk prediction, or the like. The display panel 5701 to the display panel 5704 may display information regarding navigation, risk prediction, or the like.

Although an automobile is described above as an example of a moving vehicle, a moving vehicle is not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Electrical Appliance]

Figure 28H:
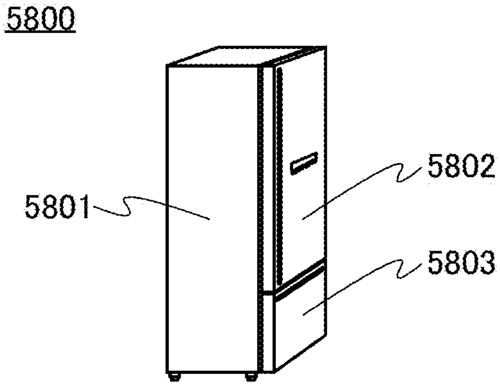

FIG. 28(H) illustrates an electric refrigerator-freezer 5800, which is an example of an electrical appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting the temperature to be appropriate for the foods stored in the electric refrigerator-freezer 5800, and the like.

Although the electric refrigerator-freezer is described as an example of an electrical appliance, other examples of an electrical appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, application examples of artificial intelligence and its effects, and the like described in this embodiment can be combined as appropriate with the description of another electronic device.

This embodiment can be implemented in combination with any of the structures described in the other embodiments and the like, as appropriate.

REFERENCE NUMERALS

50 structure body, 51 metal oxide, 53 region, 54 region, 200 transistor, 205 conductor, 210 insulator, 212 insulator, 214 insulator, 216 insulator, 218 conductor, 222 insulator, 224 insulator, 230 oxide, 231 region, 232 region, 234 region, 240 conductor, 241 insulator, 242 conductor, 243 oxide, 247 conductor, 248 opening, 249 region, 250 insulator, 254 insulator, 260 conductor, 274 insulator, 280 insulator, 281 insulator, 601 precursor, 602 reactant, 2001 wiring, 2002 wiring, 2003 wiring, 2004 wiring, 2005 wiring, 2006 wiring, 4000 deposition apparatus, 4002 carrying-in/out chamber, 4004 carrying-in/out chamber, 4006 transfer chamber, 4008 deposition chamber, 4009 deposition chamber, 4010 deposition chamber, 4014 transfer arm, 4020 chamber, 4021 source material supply portion, 4022*a* high-speed valve, 4022*b* high-speed valve, 4023 source material introduction port, 4024 source material exhaust port, 4025 evacuation unit, 4026 substrate holder, 4027 heater, 4028 plasma generation apparatus, 4029 coil, 4030 substrate, 4031 source material supply portion, 4033 source material introduction port, 4100 plasma ALD apparatus, 4111 plasma generation chamber, 4120 reaction chamber, 4123 source material introduction port, 4124 source material exhaust port, 4126 substrate holder, 4128 plasma generation apparatus, 4130 substrate 4131 plasma, 4133 source material introduction port, 4200 plasma ALD apparatus, 4213 electrode, 4214 shower head, 4215 power source, 4217 capacitor, 4220 chamber, 4223 source material introduction port, 4224 source material exhaust port, 4226 substrate holder, 4230 substrate, 4231 plasma, 4300 plasma ALD apparatus, 4313 electrode, 4314 shower head, 4315 power source, 4317 capacitor, 4319 mesh, 4320 chamber, 4321 power source, 4322 capacitor, 4323 source material introduction port, 4324 source material exhaust port, 4326 substrate holder, 4330 substrate, 4331 plasma

The invention claimed is:

1. A method for manufacturing a metal oxide, comprising:

a first step of introducing a precursor;

a second step of performing a first evacuation after the introduction of the precursor;

a third step of introducing an oxidizer in a plasma state after the first evacuation; and a fourth step of performing a second evacuation after the introduction of the oxidizer, wherein in the third step, a microwave is applied to the oxidizer so that the oxidizer is excited in the plasma state.

2. The method for manufacturing the metal oxide, according to claim 1, wherein two or more kinds of oxidizers are used as the oxidizer.

3. The method for manufacturing the metal oxide, according to claim 1, wherein the precursor comprises at least one of indium, gallium, and zinc.

4. The method for manufacturing the metal oxide, according to claim 1, wherein each of the first evacuation and the second evacuation is performed for longer than or equal to 1 second and shorter than or equal to 15 seconds.

5. The method for manufacturing the metal oxide, according to claim 1, further repeating the first step to the fourth step to increase a thickness of a film including the metal oxide.

6. The method for manufacturing the metal oxide, according to claim 1, wherein in the third step, argon is introduced as a carrier gas.

7. A method for manufacturing a metal oxide, comprising:

a first step of introducing a precursor;

a second step of performing a first evacuation after the introduction of the precursor;

a third step of introducing an oxidizer after the first evacuation; and a fourth step of performing a second evacuation after the introduction of the oxidizer, wherein the precursor contains chlorine, and wherein the metal oxide comprises a crystal structure in which a c-axis of a crystal is aligned perpendicularly to a deposition surface.

8. The method for manufacturing the metal oxide, according to claim 7, wherein two or more kinds of oxidizers are used as the oxidizer.

9. The method for manufacturing the metal oxide, according to claim 7, wherein the precursor comprises at least one of indium, gallium, and zinc.

10. The method for manufacturing the metal oxide, according to claim 7, wherein each of the first evacuation and the second evacuation is performed for longer than or equal to 1 second and shorter than or equal to 15 seconds.

11. The method for manufacturing the metal oxide, according to claim 7, further repeating the first step to the fourth step to increase a thickness of a film including the metal oxide.

12. A method for manufacturing a metal oxide, comprising:

a first step of introducing a precursor;

a second step of performing a first evacuation after the introduction of the precursor;

a third step of introducing an oxidizer after the first evacuation; and a fourth step of performing a second evacuation after the introduction of the oxidizer, wherein the precursor contains chlorine, wherein the metal oxide comprises a crystal structure in which a c-axis of a crystal is aligned perpendicularly to a deposition surface, and wherein the first step to the fourth step are performed at a temperature higher than or equal to 200° C. and lower than or equal to 400° C.

13. The method for manufacturing the metal oxide, according to claim 12, wherein two or more kinds of oxidizers are used as the oxidizer.

14. The method for manufacturing the metal oxide, according to claim 12, wherein the precursor comprises at least one of indium, gallium, and zinc.

15. The method for manufacturing the metal oxide, according to claim 12, wherein each of the first evacuation and the second evacuation is performed for longer than or equal to 1 second and shorter than or equal to 15 seconds.

16. The method for manufacturing the metal oxide, according to claim 12, further repeating the first step to the fourth step to increase a thickness of a film including the metal oxide.

* * * * *